US011521998B2

(12) United States Patent
Nomoto

(10) Patent No.: US 11,521,998 B2
(45) Date of Patent: Dec. 6, 2022

(54) SOLID-STATE IMAGING DEVICE AND IMAGING DEVICE

(71) Applicant: Sony Semiconductor Solutions Corporation, Kanagawa (JP)

(72) Inventor: Kazuki Nomoto, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 21 days.

(21) Appl. No.: 17/281,730

(22) PCT Filed: Nov. 6, 2019

(86) PCT No.: PCT/JP2019/043356
§ 371 (c)(1),
(2) Date: Mar. 31, 2021

(87) PCT Pub. No.: WO2020/100663
PCT Pub. Date: May 22, 2020

(65) Prior Publication Data
US 2021/0400218 A1    Dec. 23, 2021

Related U.S. Application Data

(60) Provisional application No. 62/733,045, filed on Sep. 18, 2018.

(30) Foreign Application Priority Data

Nov. 16, 2018  (JP) .............................. JP2018-216048

(51) Int. Cl.
*H01L 27/146* (2006.01)
*H04N 5/374* (2011.01)
(Continued)

(52) U.S. Cl.
CPC .. *H01L 27/14614* (2013.01); *H01L 27/14643* (2013.01); *H04N 5/3454* (2013.01);
(Continued)

(58) Field of Classification Search
CPC ...... H04N 5/335; H04N 5/3454; H04N 5/357; H04N 5/374; H04N 5/378; H04N 5/379;
(Continued)

(56) References Cited

U.S. PATENT DOCUMENTS 9,406,713 B2 * 8/2016 Fan .................. H01L 27/14638
2014/0139713 A1 * 5/2014 Gomi .................. H04N 5/3698
348/308
(Continued)

FOREIGN PATENT DOCUMENTS

CN    103533234 A    1/2014
CN    108574793 A    9/2018
(Continued)

OTHER PUBLICATIONS

International Search Report (PCT/ISA/210), International Application No. PCT/JP2019/036339, dated Nov. 1, 2019.
(Continued)

*Primary Examiner* — Lin Ye
*Assistant Examiner* — Chriss S Yoder, III
(74) *Attorney, Agent, or Firm* — Michael Best & Friedrich LLP

(57) ABSTRACT

Improvement of noise characteristics is achievable. A solid-state imaging device according to an embodiment includes a plurality of photoelectric conversion elements (333) arranged in a two-dimensional grid shape in a matrix direction and each generating a charge corresponding to a received light amount, and a detection unit (400) that detects a photocurrent produced by the charge generated in each of the plurality of photoelectric conversion elements. A chip
(Continued)

(201a) on which the photoelectric conversion elements are disposed and a chip (201b) on which at least a part of the detection unit is disposed are different from each other.

16 Claims, 47 Drawing Sheets

(51) Int. Cl.
*H04N 5/369* (2011.01)
*H04N 5/357* (2011.01)
*H04N 5/378* (2011.01)
*H04N 5/345* (2011.01)

(52) U.S. Cl.
CPC ............ *H04N 5/357* (2013.01); *H04N 5/374* (2013.01); *H04N 5/378* (2013.01); *H04N 5/379* (2018.08)

(58) Field of Classification Search
CPC ......... H01L 27/14603; H01L 27/14614; H01L 27/14634; H01L 27/14636; H01L 27/14638; H01L 27/1464; H01L 27/14641; H01L 27/14643; H01L 27/14645; H01L 27/14656; H01L 27/1469
See application file for complete search history.

(56) References Cited

U.S. PATENT DOCUMENTS

| | | |
|---|---|---|
| 2015/0319369 A1 | 11/2015 | Serrano Gotarredona et al. |
| 2016/0227135 A1* | 8/2016 | Matolin ................. H04N 5/378 |
| 2018/0138225 A1 | 5/2018 | Kim |
| 2018/0167575 A1* | 6/2018 | Watanabe ............ H04N 5/3745 |
| 2021/0037202 A1* | 2/2021 | Chen ........................ G01J 1/16 |

FOREIGN PATENT DOCUMENTS

| | | |
|---|---|---|
| JP | 2016533140 A | 10/2016 |
| KR | 20150018954 A | 2/2015 |
| WO | 2017104438 A1 | 6/2017 |
| WO | WO-2017209221 A1 | 12/2017 |

OTHER PUBLICATIONS

Notification of Transmittal of the International Search Report and the Written Opinion of the International Searching Authority, or the Declaration (PCT/ISA/220), International Application No. PCT/JP2019/036339, dated Nov. 12, 2019.

Written Opinion of the International Search Authority (PCT/ISA/237), International Application No. PCT/JP2019/036339, dated Nov. 12, 2019.

\* cited by examiner

FIG.10
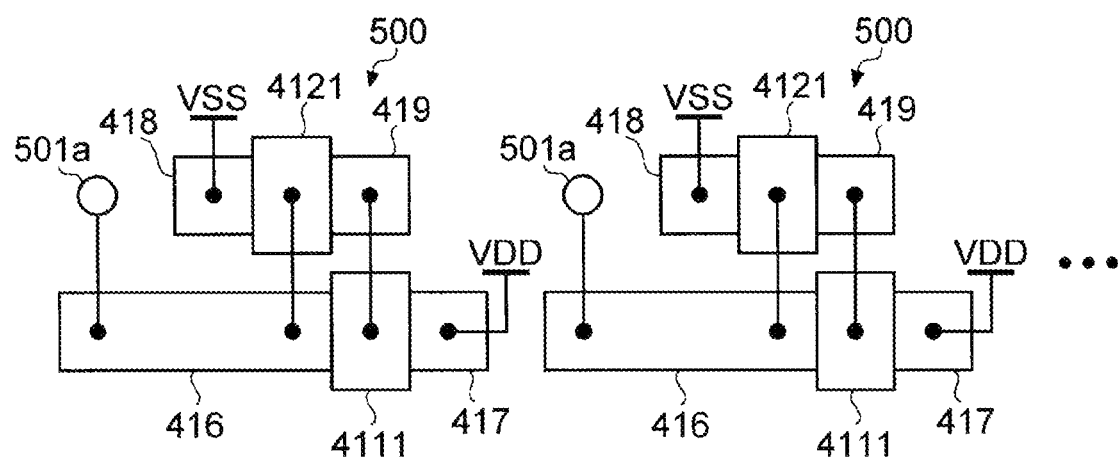
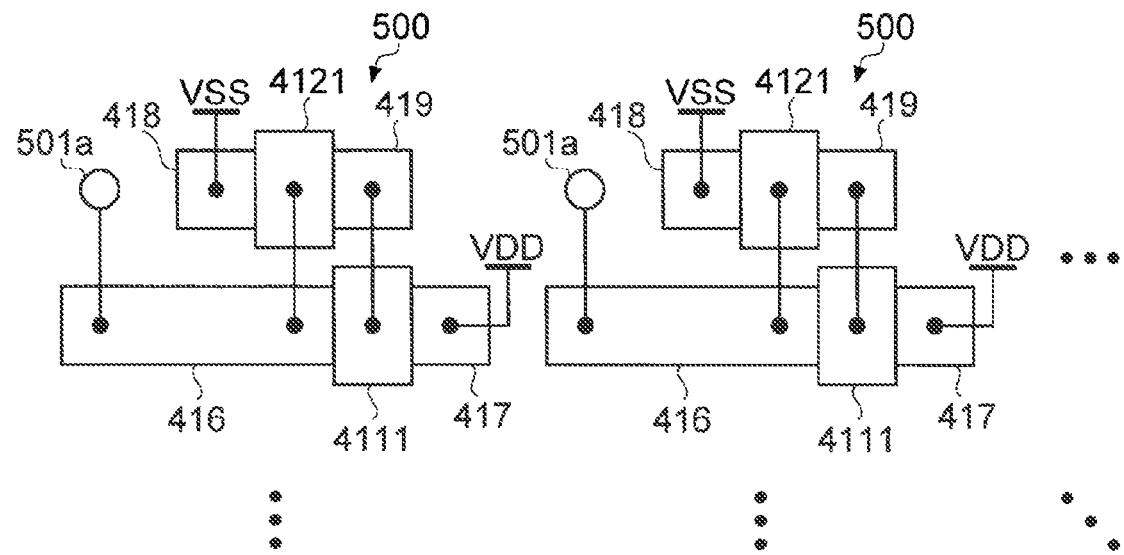

FIG.11
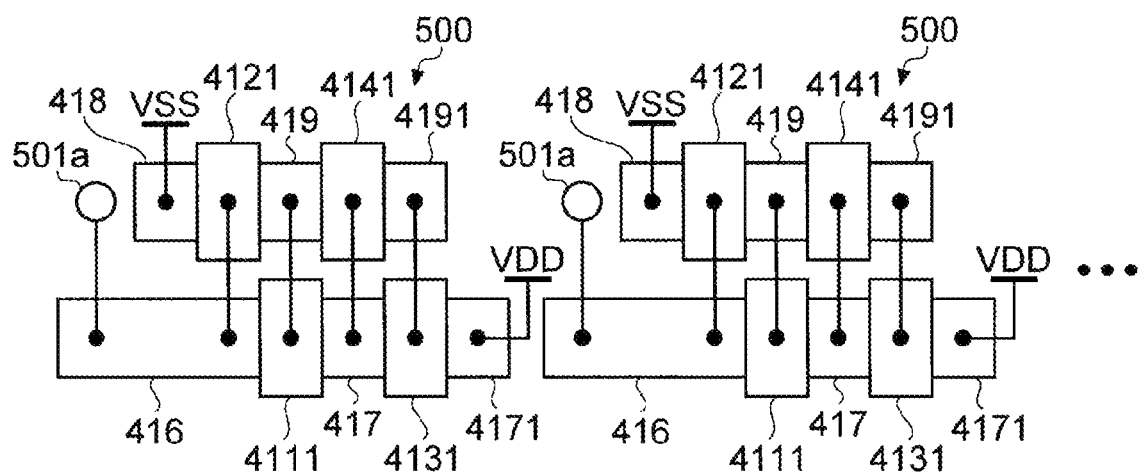
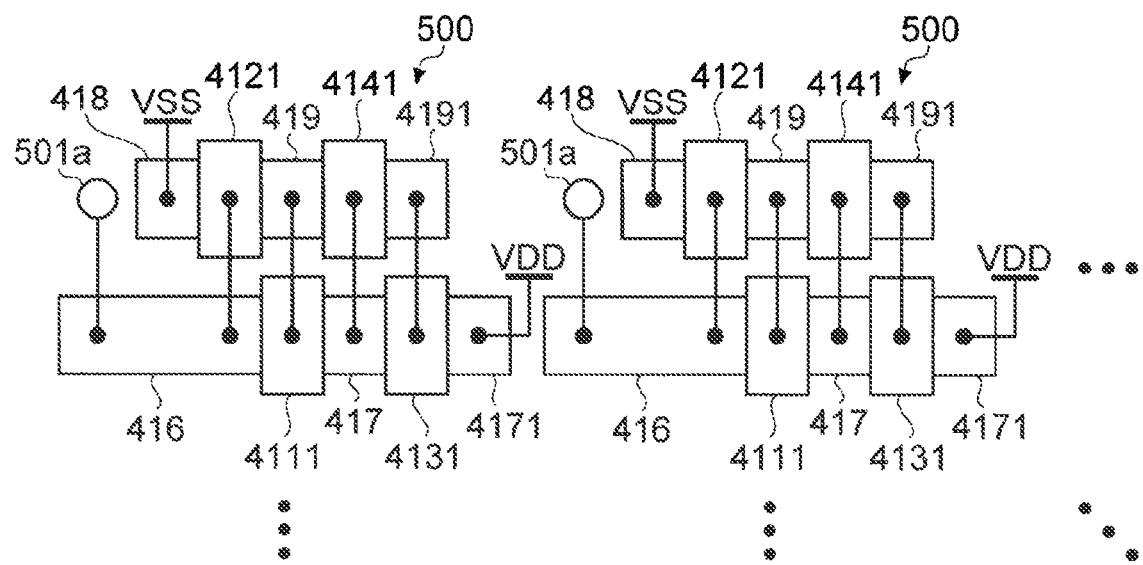

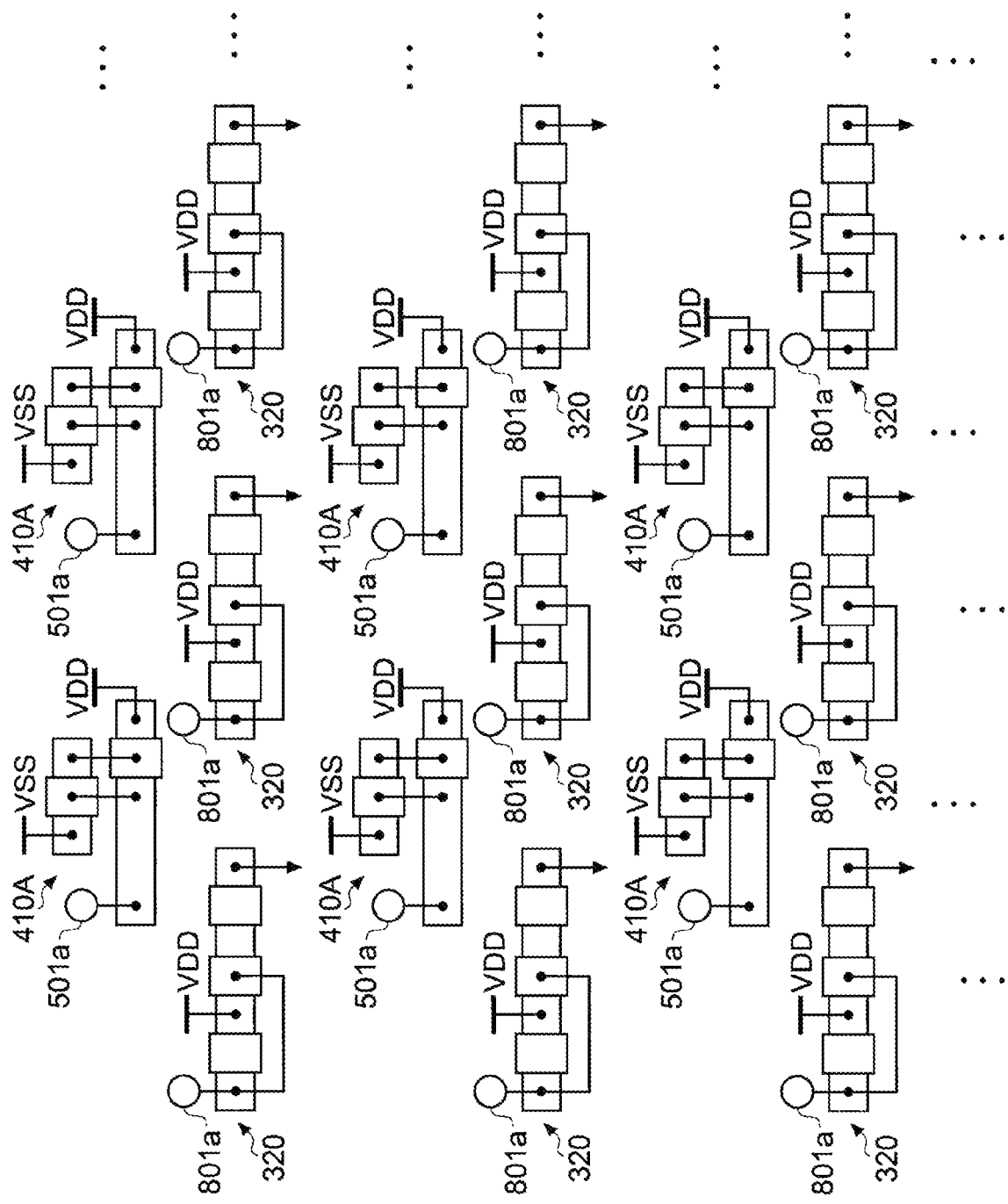
F I G . 6 1

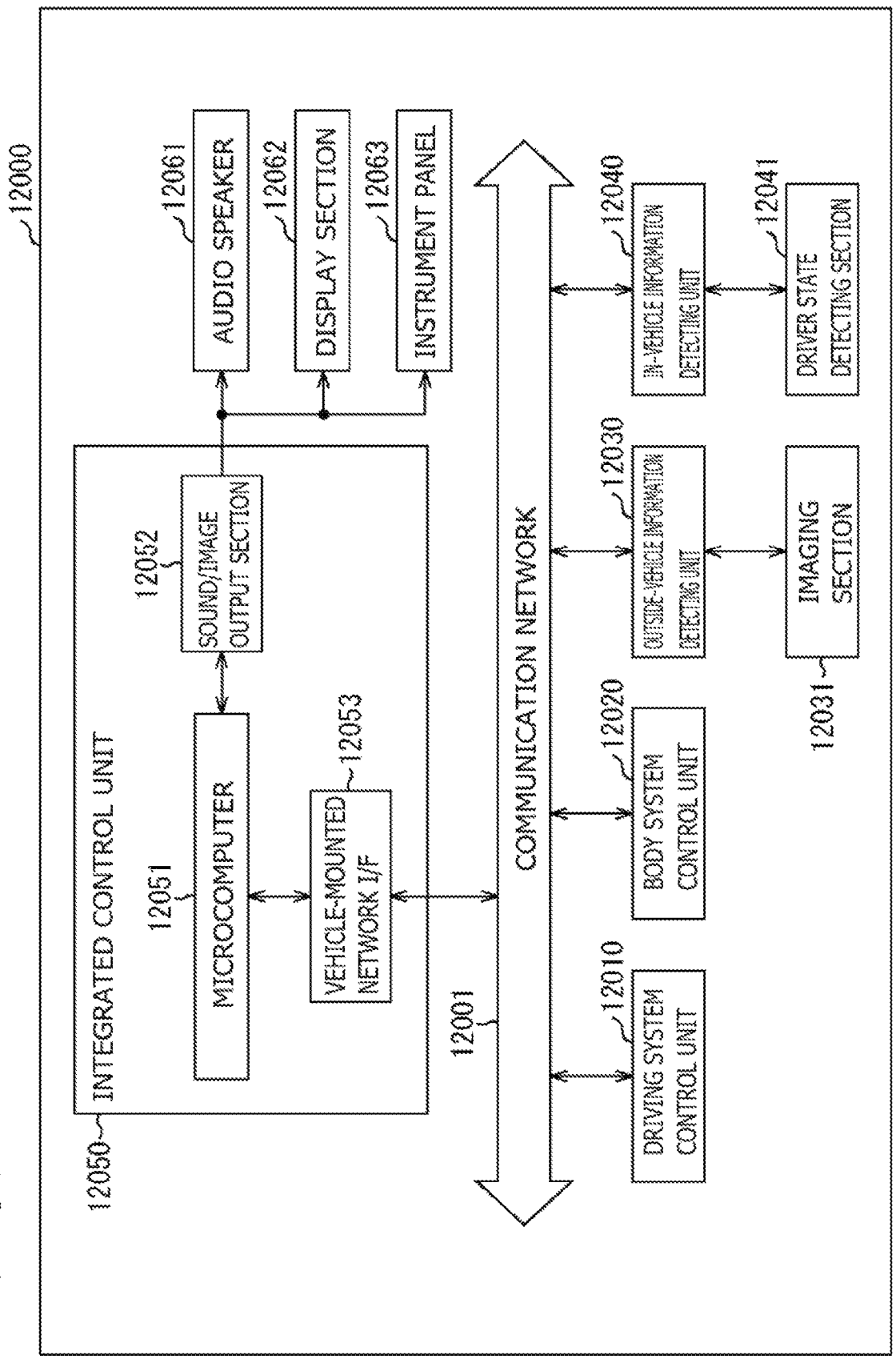

SOLID-STATE IMAGING DEVICE AND IMAGING DEVICE

TECHNICAL FIELD

The present disclosure relates to a solid-state imaging device and an imaging device.

BACKGROUND ART

A conventional imaging device or the like includes a synchronous type solid-state imaging device which captures image data (frame) in synchronization with a synchronized signal such as a vertical synchronized signal. This typical synchronous type solid-state imaging device is allowed to acquire image data only once in each cycle (e.g., 1/60 seconds) of the synchronized signal. In this case, a demand for higher speed processing in such fields associated with traffics, robots, or the like is difficult to meet. Accordingly, there has been proposed a non-synchronous type solid-state imaging device which includes a detection circuit provided for each pixel to detect an excess of a received light amount over a threshold as an address event, on a real time basis. The non-synchronous type solid-state imaging device which detects an address event for each pixel is also called a DVS (Dynamic Vision Sensor).

CITATION LIST

Patent Literature

[PTL 1]
JP-T-2016-533140

SUMMARY

Technical Problem

However, a typical DVS is configured such that a photoelectric conversion element for generating a charge corresponding to a received light amount and a circuit (hereinafter referred to as a pixel circuit) for detecting the presence or absence of address event firing on the basis of a change in a current value of a photocurrent produced by the charge generated in the photoelectric conversion element are integrated on an identical substrate. In this case, a dark current from the photoelectric conversion element flows into a transistor constituting the pixel circuit, and causes a problem of deterioration of noise characteristics of the DVS.

The present disclosure therefore proposes a solid-state imaging device and an imaging device capable of improving noise characteristics.

Solution to Problem

For solving the above-mentioned problems, a solid-state imaging device according to one aspect of the present disclosure includes a plurality of photoelectric conversion elements arranged in a two-dimensional grid shape in a matrix direction and each generating a charge corresponding to a received light amount, and a detection unit that detects a photocurrent produced by the charge generated in each of the plurality of photoelectric conversion elements. A chip on which the photoelectric conversion elements are disposed and a chip on which at least a part of the detection unit is disposed are different from each other.

BRIEF DESCRIPTION OF DRAWINGS

FIG. 10 is a plan diagram depicting a floor map example of a second chip according to the first embodiment.

FIG. 11 is a plan diagram depicting another floor map example of the second chip according to the first embodiment.

FIG. 61 is a plan diagram depicting a floor map example of a second chip according to the third example of the tenth embodiment.

FIG. 62 is a block diagram depicting an example of schematic configuration of a vehicle control system.

DESCRIPTION OF EMBODIMENTS

Figure 1:
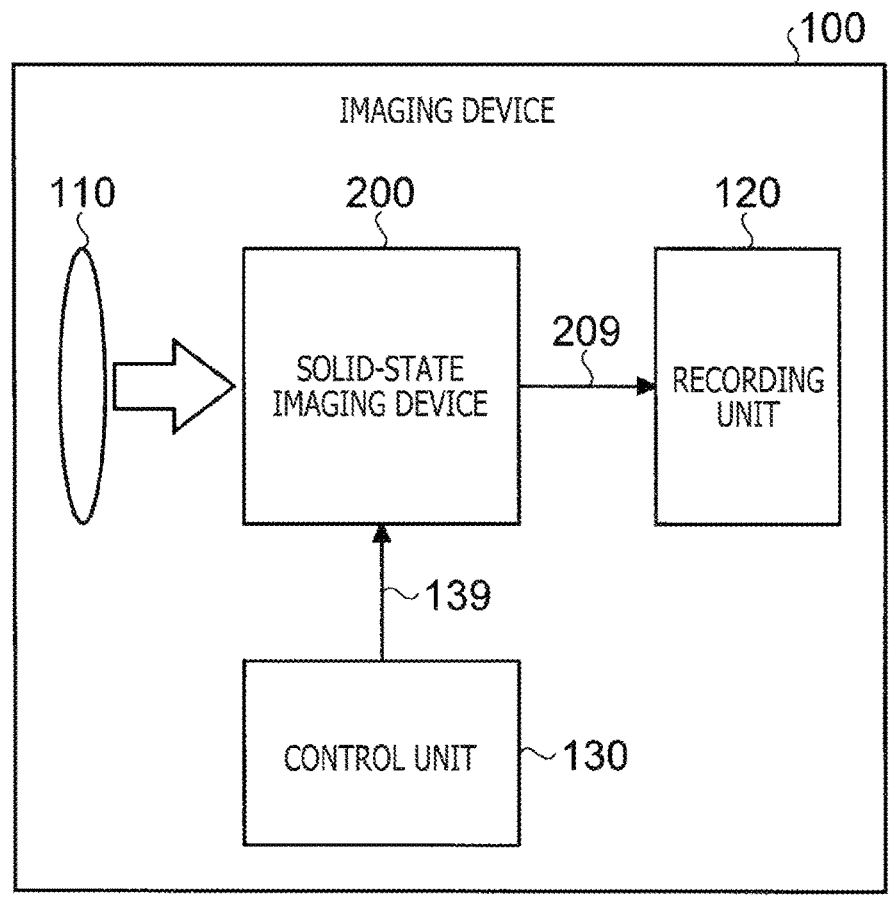
FIG. 1 is a block diagram depicting a schematic configuration example of a solid-state imaging device and an imaging device according to a first embodiment.

One embodiment of the present disclosure will be hereinafter described in detail with reference to the drawings. Note that identical parts are given identical reference signs in the following embodiment to omit repetitive description.

In addition, the present disclosure will be described in the following item order.
1. Preface
2. First embodiment
2.1 Configuration example of imaging device
2.2 Configuration example of solid-state imaging device 2.2.1 Stacking structure example of solid-state imaging device
2.2.2 Functional configuration example of solid-state imaging device
2.3 Configuration example of unit pixel
2.4 Configuration example of address event detection unit
 2.4.1 Configuration example of current voltage conversion unit
 2.4.2 Configuration example of subtractor and quantizer
2.5 Arrangement in respective layers
2.6 Cross-sectional structure example of solid-state imaging device
2.7 Floor map example
 2.7.1 First chip
 2.7.2 Second chip
  2.7.2.1 Source-follower type
  2.7.2.2 Gain-boost type
2.8 Operation and effect
3. Second embodiment
3.1 Improvement of noise characteristics of transistor
 3.1.1 Use of FDSOI (Fully Depleted Silicon On Insulator)
 3.1.2 Use of tunneling FET and FinFET
3.2 Operation and effect
4. Third embodiment
4.1 Manufacturing process of solid-state imaging device
4.2 Operation and effect
5. Fourth embodiment
5.1 Configuration example of unit pixel
5.2 Cross-sectional structure example of solid-state imaging device
5.3 Floor map example
5.4 Operation and effect
6. Fifth embodiment
7. Sixth embodiment
7.1 Stacking structure example of solid-state imaging device
7.2 Configuration example of unit pixel
8. Seventh embodiment
8.1 Cross-sectional structure example of solid-state imaging device
9. Eighth embodiment
9.1 Functional configuration example of solid-state imaging device
 9.1.1 Configuration example of column ADC
9.2 Configuration example of unit pixel
9.3 Operation example of solid-state imaging device
 9.3.1 Timing chart
 9.3.2 Flowchart
9.4 Cross-sectional structure example of solid-state imaging device
9.5 Floor map example
 9.5.1 First chip
 9.5.2 Second chip
9.6 Operation and effect
10. Ninth embodiment
10.1 Cross-sectional structure example of solid-state imaging device
10.2 Operation and effect
11. Tenth embodiment
11.1 Configuration example of pixel array unit
11.2 Example of pixel block
 11.2.1 Bayer array
 11.2.2 X-Trans (registered trademark) type array
 11.2.3 Quad Bayer array
 11.2.4 White RGB array
11.3 Configuration example of pixel block
11.4 Operation example of solid-state imaging device
 11.4.1 Timing chart
 11.4.2 Flowchart
11.5 Floor map example
 11.5.1 First example
  11.5.1.1 First chip
  11.5.1.2 Second chip
 11.5.2 Second example
 11.5.3 Third example
11.6 Operation and effect
12. Example of application to mobile body 1. Preface A typical DVS adopts what is called an event-driven type driving system which detects the presence or absence of address event firing for each unit pixel and reads a pixel signal from a unit pixel corresponding to address event firing in a case of detection of this address event firing.

Note that the unit pixel in the present description is a minimum unit of a pixel including one photoelectric conversion element (also called a light reception element), and corresponds to a dot in image data read from an image sensor, for example. In addition, the address event is an event caused for each address allocated to each of a plurality of unit pixels arranged in a two-dimensional grid shape, such as an excess of a current value of a current (hereinafter referred to as a photocurrent) produced by a charge generated in the photoelectric conversion element, or a change amount of the current value over a certain threshold.

As described above, a typical DVS adopts such a configuration where a photoelectric conversion element and a pixel circuit are disposed on the same substrate. In the above-mentioned configuration where the photoelectric conversion element and the circuit element are disposed on the same substrate, a dark current flows from the photoelectric conversion element into each of transistors constituting the pixel circuit. Accordingly, deterioration of noise characteristics of the DVS may be caused.

Moreover, in the configuration where the photoelectric conversion element and the circuit element are disposed on the same substrate, a proportion of the photoelectric conversion element in a light reception surface decreases. As a result, there arises such a problem that noise characteristics deteriorate along with a drop of quantum efficiency for incident light (hereinafter referred to as light reception efficiency).

Furthermore, in the configuration where the photoelectric conversion element and the circuit element are disposed on the same substrate, a sufficient area for each of the transistors constituting the pixel circuit is often difficult to secure. In that case, noise characteristics of each of the transistors deteriorate, and a problem of deterioration of noise characteristics of the DVS consequently arises.

Accordingly, described in the following embodiments in detail will be several examples of a solid-state imaging device and an imaging device capable of reducing deterioration of noise characteristics.

2. First Embodiment

A solid-state imaging device and an imaging device according to a first embodiment will be first described in detail with reference to the drawings.

2.1 Configuration Example of Imaging Device

FIG. 1 is a block diagram depicting a schematic configuration example of the solid-state imaging device and the imaging device according to the first embodiment. As depicted in FIG. 1, for example, an imaging device 100 includes an imaging lens 110, a solid-state imaging device 200, a recording unit 120, and a control unit 130. The imaging device 100 is assumed to constitute a camera mounted on an industrial robot, an in-vehicle camera, or the like.

The imaging lens 110 is an example of an optical system which condenses incident light and forms an image of the light on a light reception surface of the solid-state imaging device 200. The light reception surface may be a surface where photoelectric conversion elements of the solid-state imaging device 200 are arranged. The solid-state imaging device 200 photoelectrically converts incident light to generate image data. Moreover, the solid-state imaging device 200 executes predetermined signal processing such as noise removal and white balance adjustment for the generated image data. A result obtained by this signal processing and a detection signal indicating the presence or absence of address event firing are output to the recording unit 120 via a signal line 209. Note that a method for generating the detection signal indicating the presence or absence of address event firing will be described below.

For example, the recording unit 120 includes a flash memory, a DRAM (Dynamic Random Access Memory), an SRAM (Static Random Access Memory), and the like, and records data input from the solid-state imaging device 200.

For example, the control unit 130 includes a CPU (Central Processing Unit) and the like, and outputs various instructions via a signal line 139 to control respective units of the imaging device 100, such as the solid-state imaging device 200.

2.2 Configuration Example of Solid-State Imaging Device

A configuration example of the solid-state imaging device 200 will next be described in detail with reference to the drawings.

2.2.1 Stacking Structure Example of Solid-State Imaging Device

Figure 2:
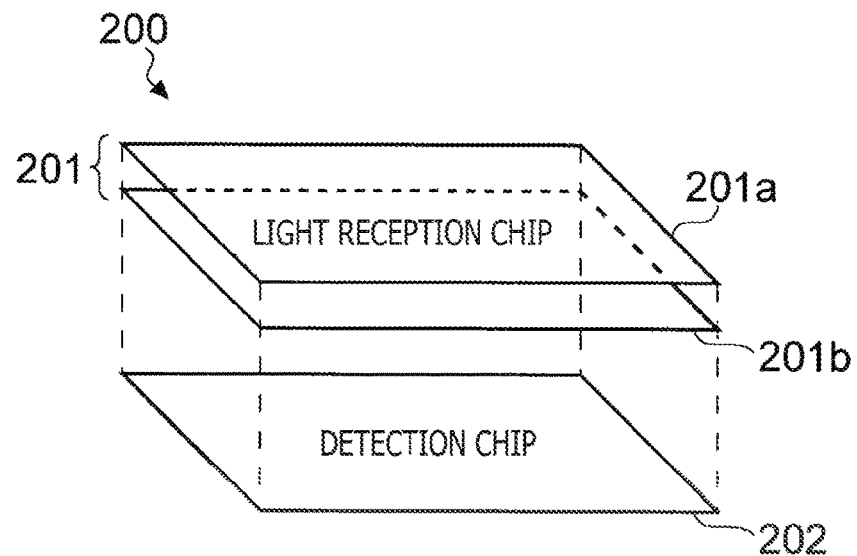
FIG. 2 is a diagram depicting a stacking structure example of the solid-state imaging device according to the first embodiment.

FIG. 2 is a diagram depicting a stacking structure example of the solid-state imaging device according to the first embodiment. As depicted in FIG. 2, the solid-state imaging device 200 has a structure where a light reception chip 201 and a detection chip 202 are stacked in an up-down direction. For example, the light reception chip 201 has a double-layer structure which includes a first chip 201a and a second chip 201b affixed to each other. Photoelectric conversion elements are arranged on the first chip 201a, and a pixel circuit is arranged on the second chip 201b.

Junction between the first chip 201a and the second chip 201b and junction between the light reception chip 201 (specifically, the second chip 201b) and the detection chip 202 may be made by, for example, what is called direct junction which flattens respective junction surfaces and affixes both the surfaces by an interelectronic force. However, this junction method is not required to be adopted. For example, junction methods such as what is called Cu—Cu junction which bonds electrode pads that include copper (Cu) and that are formed on the respective junction surfaces and bump junction may be adopted.

Moreover, for example, the light reception chip 201 and the detection chip 202 are electrically connected to each other via a connection portion such as TSV (Through-Silicon Via) penetrating a semiconductor substrate. Examples adoptable for connection using the TSV include what is called a twin TSV method which connects two TSVs, i.e., a TSV provided on the light reception chip 201 and a TSV provided from the light reception chip 201 to the detection chip 202, on a chip external surface, and what is called a shared TSV method which connects both the light reception chip 201 and the detection chip 202 by a TSV penetrating from the light reception chip 201 to the detection chip 202.

However, in a case where Cu—Cu junction or bump junction is used for junction between the light reception chip 201 and the detection chip 202, both the chips are electrically connected via a Cu—Cu junction portion or a bump junction portion.

2.2.2 Functional Configuration Example of Solid-State Imaging Device

Figure 3:
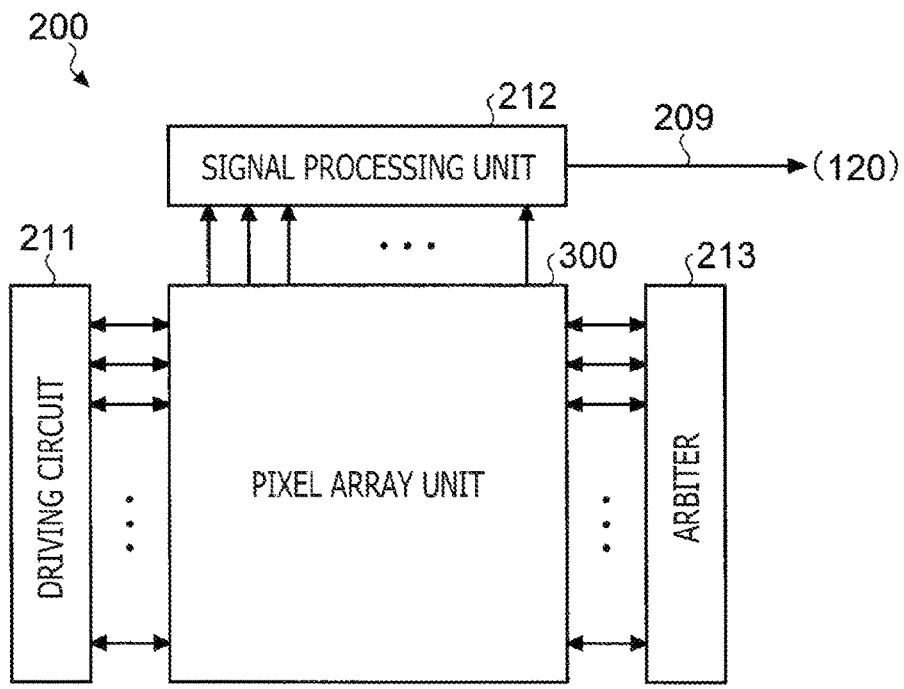
FIG. 3 is a block diagram depicting a functional configuration example of the solid-state imaging device according to the first embodiment.

FIG. 3 is a block diagram depicting a functional configuration example of the solid-state imaging device according to the first embodiment. As depicted in FIG. 3, the solid-state imaging device 200 includes a driving circuit 211, a signal processing unit 212, an arbiter 213, and a pixel array unit 300.

A plurality of unit pixels is arranged in a two-dimensional grid shape on the pixel array unit 300. As described in detail below, for example, the unit pixel includes a photoelectric conversion element such as a photodiode and a pixel circuit (corresponding to an address event detection unit 400 described below in the present embodiment) which detects the presence or absence of address event firing on the basis of whether or not a current value of a photocurrent produced by a charge generated in the photoelectric conversion element or a change amount of the current value exceeds a predetermined threshold. The pixel circuit here may be shared by a plurality of the photoelectric conversion elements. In that case, each unit pixel includes the one photoelectric conversion element and the pixel circuit to be shared.

The plurality of unit pixels of the pixel array unit 300 may be grouped into a plurality of pixel blocks each including a predetermined number of unit pixels. Hereinafter, a set of unit pixels or pixel blocks arranged in a horizontal direction will be referred to as a "row," and a set of unit pixels or pixel blocks arranged in a direction vertical to the row will be referred to as a "column."

When address event firing is detected in the pixel circuit, each of the unit pixels outputs a request for reading a signal from the unit pixel to the arbiter 213.

The arbiter 213 arbitrates the request from the one or more unit pixels, and transmits, on the basis of a result of this arbitration, a predetermined response to the unit pixel having issued the request. The unit pixel having received this response outputs a detection signal indicating the address event firing to the driving circuit 211 and the signal processing unit 212.

The driving circuit 211 sequentially drives the unit pixels each having output the detection signal to cause the unit pixel corresponding to the detected address event firing to output a signal corresponding to a received light amount, for example, to the signal processing unit 212.

The signal processing unit 212 executes predetermined signal processing for the signal input from the unit pixel, and supplies a result of this signal processing and the detection signal indicating the address event to the recording unit 120 via the signal line 209.

2.3 Configuration Example of Unit Pixel

Figure 4:
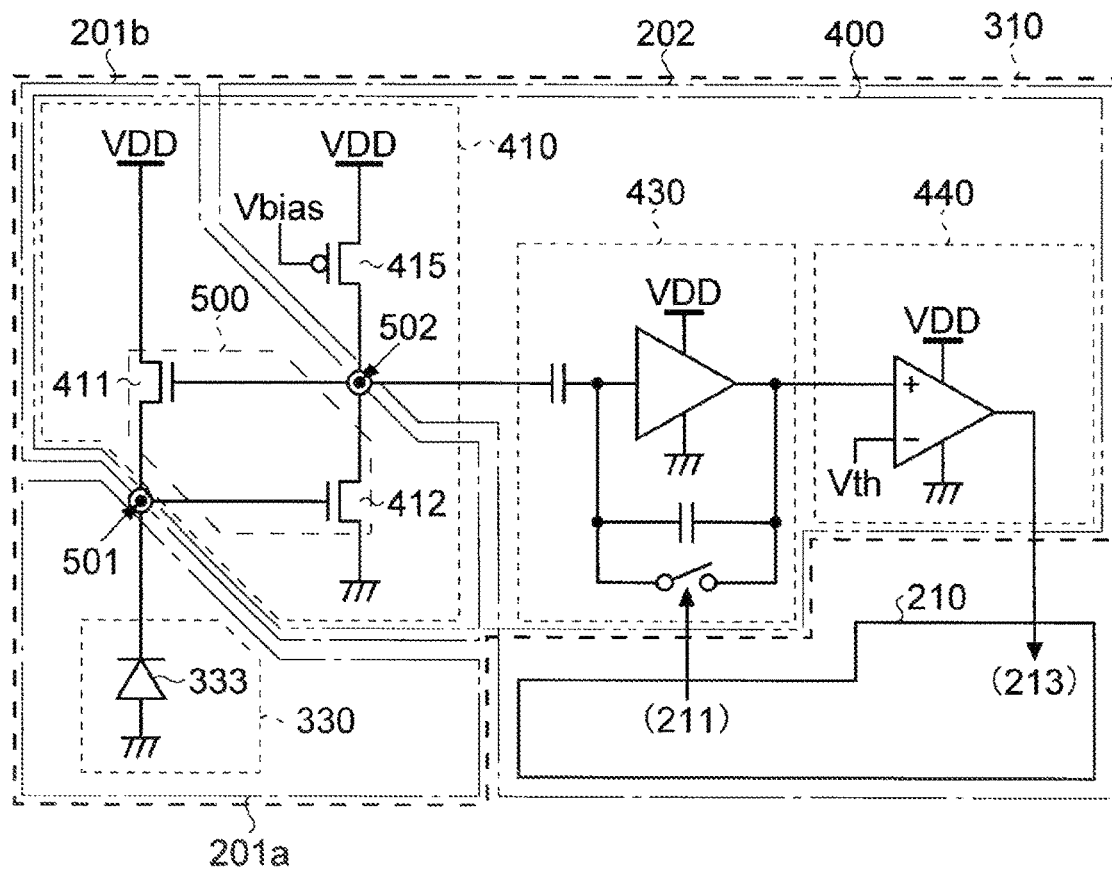
FIG. 4 is a circuit diagram depicting a schematic configuration example of a unit pixel according to the first embodiment.

A configuration example of a unit pixel 310 will next be described. FIG. 4 is a circuit diagram depicting a schematic configuration example of the unit pixel according to the first embodiment. As depicted in FIG. 4, for example, the unit pixel 310 includes a light reception unit 330 and an address event detection unit 400. Note that a logic circuit 210 in FIG. 4 may be a logic circuit including the driving circuit 211, the signal processing unit 212, and the arbiter 213 in FIG. 3, for example.

For example, the light reception unit 330 includes a photoelectric conversion element 333 such as a photodiode. An output from the light reception unit 330 is connected to the address event detection unit 400.

For example, the address event detection unit 400 includes a current voltage conversion unit 410 and a subtractor 430. Note that the address event detection unit 400 also includes a buffer, a quantizer, and a transfer unit. Details of the address event detection unit 400 will be described below with reference to FIG. 5 and other figures.

In such a configuration, the photoelectric conversion element 333 of the light reception unit 330 photoelectrically converts incident light to generate a charge. The charge generated by the photoelectric conversion element 333 is input to the address event detection unit 400 as a photocurrent of a current value corresponding to the charge amount.

2.4 Configuration Example of Address Event Detection Unit

Figure 5:
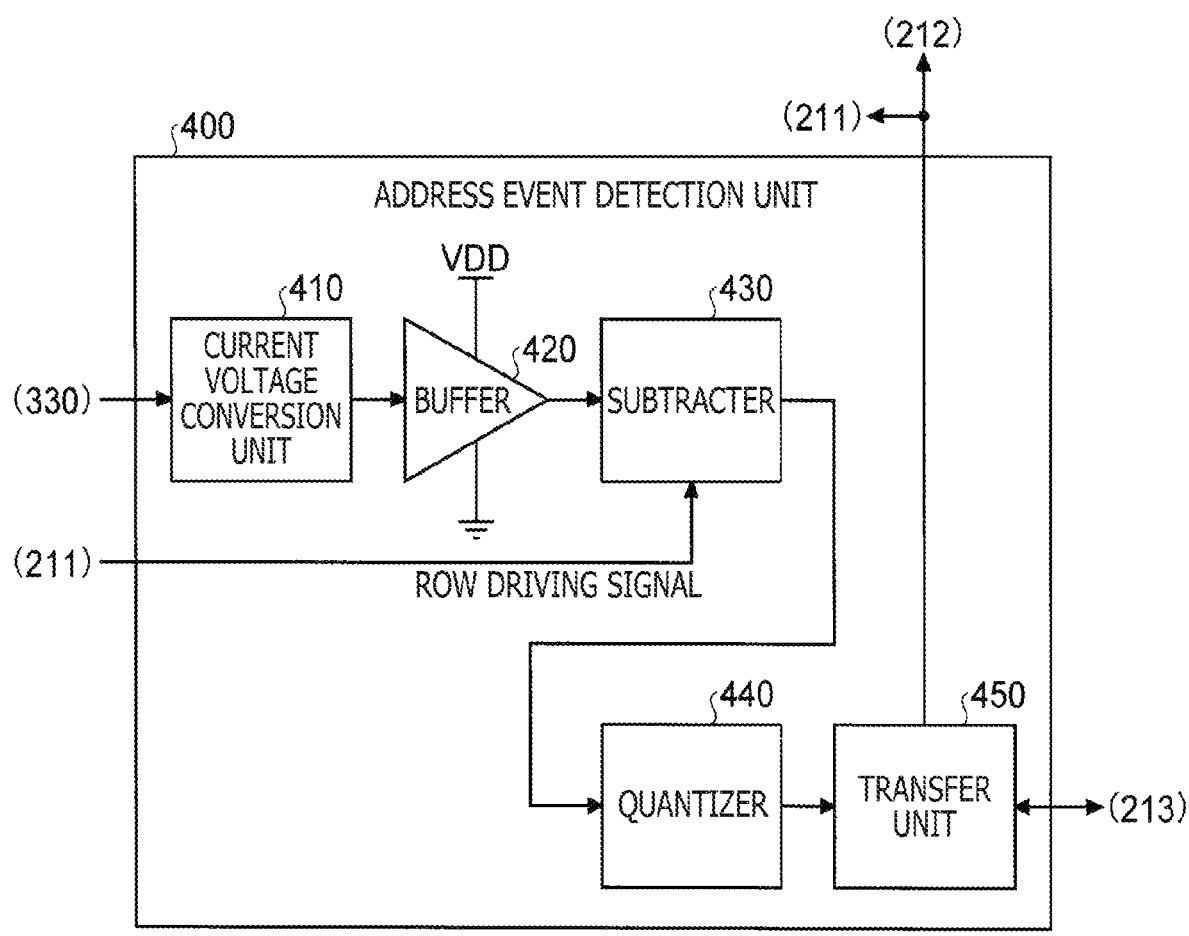
FIG. 5 is a block diagram depicting a schematic configuration example of an address event detection unit according to the first embodiment.

FIG. 5 is a block diagram depicting a schematic configuration example of the address event detection unit according to the first embodiment. As depicted in FIG. 5, the address event detection unit 400 includes a buffer 420 and a transfer unit 450 in addition to the current voltage conversion unit 410, the subtractor 430, and a quantizer 440 also depicted in FIG. 4.

The current voltage conversion unit 410 converts a photocurrent received from the light reception unit 330 into a voltage signal indicating a logarithm of the photocurrent, and outputs the voltage signal thus generated to the buffer 420.

The buffer 420 corrects the voltage signal received from the current voltage conversion unit 410, and outputs the corrected voltage signal to the subtractor 430.

The subtractor 430 lowers a voltage level of the voltage signal received from the buffer 420 in accordance with a row driving signal received from the driving circuit 211, and outputs the lowered voltage signal to the quantizer 440.

The quantizer 440 quantizes the voltage signal received from the subtractor 430 into a digital signal, and outputs the digital signal thus generated to the transfer unit 450 as a detection signal.

The transfer unit 450 transfers the detection signal received from the quantizer 440 to the signal processing unit 212 and others. For example, at the time of detection of address event firing, the transfer unit 450 outputs, to the arbiter 213, a request for transmission of a detection signal indicating the address event from the transfer unit 450 to the driving circuit 211 and the signal processing unit 212. Thereafter, when receiving a response to the request from the arbiter 213, the transfer unit 450 outputs the detection signal to the driving circuit 211 and the signal processing unit 212.

2.4.1 Configuration Example of Current Voltage Conversion Unit

For example, the current voltage conversion unit 410 configured as depicted in FIG. 5 may be what is called a source-follower type current voltage conversion unit which includes an LG transistor 411, an amplification transistor 412, and a constant current circuit 415 as depicted in FIG. 4. However, this configuration is not required to be adopted. For example, the current voltage conversion unit 410 may be what is called a gain-boost type current voltage converter which includes two LG transistors 411 and 413, two amplification transistors 412 and 414, and the constant current circuit 415 as depicted in an example of FIG. 6.

As depicted in FIG. 4, for example, a source of the LG transistor 411 and a gate of the amplification transistor 412 are connected to a cathode of the photoelectric conversion element 333 of the light reception unit 330. For example, a drain of the LG transistor 411 is connected to a power source terminal VDD.

Moreover, for example, a source of the amplification transistor 412 is grounded, while a drain of the amplification transistor 412 is connected to the power source terminal VDD via the constant current circuit 415. For example, the constant current circuit 415 may be including a load MOS (Metal-Oxide-Semiconductor) transistor such as a P-type MOS transistor.

Figure 6:
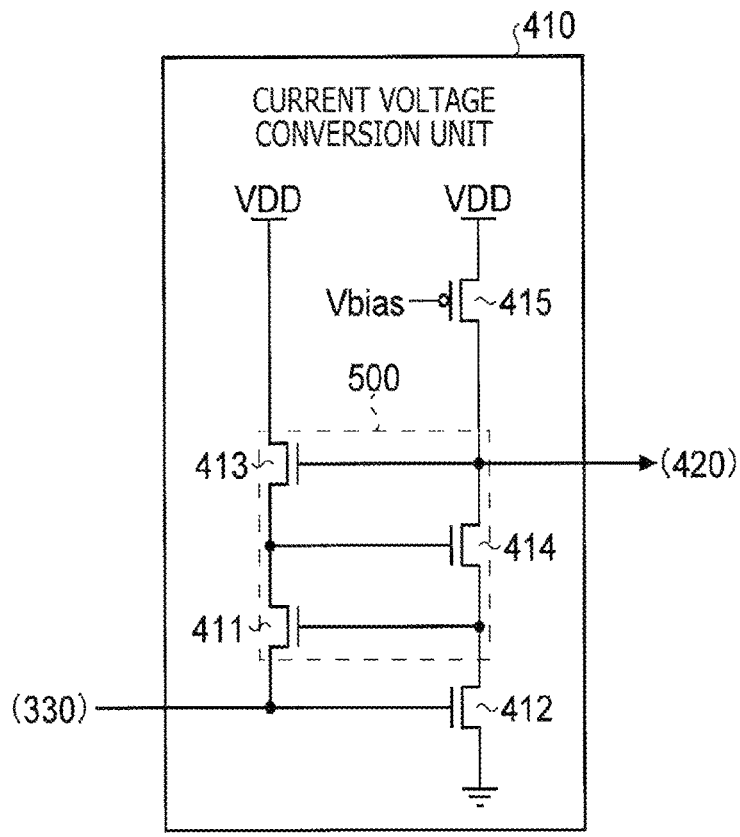
FIG. 6 is a circuit diagram depicting another schematic configuration example of a current voltage conversion circuit according to the first embodiment.

Meanwhile, in a case of the gain-boost type, the source of the LG transistor 411 and the gate of the amplification transistor 412 are connected to the cathode of the photoelectric conversion element 333 of the light reception unit 330 as depicted in FIG. 6, for example. In addition, for example, the drain of the LG transistor 411 is connected to a source of the LG transistor 413 and the gate of the amplification transistor 412. For example, a drain of the LG transistor 413 is connected to the power source terminal VDD.

Moreover, for example, a source of the amplification transistor 414 is connected to a gate of the LG transistor 411 and a drain of the amplification transistor 412. For example, a drain of the amplification transistor 414 is connected to the power source terminal VDD via the constant current circuit 415.

The connection relationship depicted in FIG. 4 or FIG. 6 constitutes a loop-shaped source-follower circuit. In this configuration, the photocurrent received from the light reception unit 330 is converted into a voltage signal indicating a logarithm value corresponding to a charge amount of the photocurrent. Note that each of the LG transistors 411 and 413 and the amplification transistors 412 and 414 may be including an NMOS transistor, for example.

2.4.2 Configuration Example of Subtractor and Quantizer

Figure 7:
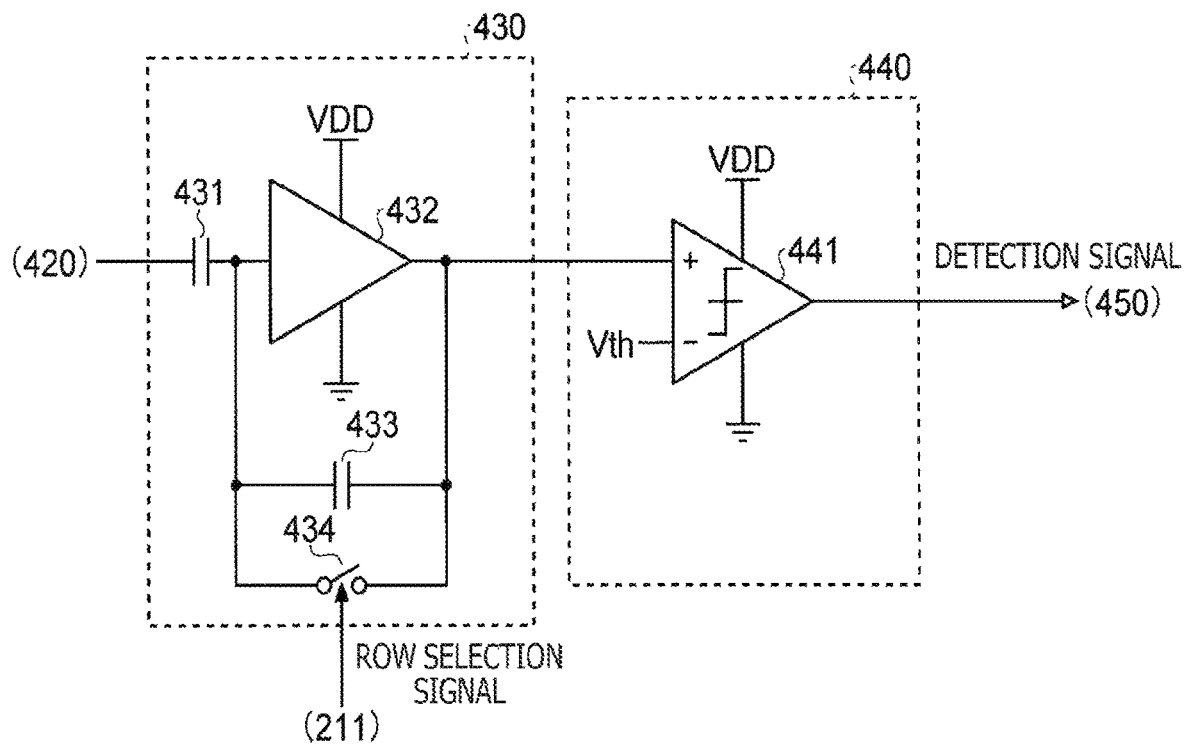
FIG. 7 is a circuit diagram depicting a schematic configuration example of a subtractor and a quantizer according to the first embodiment.

FIG. 7 is a circuit diagram depicting a schematic configuration example of the subtractor and the quantizer according to the first embodiment. As depicted in FIG. 7, the subtractor 430 includes capacitors 431 and 433, an inverter 432, and a switch 434. In addition, the quantizer 440 includes a comparator 441.

One end of the capacitor 431 is connected to an output terminal of the buffer 420, while the other end is connected to an input terminal of the inverter 432. The capacitor 433 is connected in parallel with the inverter 432. The switch 434 opens and closes a route connecting both the ends of the capacitor 433 in accordance with a row driving signal.

The inverter 432 inverts a voltage signal input via the capacitor 431. The inverter 432 outputs the inverted signal to a non-inverting input terminal (+) of the comparator 441.

When the switch 434 is turned on, a voltage signal Vinit is input to the buffer 420 side of the capacitor 431. In addition, the opposite side becomes a virtual ground terminal. It is assumed that a potential of this virtual ground terminal is zero for convenience. At this time, a potential Qinit accumulated in the capacitor 431 is expressed by the following Equation (1) on an assumption that a capacity of the capacitor 431 is C1. On the other hand, both ends of the capacitor 433 are short-circuited. Accordingly, an accumulated charge of the capacitor 433 becomes zero.

$$Q\text{init} = C1 \times V\text{init} \tag{1}$$

Subsequently, a charge Qafter accumulated in the capacitor 431 is expressed by the following Equation (2) considering a case where the voltage on the buffer 420 side of the capacitor 431 is changed into Vafter by turning off the switch 434.

$$Q\text{after} = C1 \times V\text{after} \quad (2)$$

On the other hand, a charge Q2 accumulated in the capacitor 433 is expressed by the following Equation (3) on an assumption that an output voltage is Vout.

$$Q2 = -C2 \times V\text{out} \quad (3)$$

At this time, a total charge amount of the capacitors 431 and 433 does not change. Accordingly, the following Equation (4) holds.

$$Q\text{init} = Q\text{after} + Q2 \quad (4)$$

The following Equation (5) is obtained by substituting Equations (1) to (3) for Equation (4) for deformation.

$$V\text{out} = -(C1/C2) \times (V\text{after} - V\text{init}) \quad (5)$$

Equation (5) represents a subtraction operation of a voltage signal. A gain of a subtraction result is C1/C2. It is generally desired to maximize a gain. Accordingly, such a design designating a large value for C1 and a small value for C2 is preferable. On the other hand, when C2 is excessively small, noise characteristics may deteriorate according to an increase in kTC noise. Accordingly, a capacity reduction of C2 is limited only to a noise allowable range. Moreover, the address event detection unit 400 including the subtractor 430 is mounted for each unit pixel. Accordingly, areas of the capacities C1 and C2 are limited. Values of the capacities C1 and C2 are determined in consideration of these conditions.

The comparator 441 compares a voltage signal received from the subtractor 430 with a predetermined threshold voltage Vth applied to an inverting input terminal (−). The comparator 441 outputs a signal indicating a comparison result to the transfer unit 450 as a detection signal.

Furthermore, an entire gain A of the address event detection unit 400 described above is expressed by the following Equation (6) on an assumption that a conversion gain of the current voltage conversion unit 410 is $CG_{log}$, and that a gain of the buffer 420 is '1'.

[Math. 1]

$$A = \frac{CG_{log} \cdot C1}{C2} \sum_{n=1}^{N} i_{photo\_n} \quad (6)$$

In Equation (6), $i_{photo\_}$n is a photocurrent of an n-th unit pixel, and is expressed in units of ampere (A), for example. In this case, N indicates the number of the unit pixels 310 in the pixel block, and is set to '1' in the present embodiment.

2.5 Arrangement in Respective Layers

As depicted in FIG. 4, the light reception unit 330 in the configuration described above is disposed on the first chip 201a of the light reception chip 201 depicted in FIG. 2, for example, and the LG transistor 411 and the amplification transistor 412 of the current voltage conversion unit 410 of the pixel circuit (address event detection unit 400) are disposed on the second chip 201b of the light reception chip 201 depicted in FIG. 2, for example. In addition, the other configuration (the other circuit configuration will be hereinafter given a reference number of '510') is disposed on the detection chip 202, for example. Note that the configuration disposed on the second chip 201b will be referred to as an upper layer pixel circuit 500 in the following description for clarification. In a case where the current voltage conversion unit 410 is the source-follower type (see FIG. 4), the upper layer pixel circuit 500 includes the LG transistor 411 and the amplification transistor 412. On the other hand, in a case where the current voltage conversion unit 410 is the gain-boost type, the upper layer pixel circuit 500 includes the two LG transistors 411 and 413 and the two amplification transistors 412 and 414.

As depicted in FIG. 4, the light reception unit 330 disposed on the first chip 201a and the upper layer pixel circuit 500 disposed on the second chip 201b in the light reception chip 201 are electrically connected to each other via a connection portion 501 penetrating from the first chip 201a to the second chip 201b, for example.

In addition, the upper layer pixel circuit 500 disposed on the second chip 201b and the other circuit configuration 510 disposed on the detection chip 202 are electrically connected to each other via a connection portion 502 penetrating from the second chip 201b to the detection chip 202, for example.

Note that each of the connection portions 501 and 502 may be including a TSV, a Cu-CU junction portion, a bump junction portion, or others, for example.

2.6 Cross-Sectional Structure Example of Solid-State Imaging Device

Figure 8:
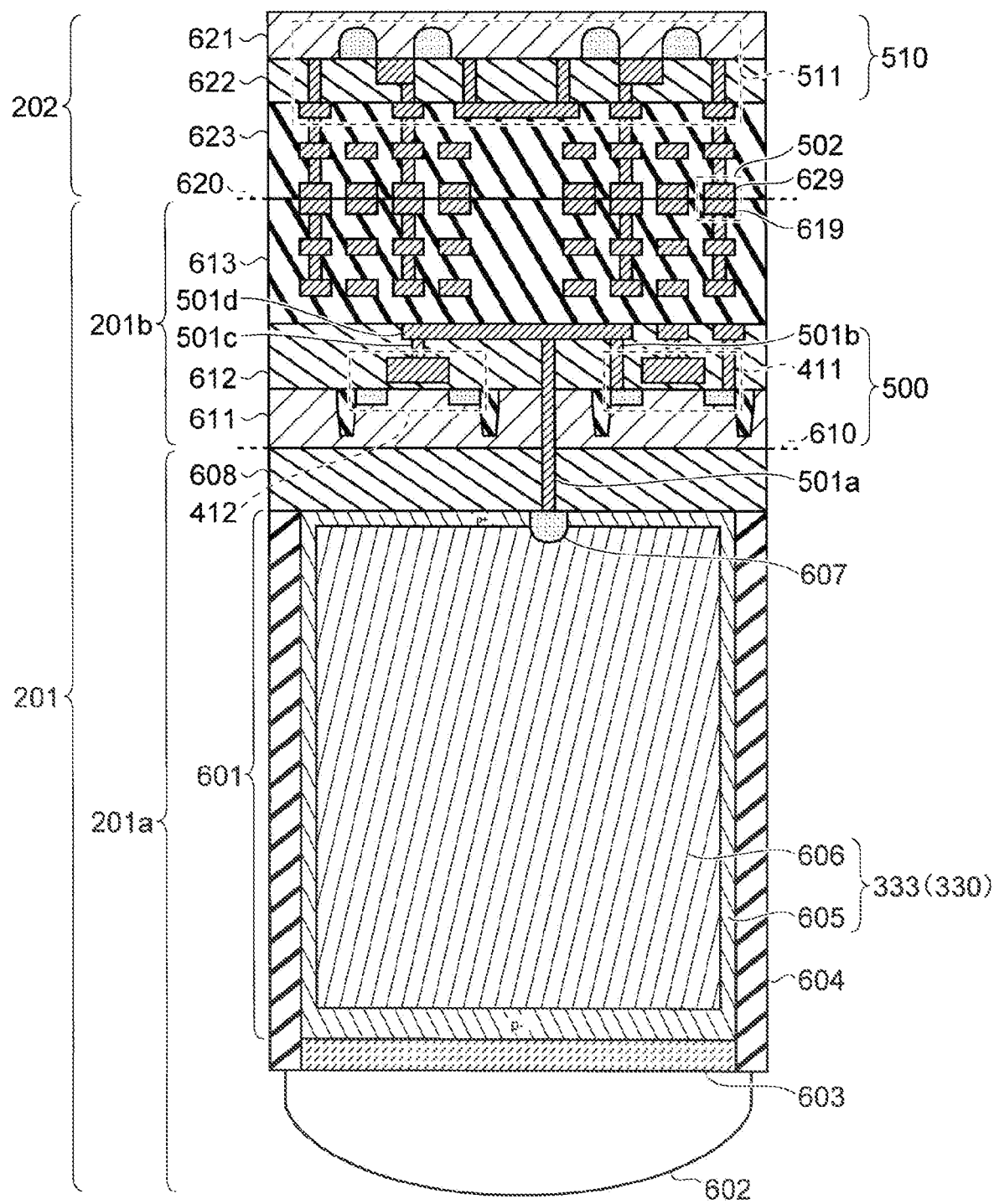
FIG. 8 is a cross-sectional diagram depicting a cross-sectional structure example of the solid-state imaging device according to the first embodiment.

FIG. 8 is a cross-sectional diagram depicting a cross-sectional structure example of the solid-state imaging device according to the first embodiment. Note that FIG. 8 depicts a cross-sectional structure example of the solid-state imaging device 200 taken along a plane vertical to a light entrance surface (light reception surface).

As depicted in FIG. 8, the solid-state imaging device 200 has such a structure that the detection chip 202 is further affixed to the light reception chip 201 which has a stacking structure produced by affixing the first chip 201a and the second chip 201b.

Each of a junction surface 610 between the first chip 201a and the second chip 201b and a junction surface 620 between the light reception chip 201 and the detection chip 202 may be a directly joined surface, for example. However, as described above, Cu-CU junction, bump junction, or the like may be used instead of direct junction.

For example, the first chip 201a includes a semiconductor substrate 601 and an interlayer dielectric 608.

The semiconductor substrate 601 includes the photoelectric conversion element 333 (light reception unit 330) including an n-type semiconductor region 606 and a p-type semiconductor region 605 surrounding the n-type semiconductor region 606. The photoelectric conversion element 333 receives incident light entering from the rear surface side of the semiconductor substrate 601 via an on-chip lens 602. A flattening film 603 for flattening a surface where the on-chip lens 602 is mounted, a not-depicted color filter, and the like may be provided between the photoelectric conversion element 333 and the on-chip lens 602.

The n-type semiconductor region 606 is a charge accumulation region where charges (electrons) generated by photoelectric conversion are accumulated. An impurity concentration on the side (upper surface side) opposite to the light entrance surface in the p-type semiconductor region 605 surrounding the n-type semiconductor region 606 may be higher than an impurity concentration on the light entrance surface side (lower surface side). Specifically, the photoelectric conversion element 333 may have an HAD (Hole-Accumulation Diode) structure, and the p-type semiconductor region 605 may be so formed as to reduce generation of a dark current in each of interfaces on the lower surface side and the upper surface side of the n-type semiconductor region 606.

A pixel separation unit 604 which electrically and optically separates a plurality of the photoelectric conversion elements 333 is provided on the semiconductor substrate 601 in a two-dimensional grid shape as viewed from the rear surface side. Each of the photoelectric conversion elements 333 is provided in a rectangular region sectioned by the pixel separation unit 604.

In each of the photoelectric conversion elements 333, an anode is grounded, while a cathode includes a contact layer 607 from which a charge generated in the photoelectric conversion element 333 is extracted.

The interlayer dielectric 608 is an isolator for electric separation between the first chip 201a and the second chip 201b, and is provided on the front surface side of the semiconductor substrate 601, i.e., on the side joined to the second chip 201b. For example, the junction surface 610 of the interlayer dielectric 608 is flattened for direct junction to the second chip 201b.

For example, the second chip 201b includes a semiconductor substrate 611, an interlayer dielectric 612, and a wiring layer 613.

The semiconductor substrate 611 includes the LG transistor 411 and the amplification transistor 412 constituting the upper layer pixel circuit 500. For example, the source of the LG transistor 411 and the gate of the amplification transistor 412 are electrically connected to the contact layer 607 of the photoelectric conversion element 333 via a TSV 501a penetrating from an upper surface of the interlayer dielectric 612 via the semiconductor substrate 611 and the interlayer dielectric 608 to the contact layer 607 formed on the semiconductor substrate 601, a TSV 501b penetrating from the upper surface of the interlayer dielectric 612 to the source of the LG transistor 411, a TSV 501c penetrating also from the upper surface of the interlayer dielectric 612 to the gate of the amplification transistor 412, and wiring 501d electrically connecting the TSVs 501a, 501b, and 501c on the upper surface side of the interlayer dielectric 612. The TSVs 501a, 501b, and 501c and the wiring 501d constitute the connection portion 501 in FIG. 4.

For example, the wiring layer 613 includes an insulation layer and multilayer wiring formed in the insulation layer. For example, this wiring is connected to the gate of the LG transistor 411 and the drain of the amplification transistor 412.

Moreover, the wiring layer 613 includes a pad (Cu pad) 619 made of copper (Cu) and exposed on the junction surface 620 joined to the detection chip 202. The Cu pad 619 is connected to the gate of the LG transistor 411 and the drain of the amplification transistor 412 via the wiring of the wiring layer 613.

For example, the detection chip 202 includes a semiconductor substrate 621, an interlayer dielectric 622, and a wiring layer 623.

For example, the semiconductor substrate 621 includes, as the other circuit configuration 510, a circuit element 511 which includes the constant current circuit 415 of the current voltage conversion unit 410, circuits other than the address event detection unit 400, the logic circuit 210, and the like.

For example, the wiring layer 623 includes an insulation layer and multilayer wiring formed in the insulation layer, similarly to the wiring layer 613 of the second chip 201b. For example, this wiring is electrically connected to the circuit element 511 provided on the semiconductor substrate 621.

Moreover, the wiring layer 623 includes a Cu pad 629 exposed on the junction surface 620 joined to the second chip 201b. The Cu pad 629 is connected to the circuit element 511 via wiring of the wiring layer 623.

The Cu pad 619 exposed on a surface of the wiring layer 613 of the second chip 201b and the Cu pad 629 exposed on a surface of the wiring layer 623 of the detection chip 202 constitute a Cu—Cu junction portion which electrically and mechanically joins the second chip 201b and the detection chip 202. Specifically, in the example depicted in FIG. 8, the connection portion 502 in FIG. 4 is including the Cu—Cu junction portion.

2.7 Floor Map Example

Examples of respective floor maps of the first chip 201a and the second chip 201b will next be described.

2.7.1 First Chip

Figure 9:
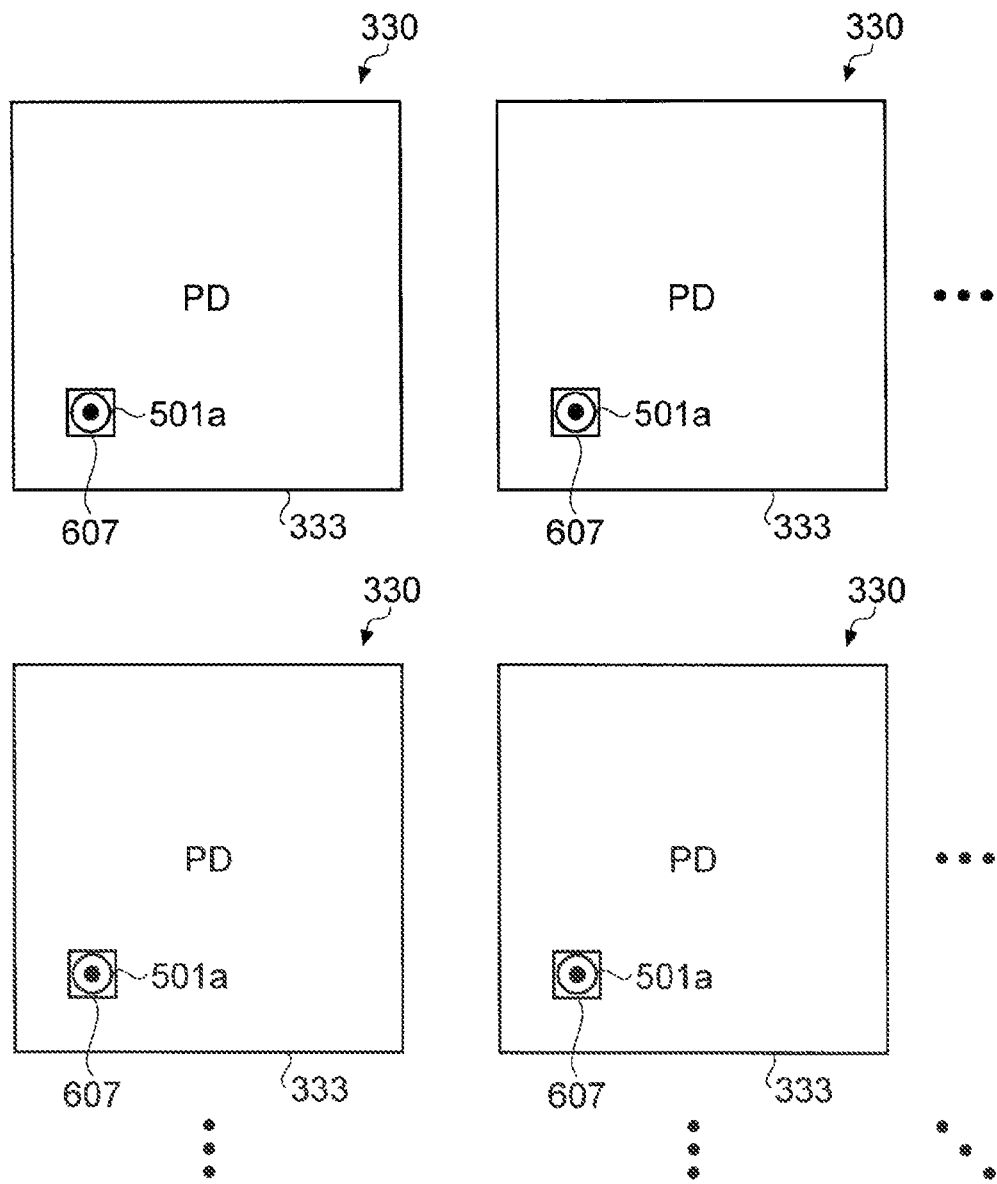
FIG. 9 is a plan diagram depicting a floor map example of a first chip according to the first embodiment.

FIG. 9 is a plan diagram depicting a floor map example of the first chip according to the present embodiment. As depicted in FIG. 9, the photoelectric conversion elements 333 of the light reception unit 330 are arranged on the first chip 201a in a two-dimensional grid shape. For example, each of the photoelectric conversion elements 333 is provided in a rectangular region. Moreover, each of the photoelectric conversion elements 333 includes the contact layer 607 connected to the TSV 501a which constitutes the connection portion 501.

2.7.2 Second Chip 2.7.2.1 Source-Follower Type

FIG. 10 is a plan diagram depicting a floor map example of the second chip in a case where the current voltage conversion unit 410 is the source-follower type (see FIG. 4). As depicted in FIG. 10, the upper layer pixel circuits 500 each including the LG transistor 411 and the amplification transistor 412 are disposed on the second chip 201b in a two-dimensional grid shape. For example, each of the upper layer pixel circuits 500 is formed in a region substantially equivalent to the region of each of the photoelectric conversion elements 333 provided on the first chip 201a.

For example, the LG transistor 411 in each of the upper layer pixel circuits 500 includes a gate 4111, a diffusion region 416 formed on the source side with respect to the gate 4111, and a diffusion region 417 formed on the drain side with respect to the gate 4111. In addition, for example, the amplification transistor 412 includes a gate 4121, a diffusion region 418 formed on the source side with respect to the gate 4121, and a diffusion region 419 formed on the drain side with respect to the gate 4121.

The TSV 501a constituting the connection portion 501 and the gate 4121 of the amplification transistor 412 are connected to the diffusion region 416 on the source side of the LG transistor 411. On the other hand, the power source voltage VDD is connected to the diffusion region 417 on the drain side.

The ground voltage VSS is connected to the diffusion region 418 on the source side of the amplification transistor 412. On the other hand, the gate 4111 of the LG transistor 411 is connected to the diffusion region 419 on the drain side.

2.7.2.2 Gain-Boost Type

FIG. 11 is a plan diagram depicting a floor map example of the second chip in a case where the current voltage conversion unit 410 is the gain-boost type (see FIG. 6). As depicted in FIG. 11, the upper layer pixel circuits 500 each including the LG transistors 411 and 413 and the amplification transistors 412 and 414 are disposed on the second chip 201b in a two-dimensional grid shape. For example, each of the upper layer pixel circuits 500 is formed in a region substantially equivalent to the region of each of the photoelectric conversion elements 333 provided on the first chip 201a.

In each of the upper layer pixel circuits 500, a gate 4131 of the LG transistor 413 is disposed on the drain side of the LG transistor 411, and a gate 4141 of the amplification transistor 414 is disposed on the drain side of the amplification transistor 412 in an arrangement similar to the arrangement of each of the upper layer pixel circuits 500 depicted in FIG. 10.

The diffusion region 417 on the source side with respect to the gate 4131 of the LG transistor 413 is shared by the LG transistor 411. On the other hand, the power source voltage VDD is connected to the diffusion region 4171 on the drain side instead of the diffusion region 417.

The diffusion region 419 on the source side with respect to the gate 4141 of the amplification transistor 414 is shared by the amplification transistor 412. On the other hand, the diffusion region 4191 on the drain side is connected to the gate 4131 of the LG transistor 413.

2.8 Operation and Effect

According to the present embodiment, as described above, the photoelectric conversion element 333 of the light reception unit 330 and the upper layer pixel circuit 500 are disposed on the semiconductor substrates 601 and 611, respectively, which are electrically separated from each other via the interlayer dielectric 608. This arrangement can reduce entrance of a dark current from the photoelectric conversion element 333 into each of the transistors constituting the upper layer pixel circuit 500. Accordingly, reduction of deterioration of DVS noise characteristics is achievable.

Moreover, the arrangement of the photoelectric conversion element 333 and the upper layer pixel circuit 500 each disposed on the different substrates can increase a proportion of the photoelectric conversion element 333 in the light reception surface. In this case, light reception efficiency for incident light can be improved. Accordingly, further reduction of deterioration of DVS noise characteristics is achievable.

Furthermore, the arrangement of the photoelectric conversion element 333 and the upper layer pixel circuit 500 each disposed on the different substrates can secure a sufficient area for each of the transistors constituting the upper layer pixel circuit 500. Accordingly, further reduction of deterioration of DVS noise characteristics is achievable by reduction of deterioration of noise characteristics of each of the transistors.

3. Second Embodiment

A solid-state imaging device and an imaging device according to a second embodiment will next be described in detail with reference to the drawings.

3.1 Improvement of Noise Characteristics of Transistor

Figure 12:
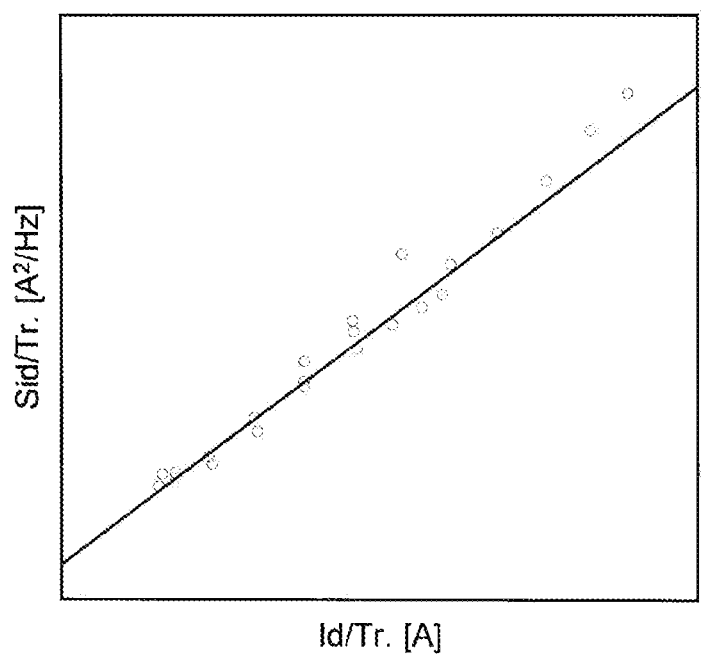
FIG. 12 is a graph presenting a relationship between a current and noise of a transistor.

As described above, DVS noise characteristics are deteriorated by not only a flow of a dark current from the photoelectric conversion element 333 into the upper layer pixel circuit 500, but also deterioration of noise characteristics of each of the transistors constituting the upper layer pixel circuit 500. FIG. 12 here presents a relationship between noise and a current of each transistor constituting the upper layer pixel circuit 500. In FIG. 12, a horizontal axis represents a drain current for each transistor, while a vertical axis represents a noise component for each transistor.

As presented in FIG. 12, noise of each transistor constituting the upper layer pixel circuit 500 increases in proportion to a current amount. This indicates that thermal noise $S_{V_g}$ is dominant in noise characteristics of the transistor. The thermal noise $S_{V_g}$ in a saturated region of the transistor can be expressed by the following Equation (7). In Equation (7), k is a Boltzmann coefficient, T is an absolute temperature, and gm is a transconductance.

[Math. 2]

$$S_{V_p} = \frac{8}{3}kT \cdot \frac{1}{g_m} \qquad (7)$$

As apparent from Equation (7), it is effective to increase the transconductance gm of the transistor to reduce the thermal noise $S_{V_g}$ in the saturated region of the transistor. The transconductance gm of the transistor can be expressed by the following Equation (8). In Equation (8), W is a gate area of the transistor.

[Math. 3]

$$gm = \sqrt{2\beta Id} \qquad (8)$$
$$\therefore \beta = \mu C_{ox}\frac{W}{L}$$

As apparent from Equation (8), for increasing the transconductance gm of the transistor, there is a method which increases the gate area W of the transistor. For example, in the first embodiment, improvement of noise characteristics by reduction of the thermal noise $S_{V_g}$ of the LG transistor 411 and the amplification transistor 412 is achievable by increasing the gate areas of the LG transistor 411 and the amplification transistor 412 constituting the pixel circuit.

Moreover, there is also the following method as another method for increasing the transconductance gm of the transistor.

3.1.1 Use of FDSOI (Fully Depleted Silicon on Insulator)

There is a method which uses an FDSOI substrate as the semiconductor substrate 611 of the second chip 201b constituting the upper layer pixel circuit 500 as one of the methods for increasing the transconductance gm of the transistor.

Figure 13:
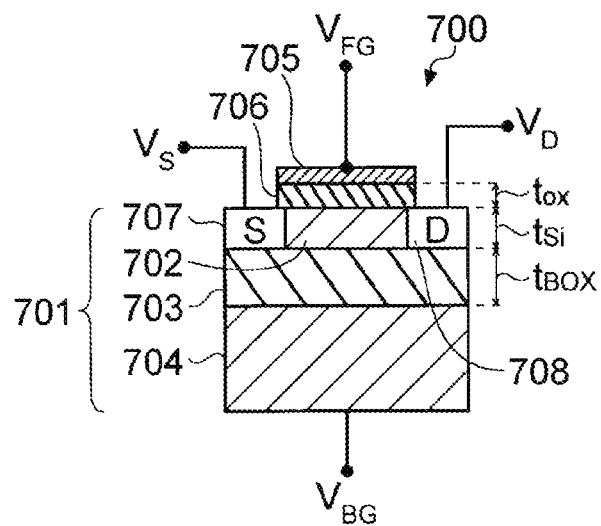
FIG. 13 is a cross-sectional diagram depicting a schematic configuration example of a transistor according to a second embodiment.

FIG. 13 is a cross-sectional diagram depicting a schematic configuration example of a transistor formed on an FDSOI substrate. As depicted in FIG. 13, for example, an FDSOI substrate 701 includes a support substrate 704 such as a silicon substrate, an embedded oxide film 703 such as a silicon oxide film located on the support substrate 704, and a silicon thin film 702 which is thin and located on the embedded oxide film 703.

Each of transistors 700 (corresponding to the LG transistor 411 and the amplification transistor 412, or the LG transistors 411 and 413 and the amplification transistors 412 and 414 in the first embodiment) in the upper layer pixel circuit 500 includes a source 707 and a drain 708 provided on the silicon thin film 702, and a gate insulation film 706 and a gate 705 provided in a region sandwiched between the source 707 and the drain 708 in the silicon thin film 702.

In such a configuration, gate controllability of the transistors 700 can be enhanced by application of a reverse bias to the support substrate 704. Note that the reverse bias may be directly applied to the support substrate 704 from the rear surface or the side, or may be applied to a contact layer formed on the support substrate 704 and exposed to a bottom portion of a trench penetrating from the silicon thin film 702 to the embedded oxide film 703, for example.

Figure 14:
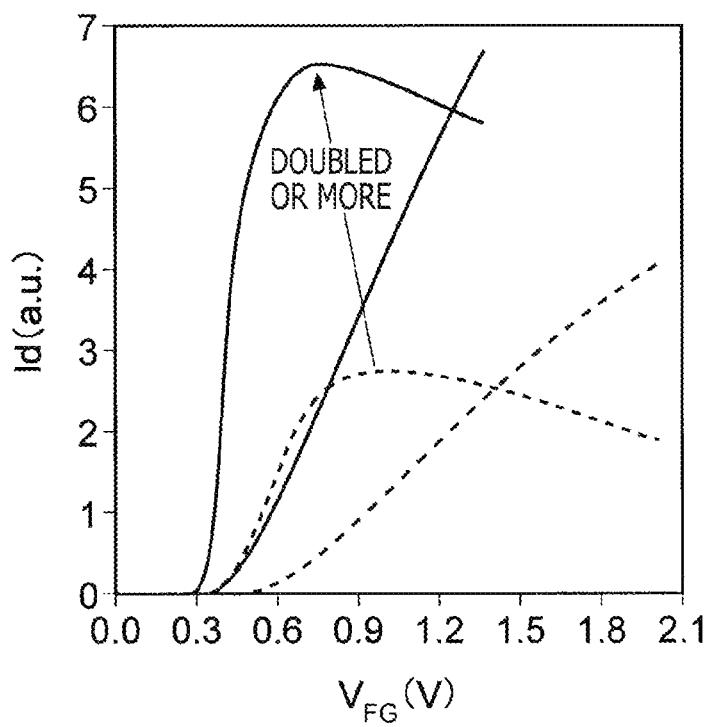
FIG. 14 is a graph presenting a current voltage characteristic of the transistor depicted in FIG. 13 by way of example.

FIG. 14 is a graph indicating a current voltage characteristic of the transistor depicted in FIG. 13 by way of example. A solid line in FIG. 14 represents a case where a voltage equivalent to a voltage applied to the gate 705 is applied as a reverse bias, while the broken line represents a case where the support substrate 704 is grounded (no reverse bias).

As presented in FIG. 14, a drain current is doubled or more by application of a reverse bias to the transistor 700. This indicates doubled improvement or more of the transconductance gm of the transistor 700 achieved by application of a reverse bias. Accordingly, the thermal noise $S_{V_g}$ can be reduced to ½ or lower by using the FDSOI substrate 701 as the semiconductor substrate 611 of the second chip 201b and applying a reverse bias to the LG transistor 411 and the amplification transistor 412 formed on the FDSOI substrate 701.

3.1.2 Use of Tunneling FET and FinFET

Moreover, the thermal noise $S_{V_g}$ in a sub-threshold region of the transistor can be expressed by the following Equation (9). In Equation (9), q is an elementary charge, S is a sub-threshold coefficient, and $V_d$ is a drain voltage.

[Math. 4]

$$S_{V_g} = 2q \cdot \frac{S^2}{(\ln 10)^2} \cdot \frac{1}{I_{exp}} \cdot \left[1 + \exp\left(-\frac{q}{kT}V_d\right)\right] \quad (9)$$

As apparent from Equation (9), it is effective to decrease the sub-threshold coefficient S of the transistor to decrease the thermal noise $S_{V_g}$ in the sub-threshold region of the transistor.

Figure 15:
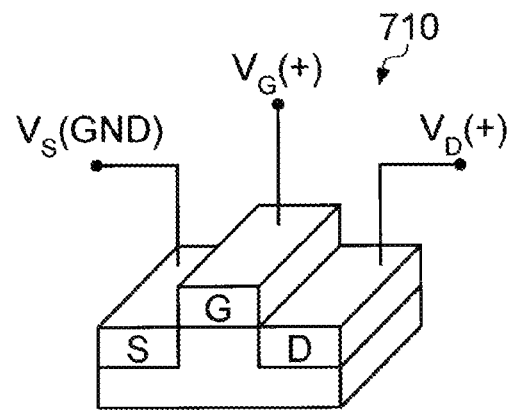
FIG. 15 is a schematic diagram depicting another configuration example of the transistor according to the second embodiment.
Figure 16:
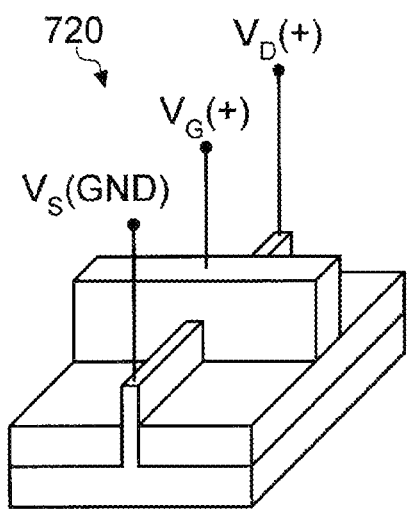
FIG. 16 is a schematic diagram depicting still another configuration example of the transistor according to the second embodiment.

Examples of the transistor having the small sub-threshold coefficient S include a transistor having a sharp on-off characteristic (sub-threshold characteristic) produced by a tunneling current such as a tunneling FET 710 depicted in FIG. 15 by way of example and an FinFET 720 depicted in FIG. 16 by way of example.

Improvement of noise characteristics by reduction of the thermal noise $S_{V_g}$ of the transistor is achievable by using the transistor having the small sub-threshold coefficient S as described above for each of the transistors constituting the upper layer pixel circuit 500. For example, the thermal noise $S_{V_g}$ can be theoretically reduced to ¼ by using a transistor having the sub-threshold coefficient S reduced to ½.

3.2 Operation and Effect

According to the present embodiment, as described above, transistors having the preferable transconductance gm or the sub-threshold coefficient S can be used for the transistors constituting the upper layer pixel circuit 500 to reduce thermal noise of the transistors. As a result, reduction of deterioration of DVS noise characteristics is achievable.

Note that other configurations, operations, and effects may be similar to those of the above embodiments, and are therefore not described in detail herein.

4. Third Embodiment

Described in a third embodiment will be an example of a manufacturing process of the solid-state imaging device 200 according to the present disclosure. Note that the present embodiment presented by way of example is a case where the FDSOI substrate 701 presented in the second embodiment by way of example is used for the semiconductor substrate 611 of the second chip 201b. However, the present embodiment is similarly applicable to the solid-state imaging device 200 having other configurations.

4.1 Manufacturing Process of Solid-State Imaging Device

FIGS. 17 to 28 are cross-sectional diagrams each depicting an example of a manufacturing process of the solid-state imaging device according to the third embodiment. In the present manufacturing process, the pixel separation unit 604 having a grid shape is first provided on the semiconductor substrate 601 of p-type where acceptors are diffused to partition regions in each of which the corresponding photoelectric conversion element 333 is formed.

Subsequently, a donor is ion-implanted from the front surface side of the semiconductor substrate 601 into each of the regions partitioned by the pixel separation unit 604, to form the photoelectric conversion element 333 including the p-type semiconductor region 605 and the n-type semiconductor region 606.

Thereafter, a donor is ion-implanted on the front surface side of the semiconductor substrate 601 in such a manner as to reach the n-type semiconductor region 606 to form the contact layer 607 electrically connected to the n-type semiconductor region 606.

Then, silicon oxide ($SiO_2$) is deposited on the semiconductor substrate 601 by using a plasma CVD (Chemical Vapor Deposition) method, for example, to form the interlayer dielectric 608. Subsequently, a surface of the interlayer dielectric 608 is flattened using CMP (Chemical Mechanical Polishing), for example.

Figure 17:
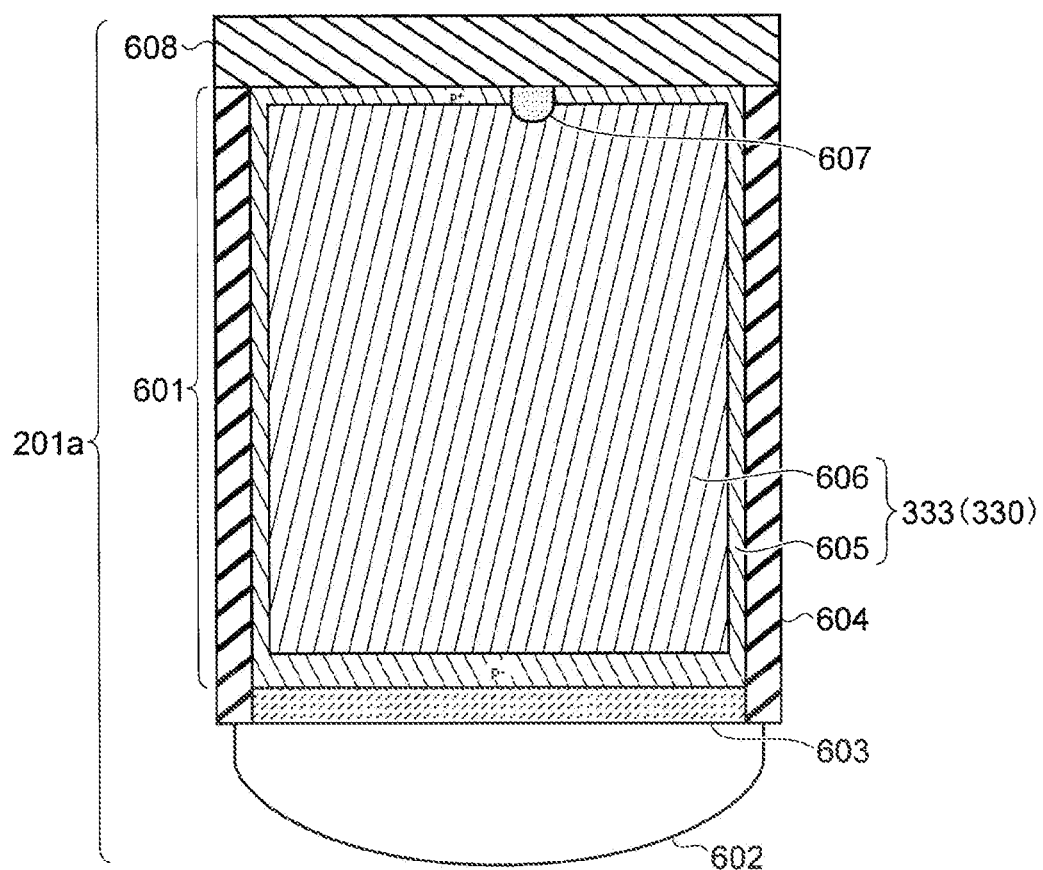
FIG. 17 is a cross-sectional diagram (1) depicting an example of a manufacturing process of a solid-state imaging device according to a third embodiment.

Thereafter, the flattening film 603 and the on-chip lens 602 are provided on the rear surface side of the semiconductor substrate 601. In this manner, the first chip 201a before individualization is formed as depicted in FIG. 17.

Figure 18:
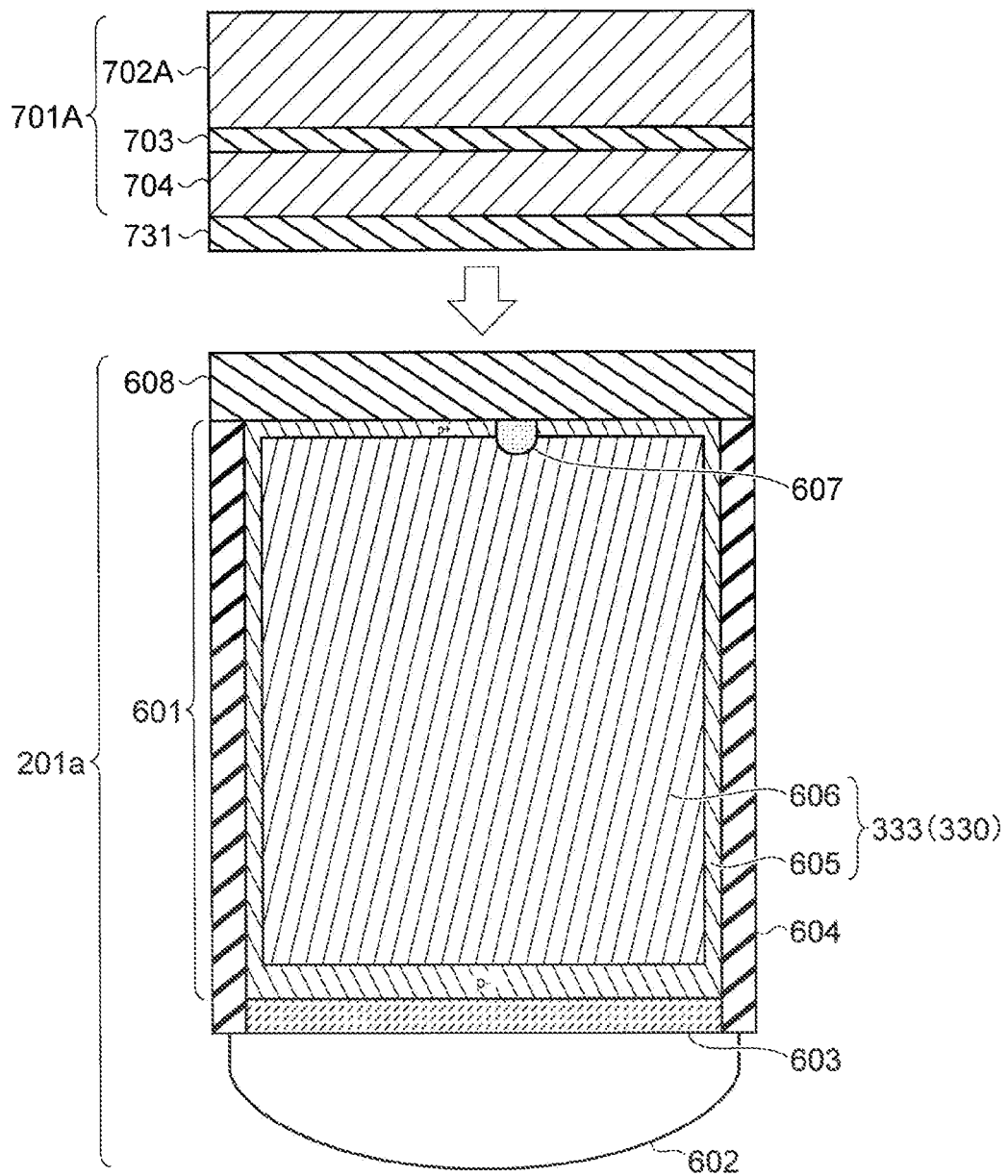
FIG. 18 is a cross-sectional diagram (2) depicting an example of the manufacturing process of the solid-state imaging device according to the third embodiment.

Then, as depicted in FIG. 18, a surface of a silicon oxide film 731 of an SOI substrate 701A (support substrate (e.g., silicon substrate) 704, embedded oxide film (e.g., silicon oxide film) 703, and silicon layer 702A) on a rear surface of which the silicon oxide film 731 is formed is affixed to a surface of the interlayer dielectric 608 of the first chip 201a to directly join the SOI substrate 701A and the first chip 201a. Note that the surface of the silicon oxide film 731 is flattened by CMP, for example.

Figure 19:
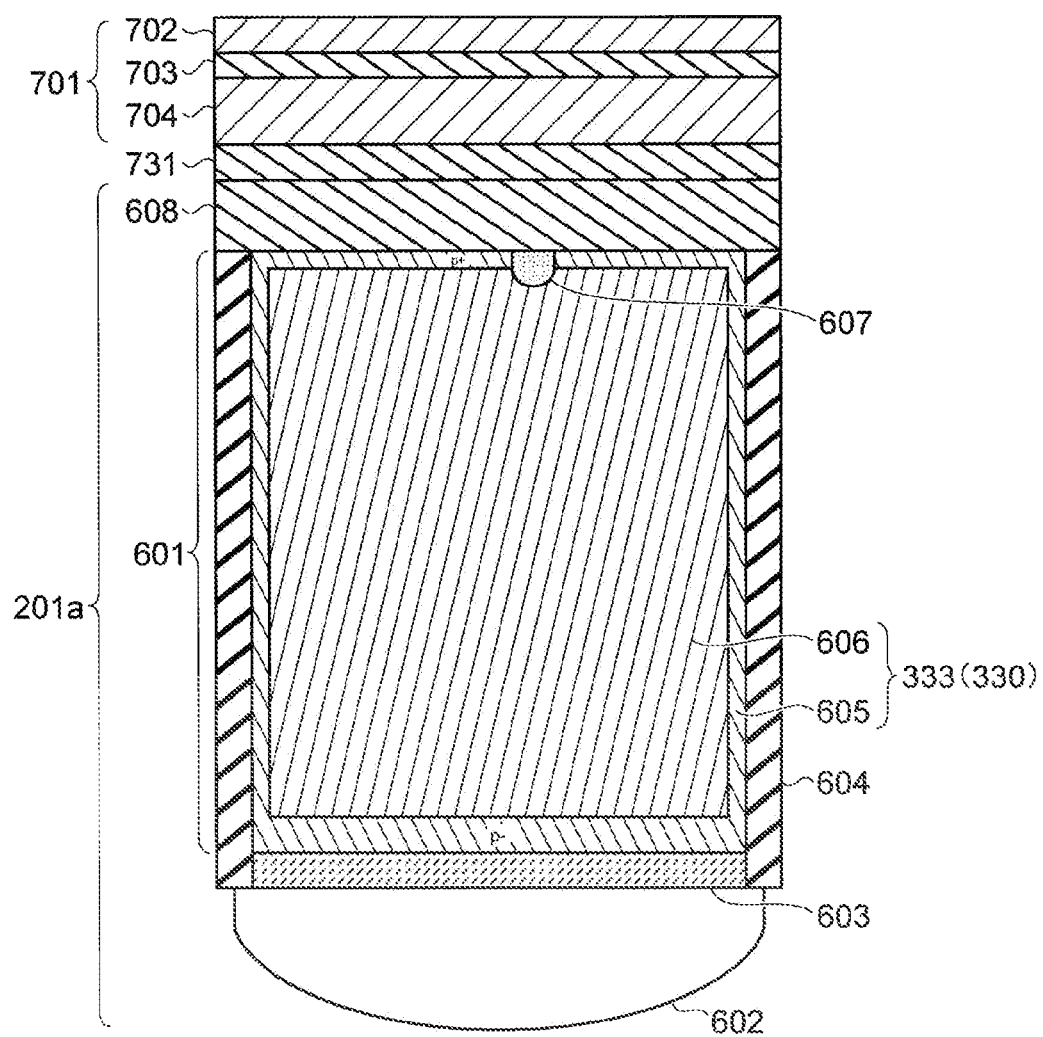
FIG. 19 is a cross-sectional diagram (3) depicting an example of the manufacturing process of the solid-state imaging device according to the third embodiment.

Subsequently, as depicted in FIG. 19, a thickness of the silicon layer 702A of the SOI substrate 701A is reduced to form the silicon thin film 702.

Figure 20:
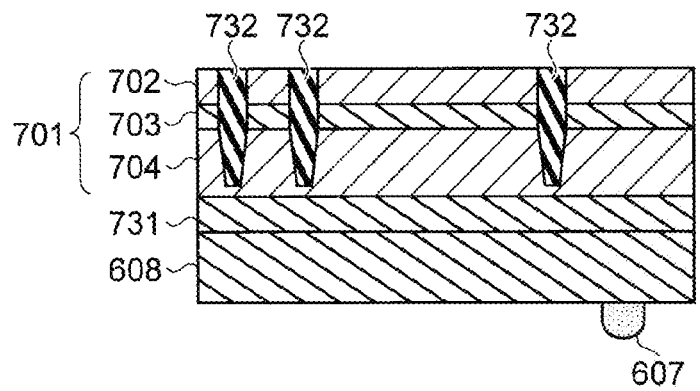
FIG. 20 is a cross-sectional diagram (4) depicting an example of the manufacturing process of the solid-state imaging device according to the third embodiment.

Thereafter, as depicted in FIG. 20, element separation insulation films (also referred to as channel stoppers) 732 each reaching a middle of the support substrate 704 from the silicon thin film 702 are formed. Note that each of the element separation insulation films 732 is formed not only in a region partitioning the LG transistor 411 and the amplification transistor 412 of the upper layer pixel circuit 500, but also in a region to which a reverse bias is applied in each of the LG transistor 411 and the amplification transistor 412. Note that layers lower than the interlayer dielectric 608 of the first chip 201a are not depicted in the figures in the following description.

Figure 21:
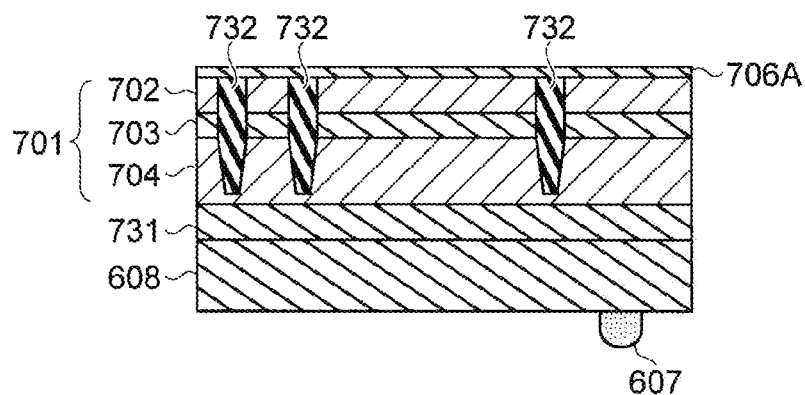
FIG. 21 is a cross-sectional diagram (5) depicting an example of the manufacturing process of the solid-state imaging device according to the third embodiment.

Subsequently, as depicted in FIG. 21, a silicon oxide film 706A is formed on the surface of the silicon thin film 702 where the element separation insulation films 732 have been formed.

Figure 22:
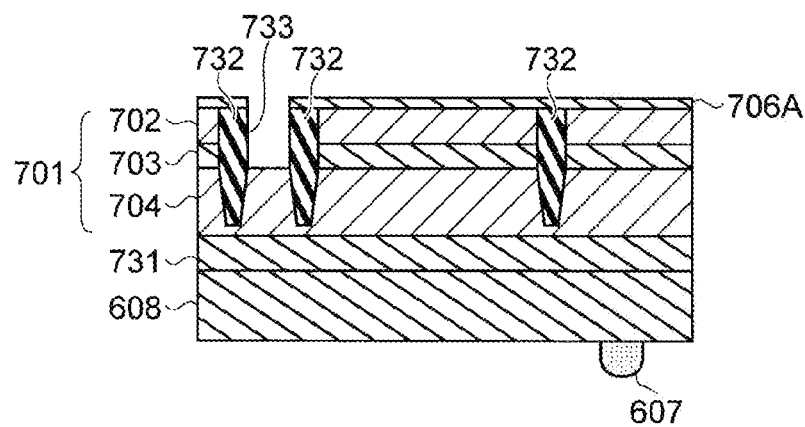
FIG. 22 is a cross-sectional diagram (6) depicting an example of the manufacturing process of the solid-state imaging device according to the third embodiment.

Then, as depicted in FIG. 22, a region to which a reverse bias is applied in the region partitioned by the element separation insulation films 732 is etched by RIE (Reactive Ion Etching), for example, to form a trench 733 through which the support substrate 704 is exposed.

Figure 23:
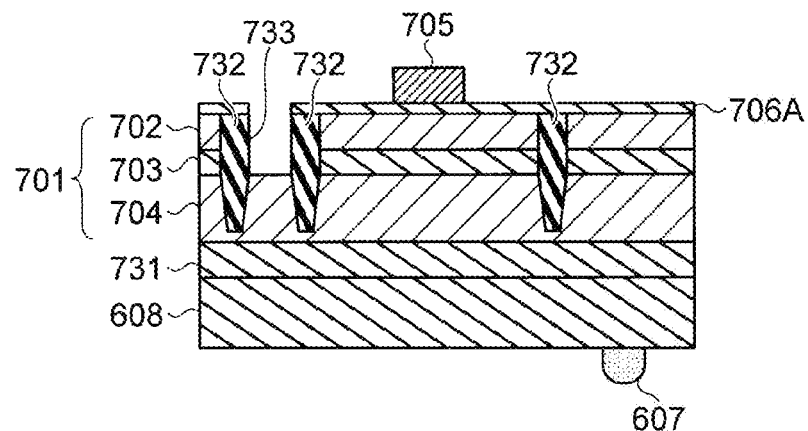
FIG. 23 is a cross-sectional diagram (7) depicting an example of the manufacturing process of the solid-state imaging device according to the third embodiment.

Thereafter, as depicted in FIG. 23, the gate 705 (corresponding to the gate 4111 or 4121) of each of the transistors (411 and 412) is formed on the silicon oxide film 706A in a region that is partitioned by the element separation insulation films 732 and that forms the LG transistor 411 and the amplification transistor 412.

Figure 24:
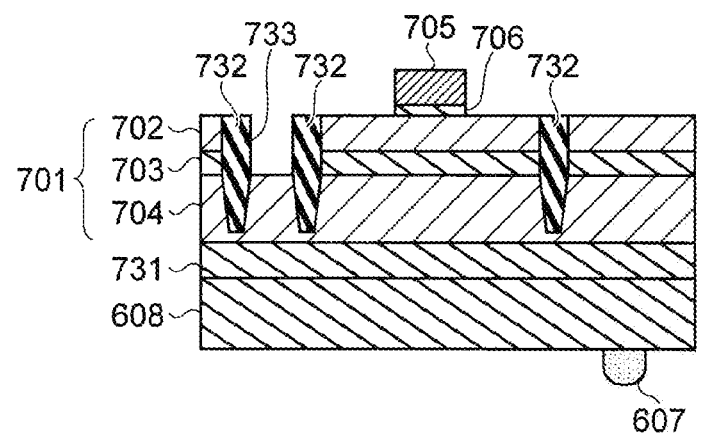
FIG. 24 is a cross-sectional diagram (8) depicting an example of the manufacturing process of the solid-state imaging device according to the third embodiment.
Figure 25:
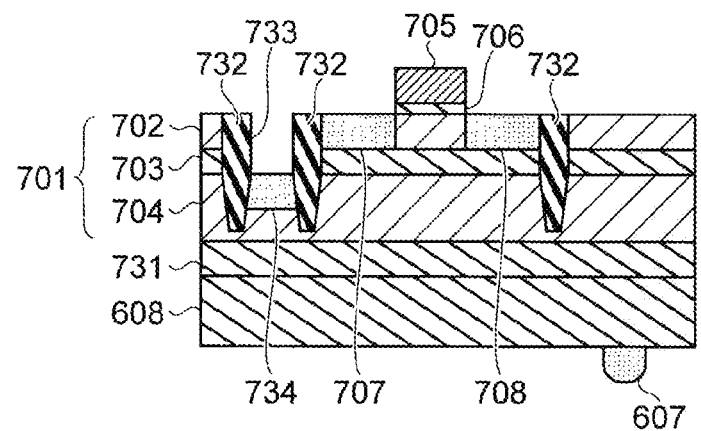
FIG. 25 is a cross-sectional diagram (9) depicting an example of the manufacturing process of the solid-state imaging device according to the third embodiment.

Subsequently, as depicted in FIG. 24, the surface of the FDSOI substrate 701 where the gate 705 is formed is etched back to remove the exposed silicon oxide film 706A and form the gate insulation film 706 below the gate 705, for example. Thereafter, as depicted in FIG. 25, a predetermined dopant is ion-implanted into the surface of the FDSOI substrate 701 using the gate 705 and the element separation insulation films 732 as masks, for example, to form the source 707 and the drain 708 between which a region included in the silicon thin film 702 and located below the gate 705 is sandwiched, and to form a contact layer 734 to which a reverse bias is applied in a region included in the support substrate 704 and exposed through the trench 733.

Figure 26:
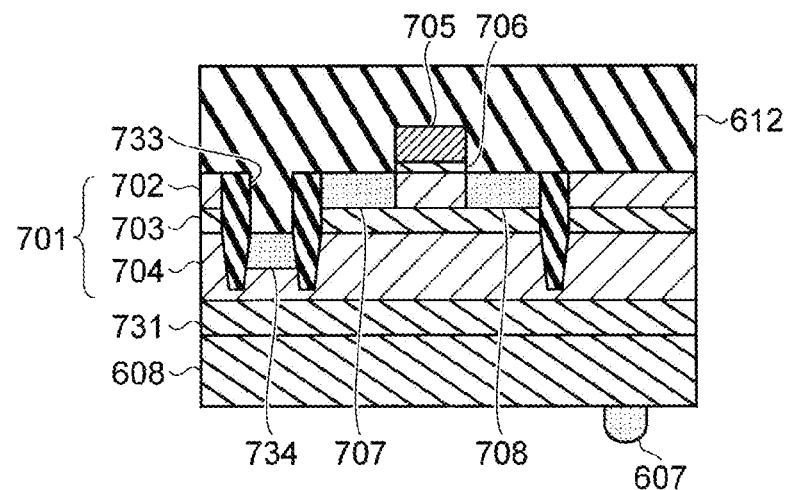
FIG. 26 is a cross-sectional diagram (10) depicting an example of the manufacturing process of the solid-state imaging device according to the third embodiment.

Then, as depicted in FIG. 26, silicon nitride (SiN) is deposited on the FDSOI substrate 701 using the plasma CVD method, for example, to form the interlayer dielectric 612.

Figure 27:
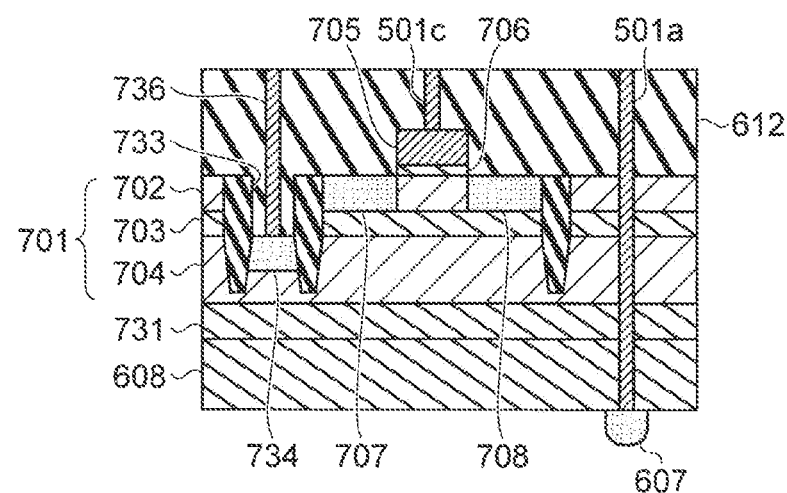
FIG. 27 is a cross-sectional diagram (11) depicting an example of the manufacturing process of the solid-state imaging device according to the third embodiment.

Subsequently, as depicted in FIG. 27, through holes through which the gate 705 and the contact layer 734 are exposed are formed in the interlayer dielectric 612, and a through hole that penetrates the interlayer dielectric 612, the FDSOI substrate 701, the silicon oxide film 731, and the interlayer dielectric 608 and that is formed as a hole through which the contact layer 607 is exposed is formed. The TSV 501a connected to the contact layer 607, the TSV 501c connected to the gate 705, and a TSV 736 connected to the contact layer 734 are formed in the corresponding through holes thus formed. Note that the TSV 501b connected to the source of the LG transistor 411 is similarly formed, but not depicted in the figure.

Figure 28:
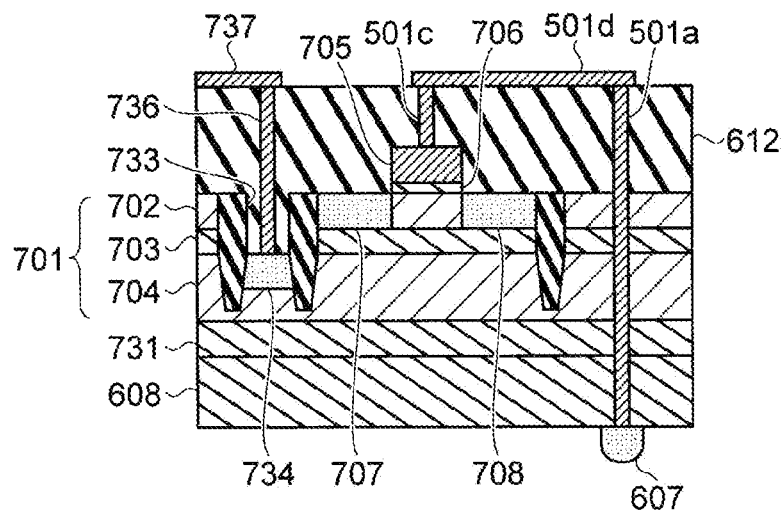
FIG. 28 is a cross-sectional diagram (12) depicting an example of the manufacturing process of the solid-state imaging device according to the third embodiment.

Thereafter, as depicted in FIG. 28, wiring 501d connecting the TSVs 501a, 501b, and 501c is formed on the interlayer dielectric 612, and wiring 737 connecting the TSV 736 to predetermined wiring is formed. In this manner, the upper layer pixel circuit 500 including the LG transistor 411 and the amplification transistor 412 is formed on the FDSOI substrate 701.

Then, the wiring layer 613 is formed on the FDSOI substrate 701, and the Cu pad 619 of the wiring layer 613 and the Cu pad 629 of the wiring layer 623 of the detection chip 202 are joined to each other (Cu—Cu junction) to manufacture the solid-state imaging device 200 according to the present embodiment (see FIG. 8). Note that the detection chip 202 is separately produced.

4.2 Operation and Effect

As described above, manufacturable according to the present embodiment is the solid-state imaging device 200 which includes the photoelectric conversion element 333 of the light reception unit 330 and the upper layer pixel circuit 500 disposed on the semiconductor substrate 601 and the FDSOI substrate 701 (or semiconductor substrate 611 adoptable in place of the FDSOI substrate 701), respectively, which are different substrates and electrically separated from each other via the interlayer dielectric 608.

Note that other configurations, operations, and effects may be similar to those of the above embodiments, and are therefore not described in detail herein.

5. Fourth Embodiment

According to a fourth embodiment, an overflow gate (OFG) is provided between the photoelectric conversion element 333 and the address event detection unit 400 in the solid-state imaging device 200 of the embodiments described above. A solid-state imaging device and an imaging device according to the fourth embodiment will be hereinafter described in detail with reference to the drawings.

In the present embodiment, configurations and operations of the imaging device and the solid-state imaging device may be similar to those of the embodiments described above. However, in the present embodiment, the light reception unit 330 of the unit pixel 310 is replaced with a light reception unit 730 depicted in FIG. 29.

5.1 Configuration Example of Unit Pixel

Figure 29:
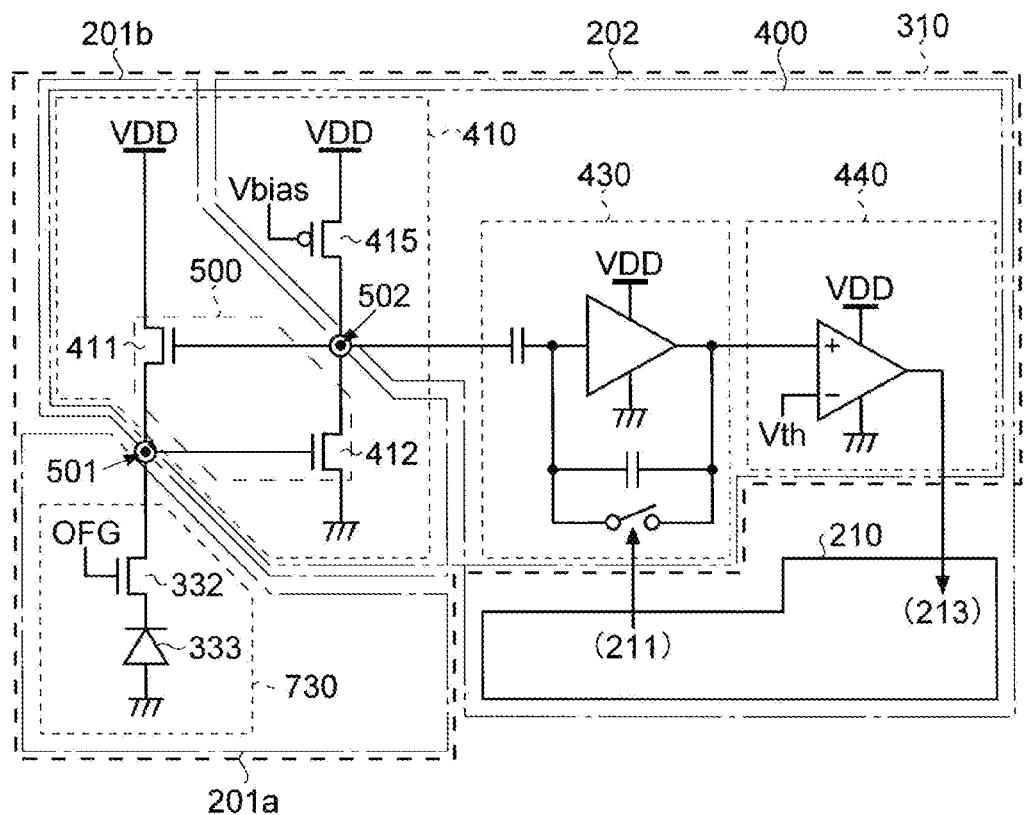
FIG. 29 is a circuit diagram depicting a schematic configuration example of a unit pixel according to a fourth embodiment.

FIG. 29 is a circuit diagram depicting a schematic configuration example of a unit pixel according to the present embodiment. As depicted in FIG. 29, in the unit pixel 310 according to the present embodiment, the light reception unit 330 of the embodiments described above (see FIG. 4 and other figures) is replaced with the light reception unit 730 depicted in FIG. 29.

The light reception unit 730 includes an OFG (OverFlow Gate) transistor 332 as well as the photoelectric conversion element 333. For example, the OFG transistor 332 may be including an N-type MOS transistor (hereinafter simply referred to as an NMOS transistor).

A source of the OFG transistor 332 is connected to the cathode of the photoelectric conversion element 333, while a drain of the OFG transistor 332 is connected to the address event detection unit 400 via the connection portion 501. In addition, a control signal OFG for controlling transfer of a charge generated in the photoelectric conversion element 333 to the address event detection unit 400 is applied from the driving circuit 211 to a gate of the OFG transistor 332.

5.2 Cross-Sectional Structure Example of Solid-State Imaging Device

Figure 30:
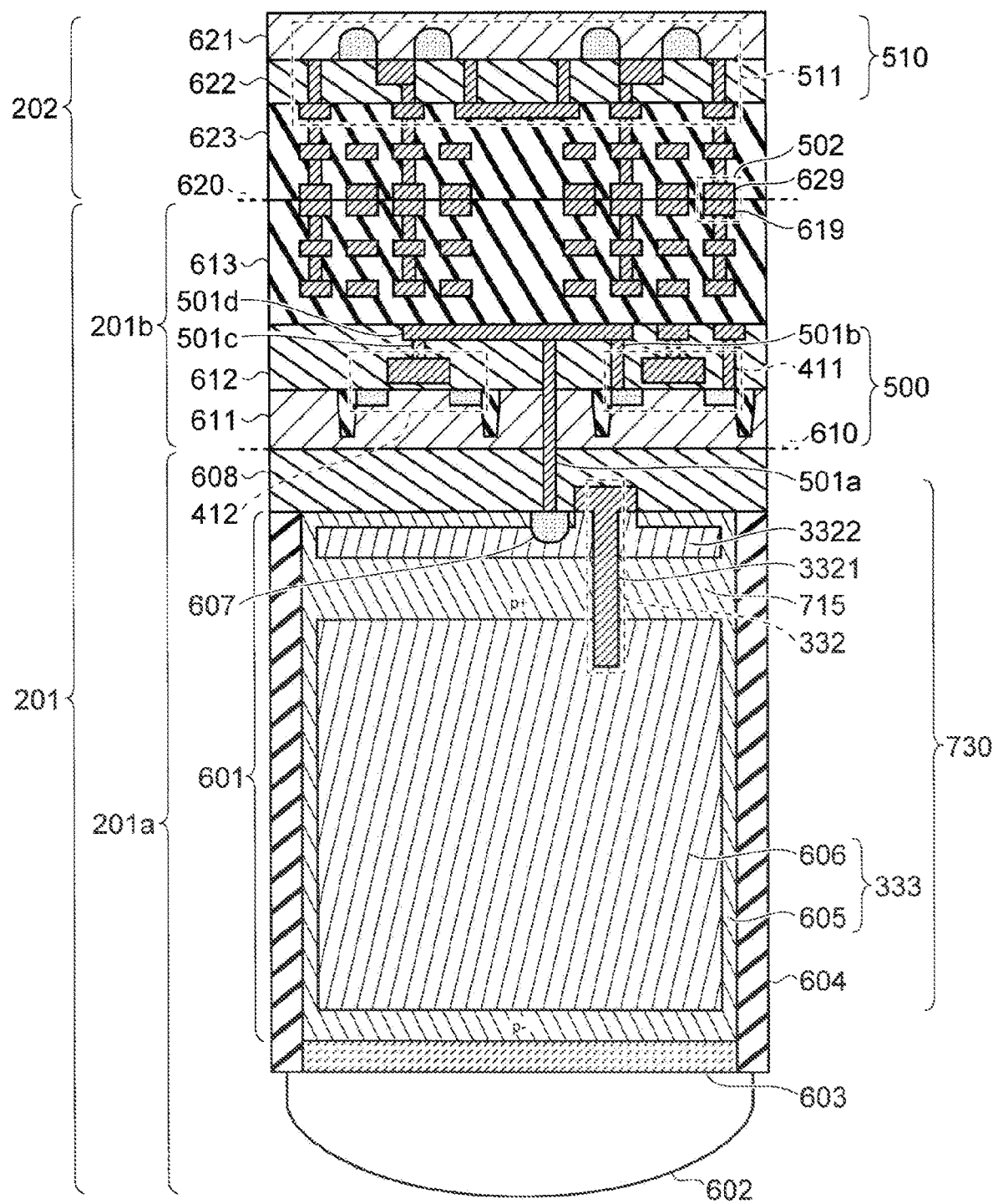
FIG. 30 is a cross-sectional diagram depicting a cross-sectional structure example of the solid-state imaging device according to the fourth embodiment.

FIG. 30 is a cross-sectional diagram depicting a cross-sectional structure example of the solid-state imaging device according to the present embodiment. Note that FIG. 30 depicts a cross-sectional structure example of the solid-state imaging device 200 taken along a plane vertical to a light entrance surface (light reception surface) similarly to FIG. 8.

As depicted in FIG. 30, for example, the solid-state imaging device 200 includes the OFG transistor 332 disposed on the semiconductor substrate 601 of the first chip 201a in a stacking structure and a cross-sectional structure similar to those of the solid-state imaging device 200 depicted in FIG. 8 by way of example.

According to the present embodiment, therefore, an n-type semiconductor region 3322 which becomes a drain of the OFG transistor 332 is provided on the semiconductor substrate 601 in addition to the n-type semiconductor region 606 for the photoelectric conversion element 333. The n-type semiconductor region 606 and the n-type semiconductor region 3322 are electrically separated from each other via a p-type semiconductor region 715, for example. The TSV 501a of the connection portion 501 is electrically connected to the n-type semiconductor region 3322 via the contact layer 607.

Moreover, a gate 3321 of the OFG transistor 332 is also provided on the semiconductor substrate 601. The gate 3321 reaches a middle of the n-type semiconductor region 606 from the n-type semiconductor region 3322 via the p-type semiconductor region 715. Accordingly, charges accumulated in the n-type semiconductor region 606 of the photoelectric conversion element 333 start to flow into the second chip 201b via the OFG transistor 332 and the TSV 501a by application of a high-level control signal OFG to the gate 3321.

5.3 Floor Map Example

In addition, a floor map example of the second chip 201b according to the present embodiment may be similar to the floor map example explained in the first embodiment with reference to FIG. 10 or FIG. 11, for example. On the other hand, the floor map example of the first chip 201a is replaced with a floor map example depicted in FIG. 31.

Figure 31:
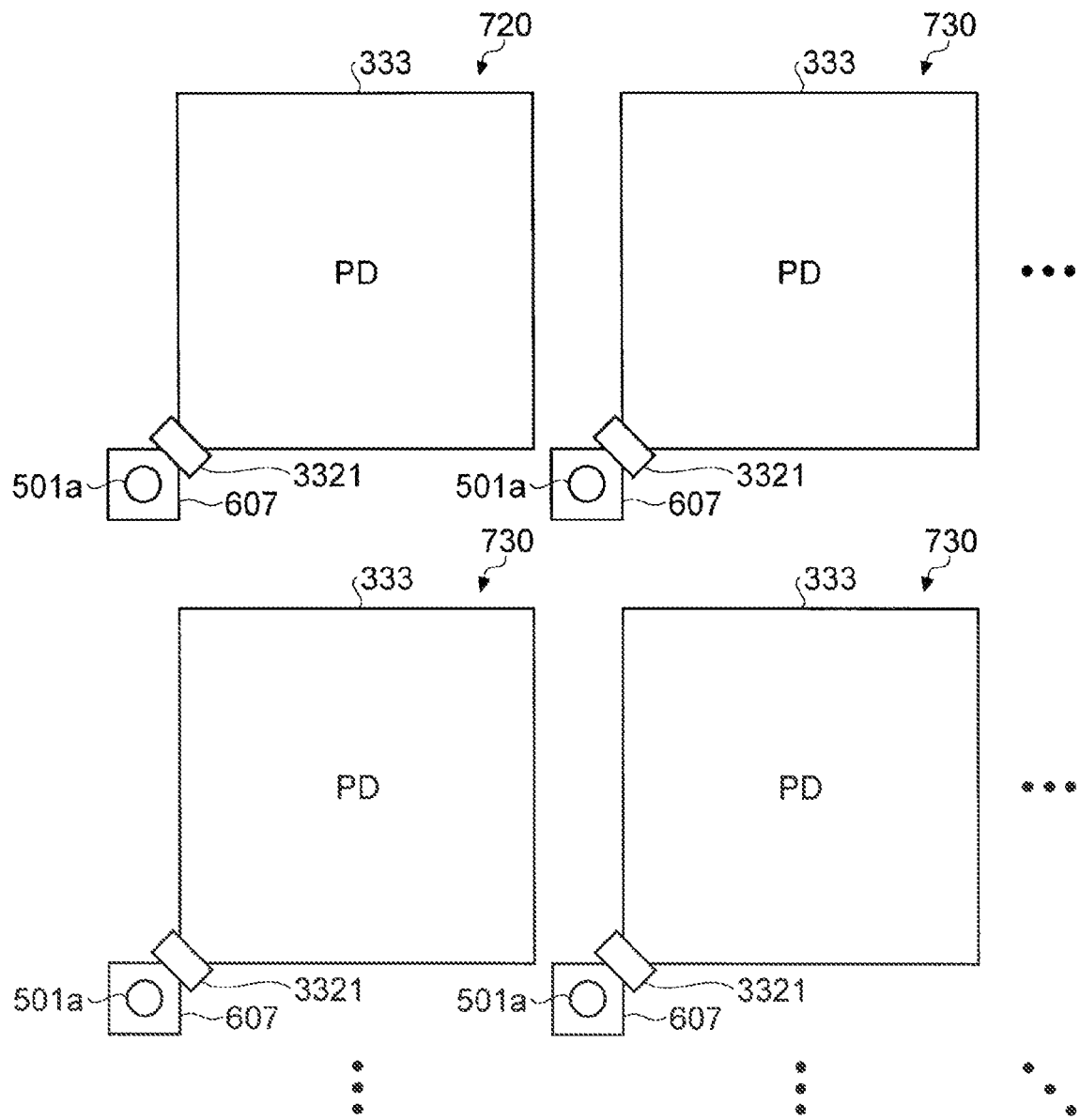
FIG. 31 is a plan diagram depicting a floor map example of a first chip according to the fourth embodiment.

As depicted in FIG. 31, according to the floor map example of the first chip 201a of the present embodiment, the gate 3321 of the OFG transistor 332 is disposed between the photoelectric conversion element 333 and the contact layer 607 in a layout similar to that of the floor map example depicted in FIG. 9.

5.4 Operation and Effect

According to the present embodiment, as described above, the OFG transistor 332 for controlling readout of a charge from the photoelectric conversion element 333 is disposed between the photoelectric conversion element 333 and the address event detection unit 400. Moreover, the OFG transistor 332 is disposed on the first chip 201a same as the photoelectric conversion element 333. According to the present embodiment, such a configuration achieves readout of a charge from the photoelectric conversion element 333 at a necessary timing.

Note that other configurations, operations, and effects may be similar to those of the above embodiments, and are therefore not described in detail herein.

6. Fifth Embodiment

An imaging device and a solid-state imaging device according to a fifth embodiment will next be described in detail with reference to the drawings.

Figure 32:
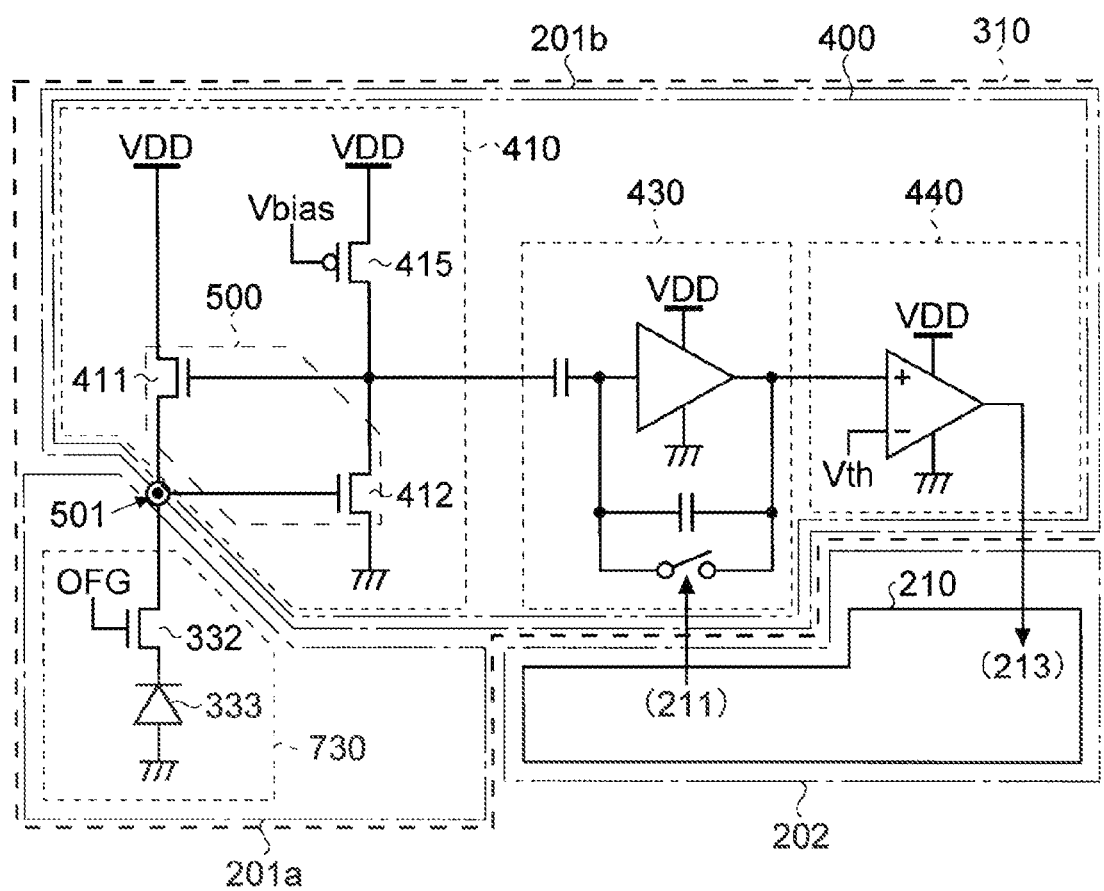
FIG. 32 is a circuit diagram depicting a schematic configuration example of a unit pixel according to a fifth embodiment.

According to the embodiments described above, the upper layer pixel circuit 500 disposed on the second chip 201b is a part of the transistors of the current voltage conversion unit 410 in the address event detection unit 400 (LG transistor 411 (or the LG transistors 411 and 413) and the amplification transistor 412 (or the amplification transistors 412 and 414)). However, the upper layer pixel circuit 500 disposed on the second chip 201b is not limited to a circuit including these circuit elements. For example, as depicted in FIG. 32 by way of example, the whole of the address event detection unit 400 may be disposed on the second chip 201b. Alternatively, as depicted in FIG. 33 by way of example, the driving circuit 211 of the logic circuit 210 may be disposed on the second chip 201b in addition to the whole of the address event detection unit 400.

As described above, the configuration disposed on the second chip 201b can be modified in various manners. Even in that case, the photoelectric conversion element 333 of the light reception unit 330 and the circuit element disposed on the second chip 201b are disposed on the semiconductor substrates 601 and 611, respectively, which are different substrates electrically separated from each other via the interlayer dielectric 608. Accordingly, deterioration of DVS noise characteristics can be reduced by reduction of entrance of a dark current from the photoelectric conversion element 333.

Figure 33:
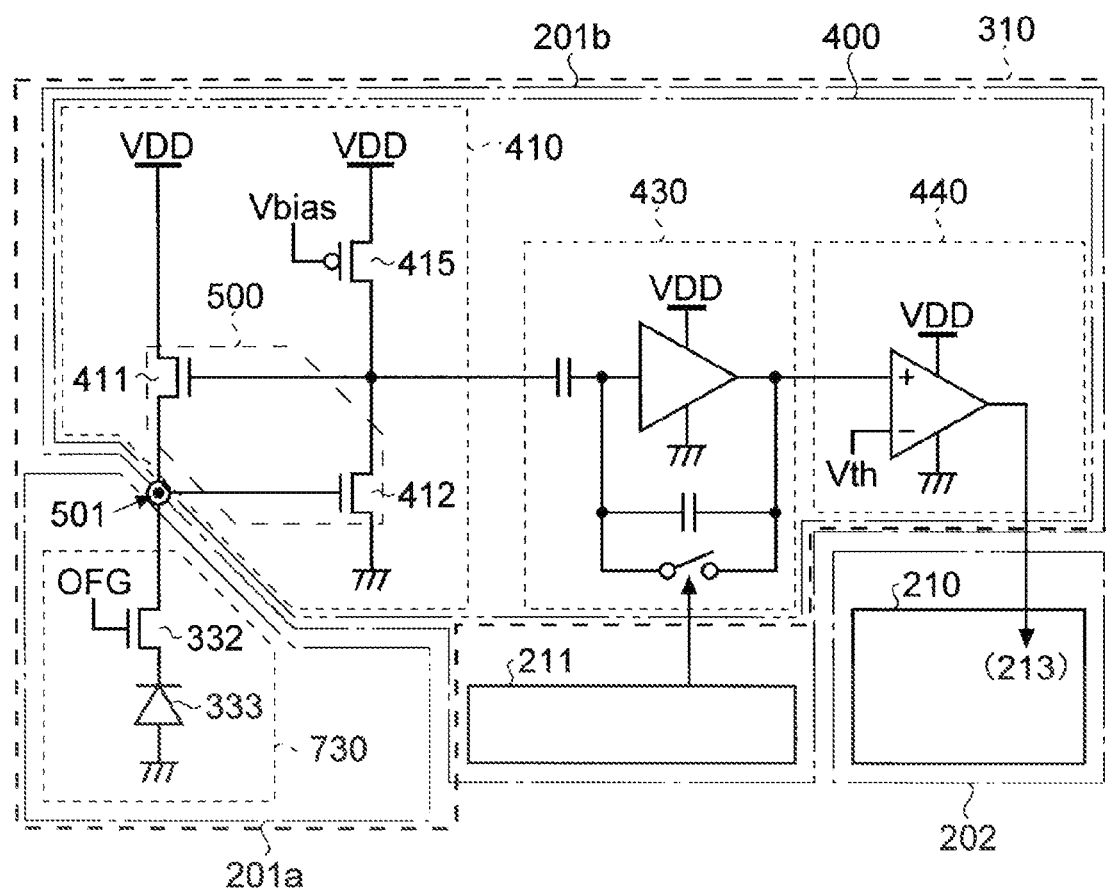
FIG. 33 is a circuit diagram depicting another schematic configuration example of the unit pixel according to the fifth embodiment.

Note that FIGS. 32 and 33 each depict a case based on the solid-state imaging device 200 described in the fourth embodiment with reference to FIG. 29 by way of example. However, the present embodiment is not limited to this example, and can be a case based on the solid-state imaging device 200 according to the other embodiments, such as the solid-state imaging device 200 depicted in FIG. 4 by way of example.

In addition, other configurations, operations, and effects may be similar to those of the above embodiments, and are therefore not described in detail herein.

7. Sixth Embodiment

An imaging device and a solid-state imaging device according to a sixth embodiment will next be described in detail with reference to the drawings.

7.1 Stacking Structure Example of Solid-State Imaging Device

Figure 34:
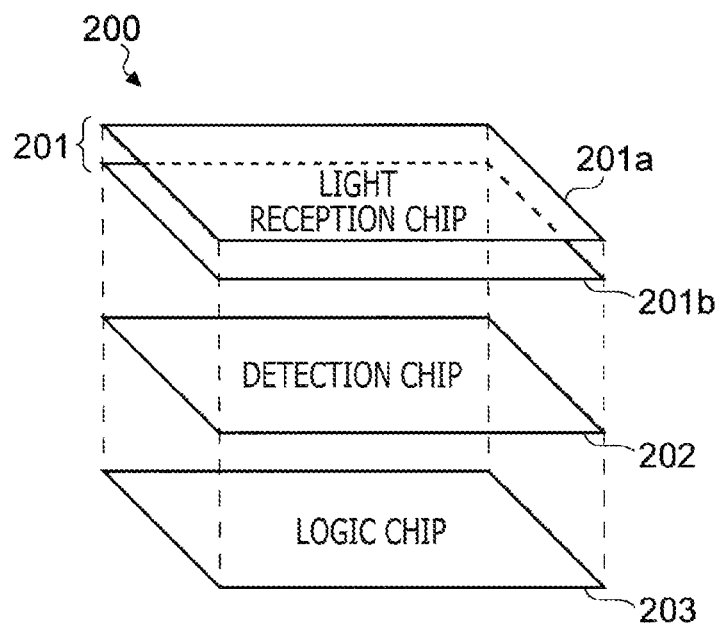
FIG. 34 is a diagram depicting a stacking structure example of a solid-state imaging device according to a sixth embodiment.

According to the embodiments described above, the light reception chip 201 has a double-layer configuration including the first chip 201a and the second chip 201b, and the detection chip 202 is affixed to this configuration to constitute the solid-state imaging device 200 having a three-layer stacking structure (see FIG. 2). However, the number of stacked layers is not limited to three. For example, as depicted in FIG. 34 by way of example, adoptable is a four-layer stacking structure where a logic chip 203 is further stacked in addition to the light reception chip 201 and the detection chip 202 of the double-layer structure.

7.2 Configuration Example of Unit Pixel

Figure 35:
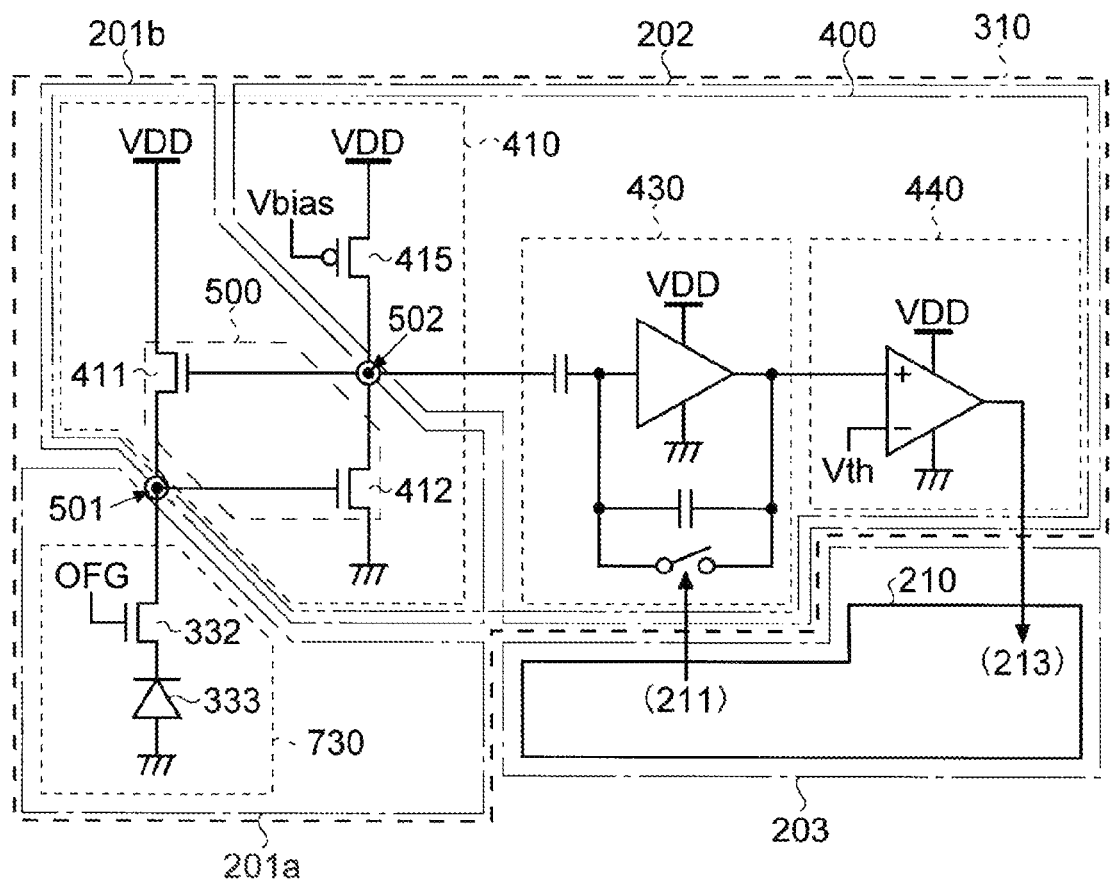
FIG. 35 is a circuit diagram depicting a schematic configuration example of a unit pixel according to the sixth embodiment.

FIG. 35 is a circuit diagram depicting a schematic configuration example of a unit pixel in a case where the solid-state imaging device has a four-layer stacking structure. In a case where the solid-state imaging device 200 has the four-layer stacking structure as depicted in FIG. 35, the logic circuit 210 such as the driving circuit 211, the signal processing unit 212, and the arbiter 213 is allowed to be disposed on the logic chip 203 in a lowest layer (fourth layer), for example. However, this configuration is not required to be adopted but can be modified in various manners. For example, a part of the logic circuit 210 (e.g., the driving circuit 211) may be disposed on the second chip 201b or the detection chip 202, and the rest of the circuits may be disposed on the logic chip 203. Alternatively, a part of the address event detection unit 400 may be disposed on the logic chip 203.

As described above, a larger area is allowed to be allocated to the transistors constituting the pixel circuit by adopting the four-layer stacking structure. Accordingly, further improvement of DVS noise characteristics is achievable by further reduction of thermal noise of the transistors.

Note that FIG. 35 depicts a case based on the solid-state imaging device 200 described in the fourth embodiment with reference to FIG. 29 by way of example. However, the present embodiment is not limited to this example, but is applicable to a case based on the solid-state imaging device 200 according to the other embodiments, such as the solid-state imaging device 200 depicted in FIG. 4 by way of example.

In addition, other configurations, operations, and effects may be similar to those of the above embodiments, and are therefore not described in detail herein.

8. Seventh Embodiment

An imaging device and a solid-state imaging device according to a seventh embodiment will next be described in detail with reference to the drawings.

8.1 Cross-Sectional Structure Example of Solid-State Imaging Device

Figure 36:
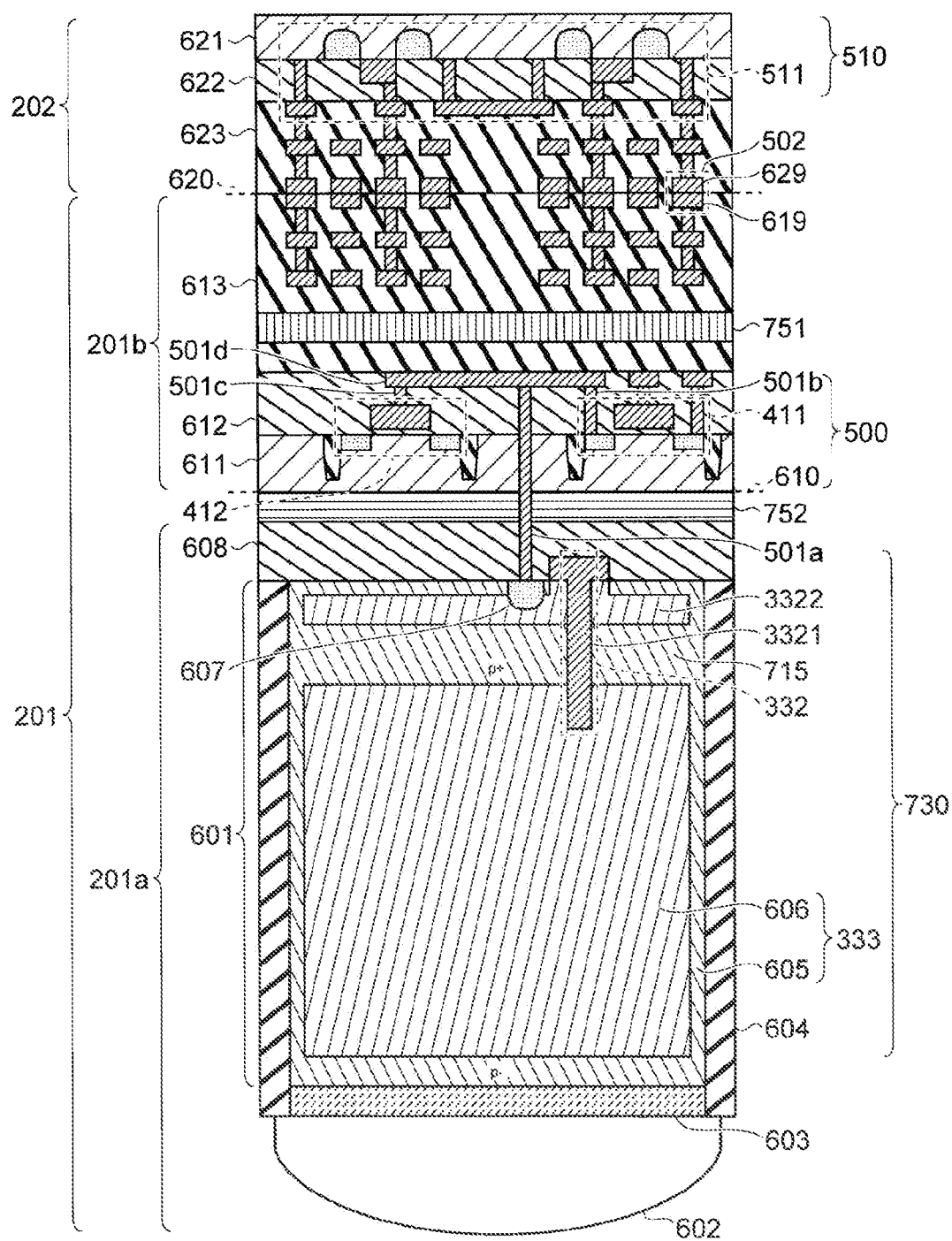
FIG. 36 is a cross-sectional diagram depicting a cross-sectional structure example of a solid-state imaging device according to a seventh embodiment.

FIG. 36 is a cross-sectional diagram depicting a cross-sectional structure example of the solid-state imaging device according to the present embodiment. As depicted in FIG. 36, for example, the solid-state imaging device 200 has a structure which adds a hydrogen supply film 751 to the wiring layer 613 of the second chip 201b, and adds a hydrogen diffusion preventive film 752 between the first chip 201a and the second chip 201b in a cross-sectional structure similar to that of the solid-state imaging device 200 described in the fourth embodiment with reference to FIG. 30. Note that each of the wiring layers 613 and 623 and the interlayer dielectrics 612 and 622 is including a silicon nitride film.

For example, the hydrogen supply film 751 can be including a silicon nitride film that has a large hydrogen content and that is formed by the plasma CVD method or the like (hereinafter referred to as a plasma SiN film). As described above, the plasma SiN film (hydrogen supply film 751) having a large hydrogen content is disposed in the vicinity of an interface between the layers each including a silicon nitride film (wiring layers 613 and 623 and interlayer dielectrics 612 and 622). In this case, grid defects produced on the interface by hydrogen atoms diffused from the plasma SiN film can be restored. In this manner, noise characteristics of the circuit elements constituting the pixel circuit improve. As a result, improvement of DVS noise characteristics can be achieved.

Meanwhile, the hydrogen diffusion preventive film 752 can be including a silicon nitride film that has a small hydrogen content and that is formed by low pressure plasma CVD or the like (hereinafter referred to as an LP-SiN film), for example. Diffusion of hydrogen atoms from the pixel circuit to the photoelectric conversion element 333 can be reduced by providing the LP-SiN film having a low hydrogen content (the hydrogen diffusion preventive film 752) between the pixel circuit and the photoelectric conversion element 333 as described above. In this manner, lowering of quantum efficiency caused by binning between pixels can be reduced.

Note that FIG. 36 depicts a case based on the solid-state imaging device 200 described in the fourth embodiment with reference to FIG. 30 by way of example. However, the present embodiment is not limited to this example, but can be a case based on the solid-state imaging device 200 according to the other embodiments, such as the solid-state imaging device 200 depicted in FIG. 8 by way of example.

In addition, other configurations, operations, and effects may be similar to those of the above embodiments, and are therefore not described in detail herein.

9. Eighth Embodiment

A solid-state imaging device and an imaging device according to an eighth embodiment will next be described in detail with reference to the drawings.

The example of the configuration for detecting address event firing has been chiefly described in the above embodiments. According to the present embodiment, however, an example of a configuration for reading a pixel signal from a unit pixel corresponding to detected address event firing will be described in addition to the configuration for detecting address event firing.

Note that a schematic configuration and a stacking structure of the imaging device according to the present embodiment may be similar to the schematic configuration example and the stacking structure example of the imaging device 100 described in the first embodiment with reference to FIGS. 1 and 2, for example. Accordingly, detailed description of these is omitted.

9.1 Functional Configuration Example of Solid-State Imaging Device

Figure 37:
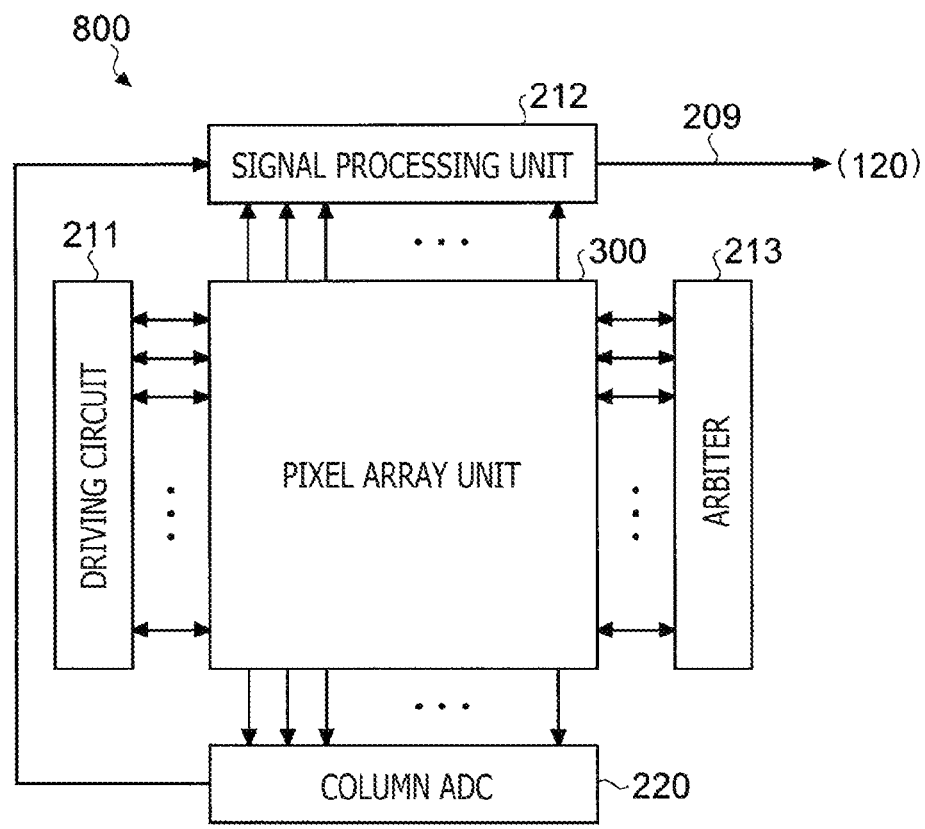
FIG. 37 is a block diagram depicting a functional configuration example of a solid-state imaging device according to an eighth embodiment.

FIG. 37 is a block diagram depicting a functional configuration example of the solid-state imaging device according to the eighth embodiment. As depicted in FIG. 37, the solid-state imaging device 200 further includes a column ADC 220 in addition to a configuration similar to the configuration of the solid-state imaging device 200 depicted in FIG. 3.

The driving circuit 211 sequentially drives unit pixels 810 each having output a detection signal according to a predetermined response from the arbiter 213, to cause the unit pixel 810 corresponding to detected address event firing to output an analog pixel signal corresponding to a received light amount, for example, to the signal processing unit 212.

The column ADC 220 converts analog pixel signals received from each of columns of the unit pixels 810 into digital signals. Thereafter, the column ADC 220 supplies digital pixel signals generated by the conversion to the signal processing unit 212.

The signal processing unit 212 executes predetermined signal processing such as CDS (Correlated Double Sampling) processing (noise removal) and white balance adjustment for pixel signals received from the column ADC 220. Then, the signal processing unit 212 supplies a result of the signal processing and a detection signal of an address event to the recording unit 120 via the signal line 209.

9.1.1 Configuration Example of Column ADC

Figure 38:
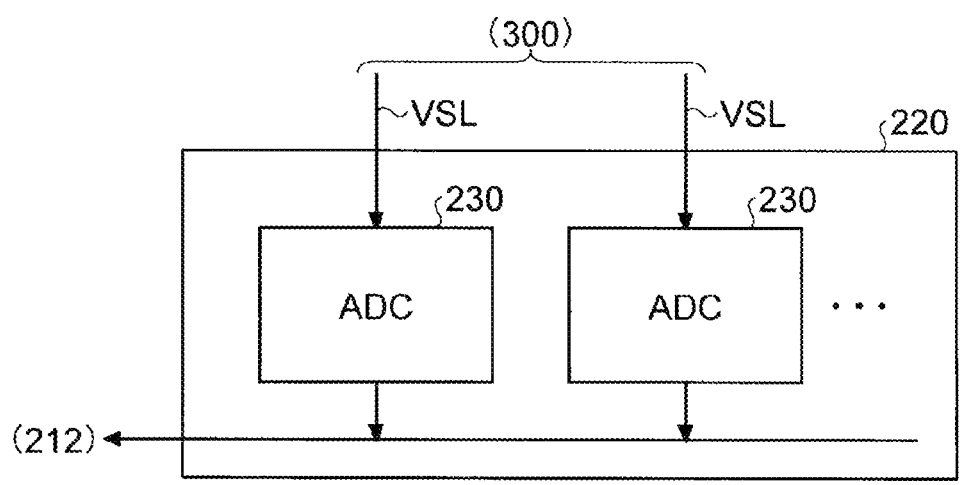
FIG. 38 is a block diagram depicting a schematic configuration example of a column ADC according to the eighth embodiment.

FIG. 38 is a block diagram depicting a schematic configuration example of the column ADC according to the present embodiment. As depicted in FIG. 38, the column ADC 220 includes a plurality of ADCs 230 provided for each column of the unit pixels 810.

Each of the ADCs 230 converts an analog pixel signal fetched in a vertical signal line VSL into a digital signal. For example, the ADC 230 converts the analog pixel signal into a digital signal having a larger bit number than that of a detection signal. Thereafter, the ADC 230 supplies the generated digital signal to the signal processing unit 212.

9.2 Configuration Example of Unit Pixel

Figure 39:
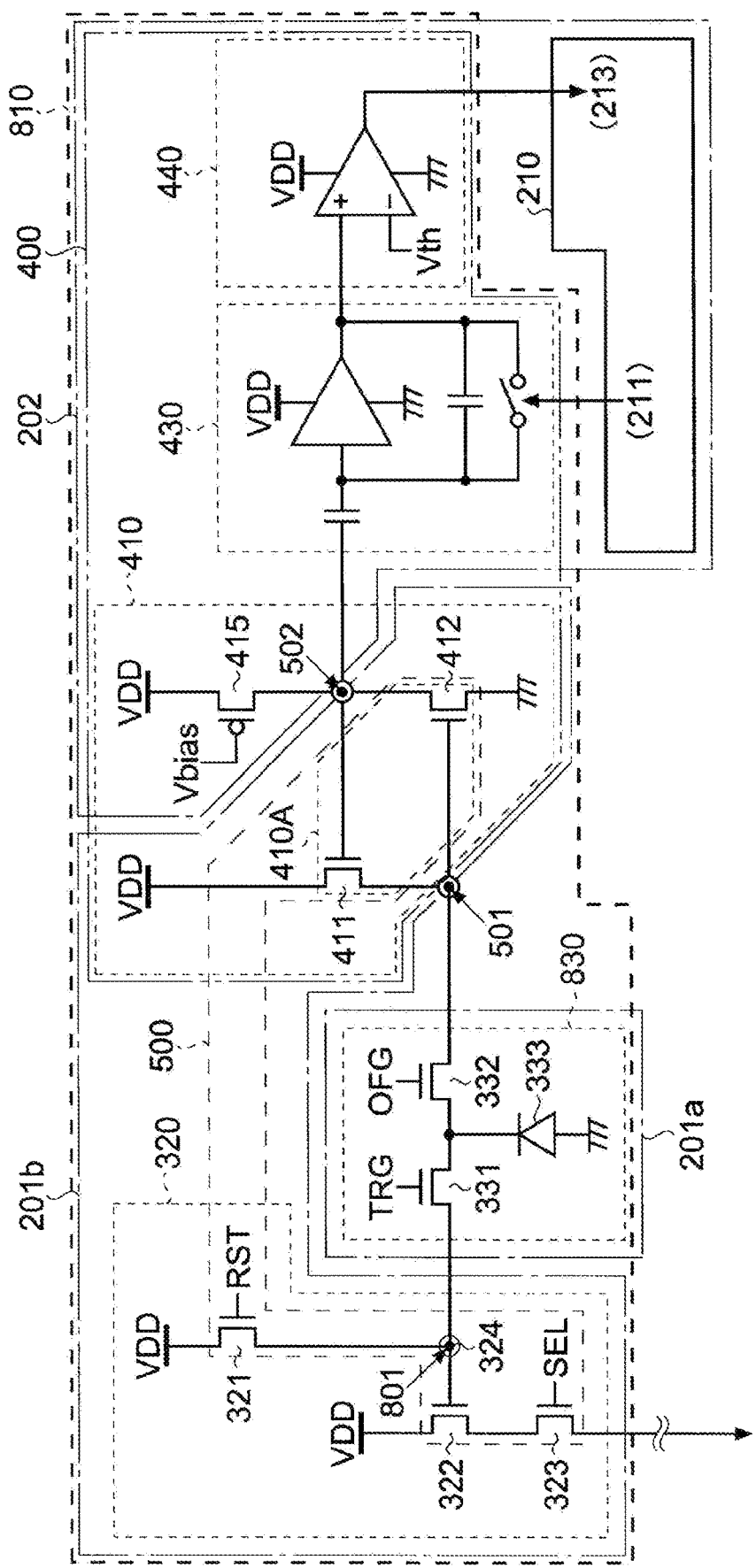
FIG. 39 is a circuit diagram depicting a schematic configuration example of a unit pixel according to the eighth embodiment.

A configuration example of the unit pixel according to the present embodiment will next be described. FIG. 39 is a circuit diagram depicting a schematic configuration example of a unit pixel according to the present embodiment. As depicted in FIG. 39, for example, the unit pixel 810 includes a light reception unit 830 in place of the light reception unit 730, and additionally includes a pixel signal generation unit 320 in a configuration similar to the configuration of the unit pixel 310 depicted in FIG. 29 by way of example.

The light reception unit 830 includes a transfer transistor 331 in addition to a configuration similar to the configuration of the light reception unit 730 in FIG. 29. Similarly to the OFG transistor 332, a source of the transfer transistor 331 is connected to the cathode of the photoelectric conversion element 333, while a drain of the transfer transistor 331 is connected to the pixel signal generation unit 320 via a connection portion 801. Note that the connection portion 801 may be a TSV, a Cu—Cu junction portion, a bump junction portion, or the like penetrating from the first chip 201a to the second chip 201b similarly to the connection portion 501, for example.

For example, the pixel signal generation unit 320 includes a reset transistor 321, an amplification transistor 322, a selection transistor 323, and a floating diffusion layer (Floating Diffusion: FD) 324.

Each of the transfer transistor 331 and the OFG transistor 332 of the light reception unit 830 may be including an NMOS transistor, for example. Similarly, each of the reset transistor 321, the amplification transistor 322, and the selection transistor 323 of the pixel signal generation unit 320 may be including an NMOS transistor, for example.

The transfer transistor 331 transfers a charge generated in the photoelectric conversion element 333 to the floating diffusion layer 324 in accordance with a control signal TRG from the driving circuit 211. The OFG transistor 332 supplies an electric signal (photocurrent) based on the charge generated in the photoelectric conversion element 333 to the address event detection unit 400 in accordance with a control signal OFG from the driving circuit 211.

The floating diffusion layer 324 accumulates the charge transferred from the photoelectric conversion element 333 via the transfer transistor 331. The reset transistor 321 discharges (initializes) the charges accumulated in the floating diffusion layer 324 in accordance with a reset signal from the driving circuit 211. The amplification transistor 322 fetches, in the vertical signal line VSL, a pixel signal indicating a voltage value corresponding to a charge amount of charges accumulated in the floating diffusion layer 324. The selection transistor 323 switches connection between the amplification transistor 322 and the vertical signal line VSL in accordance with a selection signal SEL from the driving circuit 211. Note that the analog pixel signal fetched in the vertical signal line VSL is read by the column ADC 220 and converted into a digital pixel signal.

In response to an instruction of an address event detection start by the control unit 130, the driving circuit 211 of the logic circuit 210 outputs a control signal OFG for turning on the OFG transistors 332 of all of the light reception units 830 included in the pixel array unit 300. As a result, a photocurrent generated in the corresponding photoelectric conversion element 333 of the light reception unit 830 is supplied via the OFG transistor 332 to the address event detection unit 400 of each of the unit pixels 810.

At the time of detection of address event firing based on the photocurrent from the light reception unit 830, the address event detection unit 400 of each of the unit pixels 810 outputs a request to the arbiter 213. In response to the request, the arbiter 213 arbitrates the requests from the respective unit pixels 810, and transmits, on the basis of a result of this arbitration, a predetermined response to each of the unit pixels 810 having issued the requests. Each of the unit pixels 810 having received this request supplies a detection signal indicating the presence or absence of address event firing to the driving circuit 211 and the signal processing unit 212 of the logic circuit 210.

The driving circuit 211 brings the OFG transistor 332 of the unit pixel 810 as a supplier of the detection signal into an off-state. As a result, supply of the photocurrent from the light reception unit 830 to the address event detection unit 400 in the unit pixel 810 stops.

Subsequently, the driving circuit 211 brings the transfer transistor 331 in the light reception unit 830 of the unit pixel 810 into an on-state in accordance with a control signal TRG. As a result, a charge generated in the photoelectric conversion element 333 of the light reception unit 830 is transferred to the floating diffusion layer 324 via the transfer transistor 331. Thereafter, a pixel signal indicating a voltage value corresponding to a charge amount of charges accumulated in the floating diffusion layer 324 is fetched in the vertical signal line VSL connected to the selection transistor 323 of the pixel signal generation unit 320.

As described above, the solid-state imaging device 200 outputs a pixel signal from the unit pixel 810 corresponding to detected address event firing to the column ADC 220.

According to such a configuration, the upper layer pixel circuit 500 disposed on the second chip 201b may include the LG transistor 411 and the amplification transistor 412 (or the LG transistors 411 and 413 and the amplification transistors 412 and 414) in the current voltage conversion unit 410 of the address event detection unit 400 similarly to the embodiments described above. Also, in the present embodiment, for example, the upper layer pixel circuit 500 may further include the reset transistor 321, the amplification transistor 322, and the selection transistor 323 constituting the pixel signal generation unit 320. Note that the floating diffusion layer 324 is including wiring extending from the cathode of the photoelectric conversion element 333 via the connection portion 801 to the source of the reset transistor 321 and the gate of the amplification transistor 322. In addition, in the following description, the transistors of the current voltage conversion unit 410 (LG transistor 411 and amplification transistor 412 or LG transistors 411 and 413 and amplification transistors 412 and 414) included in the upper layer pixel circuit 500 will be referred to as an upper layer detection circuit 410A.

9.3 Operation Example of Solid-State Imaging Device

An operation of the solid-state imaging device 800 according to the present embodiment will next be described with reference to the drawings.

9.3.1 Timing Chart

Figure 40:
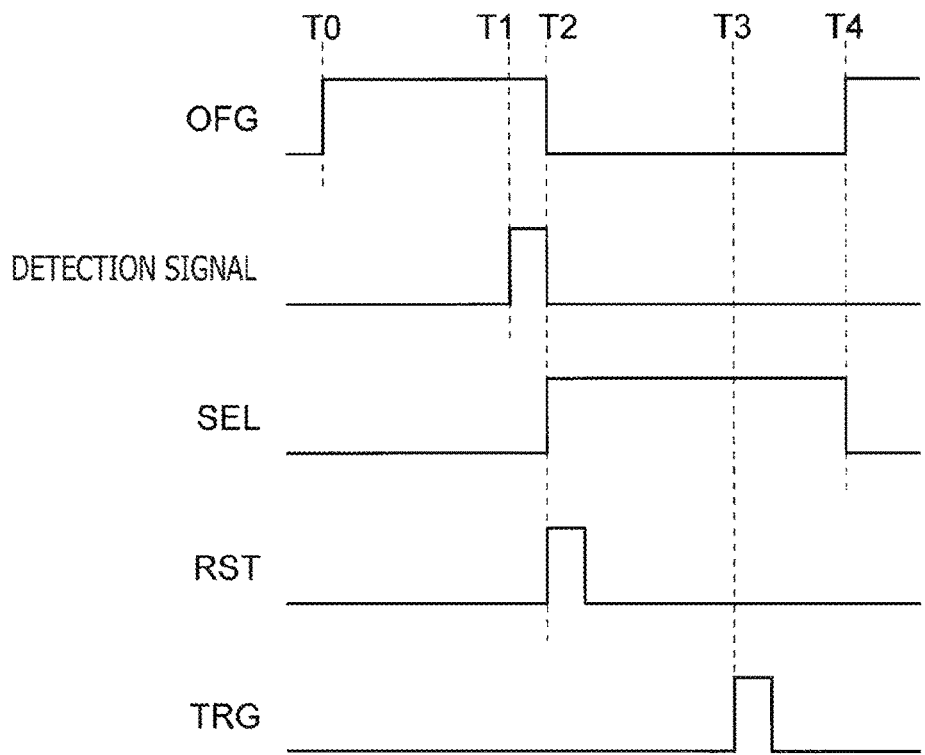
FIG. 40 is a timing chart presenting an example of an operation of the solid-state imaging device according to the eighth embodiment.

An example of the operation of the solid-state imaging device 800 will be first described with reference to a timing chart. FIG. 40 is a timing chart presenting an example of the operation of the solid-state imaging device according to the present embodiment.

As presented in FIG. 40, when a detection start of an address event is instructed by the control unit 130 at a timing T0, the driving circuit 211 raises a control signal OFG applied to the gates of the OFG transistors 332 of all of the light reception units 830 in the pixel array unit 300 to a high level. As a result, the OFG transistors 332 of all of the light reception units 830 are brought into an on-state, and photocurrents based on charges generated in the photoelectric conversion elements 333 of the respective light reception units 830 are supplied from the respective light reception units 830 to the respective address event detection units 400.

In addition, during a high-level period of the control signal OFG, all control signals TRG applied to the gates of the transfer transistors 331 in the respective light reception units 830 are maintained at a low level. Accordingly, the transfer transistors 331 of all of the light reception units 830 are in an off-state during this period.

Assumed next is such a case where the address event detection unit 400 of one of the unit pixels 810 detects address event firing during the high-level period of the control signal OFG. In this case, the address event detection unit 400 having detected address event firing transmits a request to the arbiter 213. In response to this request, the arbiter 213 arbitrates the request, and then returns a response to the request to the address event detection unit 400 having issued the request.

The address event detection unit 400 having received the response raises a detection signal input to the driving circuit 211 and the signal processing unit 212 to a high level during a period of timings T1 to T2, for example. It is assumed in the present explanation that the detection signal is a one-bit signal indicating a result of on-event detection.

The driving circuit 211 having received the high-level detection signal from the address event detection unit 400 at the timing T1 lowers all of the control signals OFG to a low level at the next timing T2. As a result, supply of the photocurrents from all of the light reception units 830 of the pixel array unit 300 to the address event detection unit 400 stops.

Moreover, the driving circuit 211 raises a selection signal SEL applied to the gate of the selection transistor 323 of the pixel signal generation unit 320 in the unit pixel 810 corresponding to detected address event firing (hereinafter referred to as a readout target unit pixel) to a high level at the timing T2, and also raises a reset signal RST applied to the gate of the reset transistor 321 of the same pixel signal generation unit 320 to a high level for a fixed pulse period. As a result, charges accumulated in the floating diffusion layer 324 of the pixel signal generation unit 320 are discharged, and the floating diffusion layer 324 is reset (initialized). In this manner, a voltage fetched in the vertical signal line VSL in an initialized state of the floating diffusion layer 324 is read by the ADC 230 included in the column ADC 220 and connected to the vertical signal VSL as a pixel signal of a reset level (hereinafter simply referred to as a reset level), and converted into a digital signal.

At a timing T3 after the readout of the reset level, the driving circuit 211 subsequently applies a control signal TRG for a fixed pulse period to the gate of the transfer transistor 331 of the light reception unit 830 in the readout target unit pixel 810. As a result, the charge generated in the photoelectric conversion element 333 of the light reception unit 830 is transferred to the floating diffusion layer 324 of the pixel signal generation unit 320, and a voltage corresponding to the charges accumulated in the floating diffusion layer 324 is fetched in the vertical signal line VSL. In this manner, the voltage fetched in the vertical signal line VSL is read by the ADC 230 included in the column ADC 220 and connected to the vertical signal VSL as a pixel signal of a signal level (hereinafter simply referred to as a signal level) of the light reception unit 830, and converted into a digital value.

The signal processing unit 212 executes CDS processing for obtaining a difference between the reset level and the signal level read in the foregoing manner as a net pixel signal corresponding to a light reception amount of the photoelectric conversion element 333.

Thereafter, the driving circuit 211 lowers a selection signal SEL applied to the gate of the selection transistor 323 of the pixel signal generation unit 320 of the readout target unit pixel 810 to a low level at a timing T4, and also raises a control signal OFG applied to the gates of the OFG transistors 332 of all of the light reception units 830 to a high level. As a result, detection of address event firing for all of the light reception unit 830 restarts.

9.3.2 Flowchart

Figure 41:
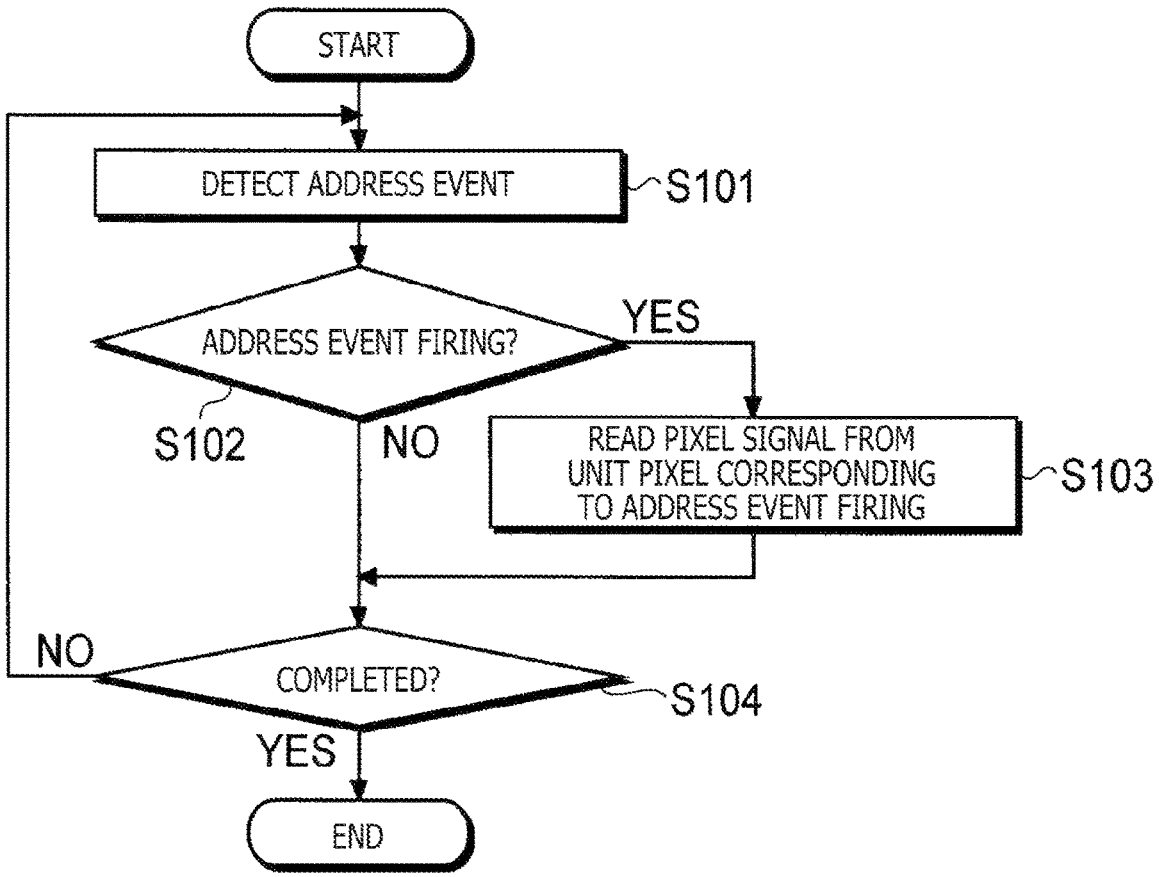
FIG. 41 is a flowchart presenting an example of the operation of the solid-state imaging device according to the eighth embodiment.

An example of the operation of the solid-state imaging device 800 will next be described with reference to a flowchart. FIG. 41 is a flowchart presenting an example of the operation of the solid-state imaging device according to the present embodiment. This operation starts when a predetermined application for detecting an address event is executed, for example.

As depicted in FIG. 10, each of the unit pixels 810 in the pixel array unit 300 first detects the presence or absence of address event firing in the present operation (step S101).

Then, the driving circuit 211 determines whether or not address event firing has been detected in any one of the unit pixels 810 (step S102).

In a case where address event firing is not detected (NO in step S102), the present operation proceeds to step S104. On the other hand, in a case where address event firing is detected (YES in step S102), the driving circuit 211 reads a pixel signal from the unit pixel 810 corresponding to the detected address event firing (step S103), and the flow proceeds to step S104.

In step S104, whether or not to end the present operation is determined. In a case where the present operation is not to be ended (NO in step S104), the present operation returns to step S101, and this step and the following steps are repeated. On the other hand, in a case where the present operation is to be ended (YES in step S104), the present operation ends.

9.4 Cross-Sectional Structure Example of Solid-State Imaging Device

Figure 42:
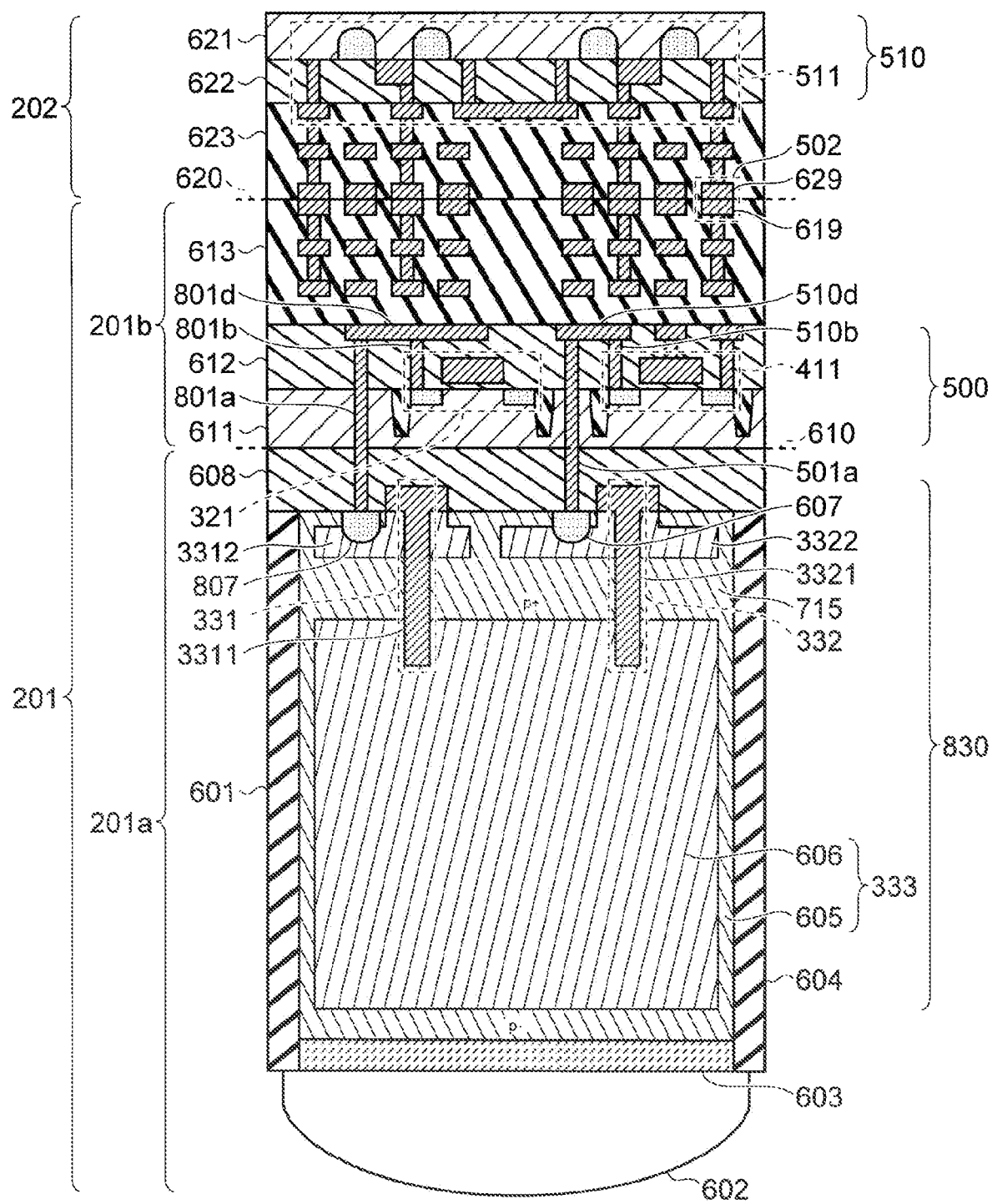
FIG. 42 is a cross-sectional diagram depicting a cross-sectional structure example of the solid-state imaging device according to the eighth embodiment.

FIG. 42 is a cross-sectional diagram depicting a cross-sectional structure example of the solid-state imaging device according to the present embodiment. Note that FIG. 42 depicts a cross-sectional configuration example of the solid-state imaging device 800 taken along a plane vertical to a light entrance surface (light reception surface) similarly to FIG. 30, for example.

As depicted in FIG. 42, for example, the solid-state imaging device 800 includes the transfer transistor 331 disposed on the semiconductor substrate 601 of the first chip 201a in a stacking structure and a cross-sectional structure similar to those of the solid-state imaging device 200 depicted in FIG. 29 by way of example.

According to the present embodiment, therefore, the semiconductor substrate 601 includes a gate 3311 of the transfer transistor 331, an n-type semiconductor region 3312 as a drain of the transfer transistor 331, and a contact layer 807 for extracting a charge generated in the photoelectric conversion element 333 via the transfer transistor 331. Electric separation is made between the n-type semiconductor region 606 and the n-type semiconductor region 3312 by the p-type semiconductor region 715, for example, similarly to the electric separation between the n-type semiconductor region 606 and the n-type semiconductor region 3322.

For example, the contact layer 807 is electrically connected to the source of the reset transistor 321 via a TSV 801a penetrating from the upper surface of the interlayer dielectric 612 via the semiconductor substrate 611 and the interlayer dielectric 608 to the contact layer 807 formed on the semiconductor substrate 601, a TSV 801b penetrating from the upper surface of the interlayer dielectric 612 to the source of the reset transistor 321, and wiring 801d electrically connecting the TSVs 801a and 501b on the upper surface side of the interlayer dielectric 612. Also, the contact layer 807 is connected to the gate (not depicted) of the amplification transistor 322 via a not-depicted TSV 801c penetrating from the upper surface of the interlayer dielectric 612 to the gate of the amplification transistor 412 and the wiring 801d. The TSVs 801a, 801b, and 801c, and wiring 801d constitute the connection portion 801 in FIG. 39.

The gate 3311 of the transfer transistor 331 reaches a middle of the n-type semiconductor region 606 from the n-type semiconductor region 3312 via the p-type semiconductor region 715. Accordingly, charges accumulated in the n-type semiconductor region 606 of the photoelectric conversion element 333 start to flow into the second chip 201b via the transfer transistor 331 and the TSV 801a in accordance with a high-level control signal TRG applied to the gate 3311.

9.5 Floor Map Example

Examples of floor maps of the first chip 201a and the second chip 201b according to the present embodiment will next be described.

9.5.1 First Chip

Figure 43:
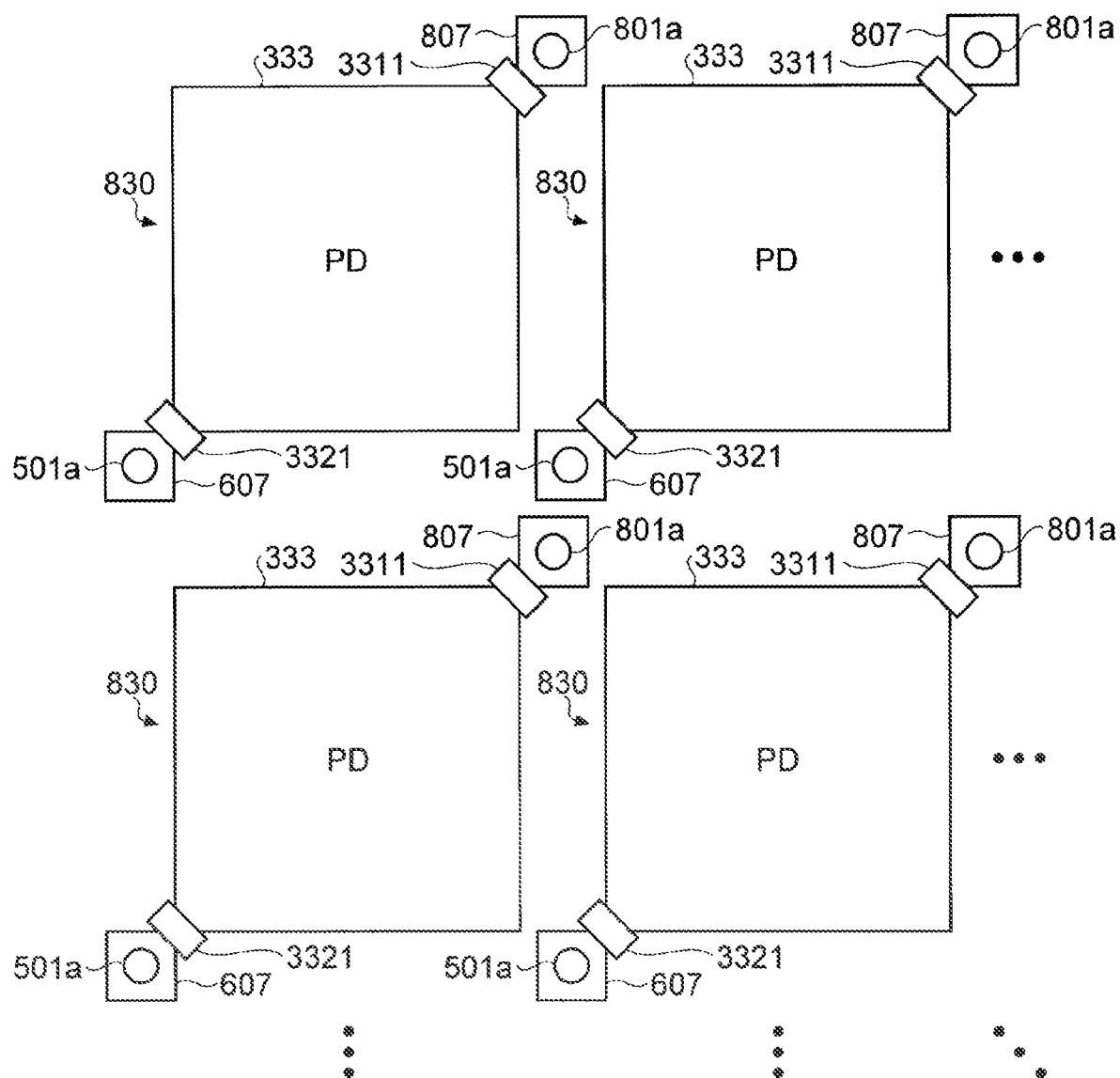
FIG. 43 is a plan diagram depicting a floor map example of a first chip according to the eighth embodiment.

FIG. 43 is a plan diagram depicting a floor map example of the first chip according to the present embodiment. As depicted in FIG. 43, according to the floor map example of the first chip 201a of the present embodiment, the gate 3311 of the transfer transistor 331 and the contact layer 807 are disposed at a corner diagonal to a corner where the gate 3321 of the OFG transistor 332 and the contact layer 607 are disposed with respect to the photoelectric conversion element 333 in a layout similar to that of the floor map example depicted in FIG. 31.

9.5.2 Second Chip

Figure 44:
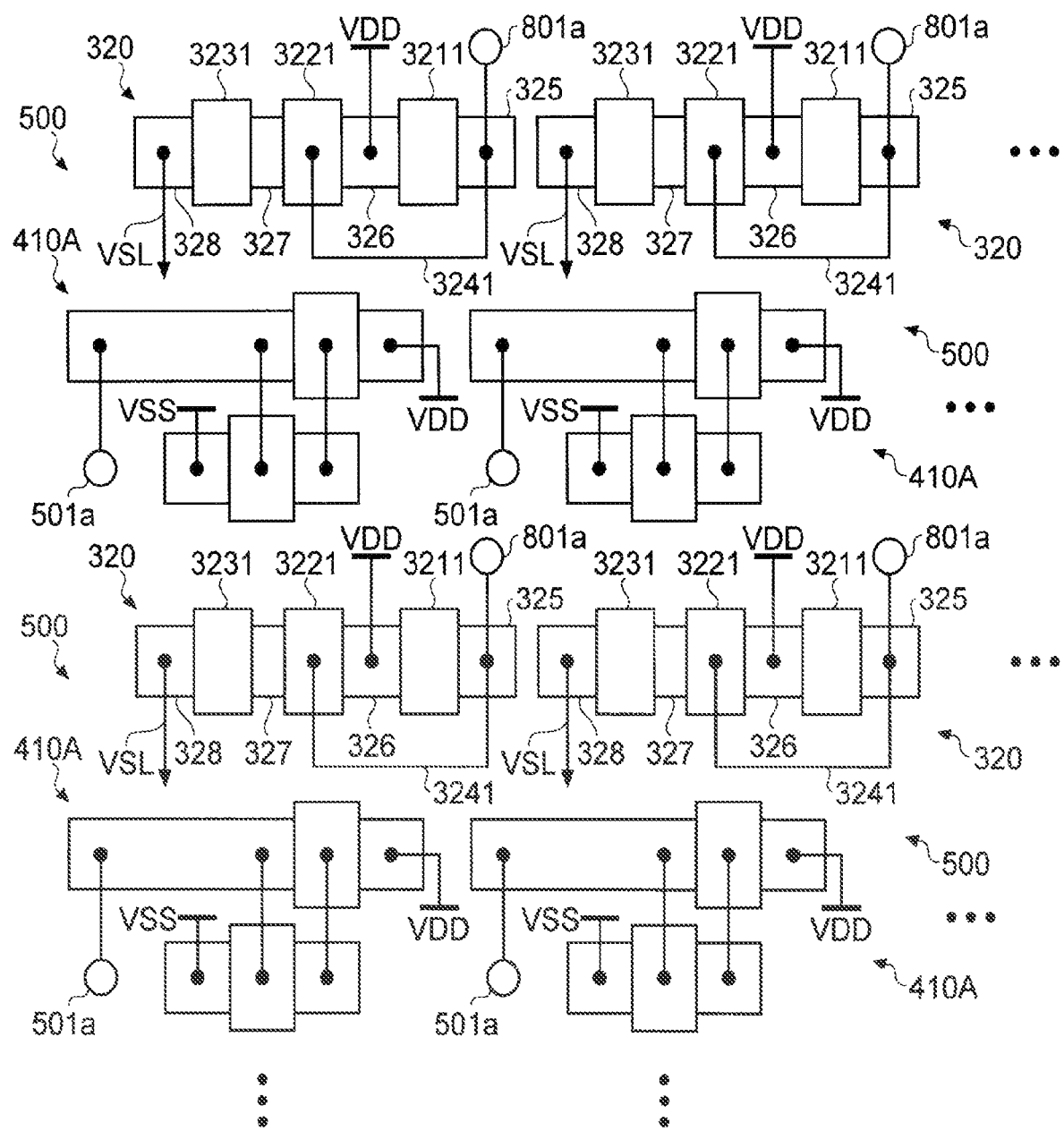
FIG. 44 is a plan diagram depicting a floor map example of a second chip according to the eighth embodiment.

FIG. 44 is a plan diagram depicting a floor map example of the second chip according to the present embodiment. While FIG. 44 depicts an example of the current voltage conversion unit 410 of the source-follower type (see FIG. 4), other types may be adopted. For example, the current voltage conversion unit 410 is similarly applicable to the gain-boost type (see FIG. 6).

As depicted in FIG. 44, the second chip 201b includes the upper layer pixel circuits 500 arranged in a two-dimensional grid shape. The upper layer pixel circuit 500 includes an upper layer detection circuit 410A including the LG transistor 411 and the amplification transistor 412, and the pixel signal generation unit 320 including the reset transistor 321, the amplification transistor 322, the selection transistor 323, and the floating diffusion layer 324. For example, each of the upper layer pixel circuits 500 is formed in a region substantially equivalent to the region of each of the photoelectric conversion elements 333 provided on the first chip 201a. Note that the upper layer detection circuit 410A may be similar to the upper layer pixel circuit 500 in the embodiments described above.

For example, the reset transistor 321 in each of the pixel signal generation units 320 includes a gate 3211, a diffusion region 325 formed on the source side with respect to the gate 3211, and a diffusion region 326 formed on the drain side with respect to the gate 3211. For example, the diffusion region 325 on the source side is connected to the TSV 801a constituting the connection portion 801. The diffusion region 326 on the drain side is connected to the power source voltage VDD.

For example, the amplification transistor 322 includes a gate 3221 and a diffusion region 327 formed on the drain side with respect to the gate 3221. The diffusion region 326 on the source side with respect to the gate 3221 is shared by the reset transistor 321. The gate 3221 is connected to the diffusion region 325 on the source side of the reset transistor 321, and to the TSV 801a. Wiring 3241 connecting the gate 3221 with the diffusion region 325 of the reset transistor 321 and the TSV 801a functions as the floating diffusion layer 324.

For example, the selection transistor 323 includes a gate 3231 and a diffusion region 328 formed on the drain side with respect to the gate 3231. The diffusion region 327 on the source side with respect to the gate 3231 is shared by the amplification transistor 322. The vertical signal line VSL is connected to the diffusion region 328 on the drain side.

9.6 Operation and Effect

As described above, even in the case where the pixel signal generation unit 320 for reading a pixel signal from the unit pixel 810 is provided in addition to the address event detection unit 400 for detecting address event firing, a flow of a dark current into each of the transistors constituting the pixel signal generation unit 320 from the photoelectric conversion element 333 can be reduced by providing the pixel signal generation unit 320 on the second chip 201b or a chip in a layer lower than the second chip 201b. Accordingly, reduction of deterioration of DVS noise characteristics is achievable.

Note that a case based on the solid-state imaging device 200 according to the fourth embodiment is presented in the present embodiment by way of example. However, the present embodiment is not limited to this example, but may be a case based on the solid-state imaging device 200 according to the other embodiments, such as the solid-state imaging device 200 according to the first embodiment.

In addition, other configurations, operations, and effects may be similar to those of the above embodiments, and are therefore not described in detail herein.

10. Ninth Embodiment

A solid-state imaging device and an imaging device according to a ninth embodiment will next be described in detail with reference to the drawings.

Figure 45:
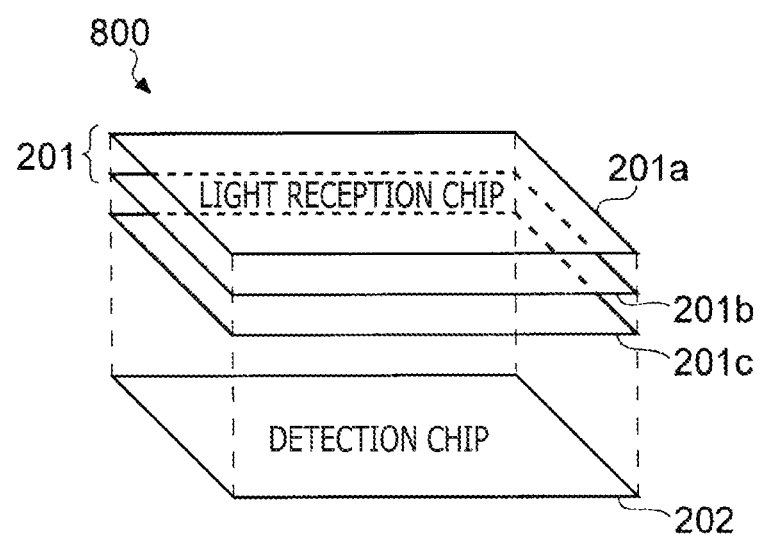
FIG. 45 is a diagram depicting a stacking structure example of a solid-state imaging device according to a ninth embodiment.
Figure 46:
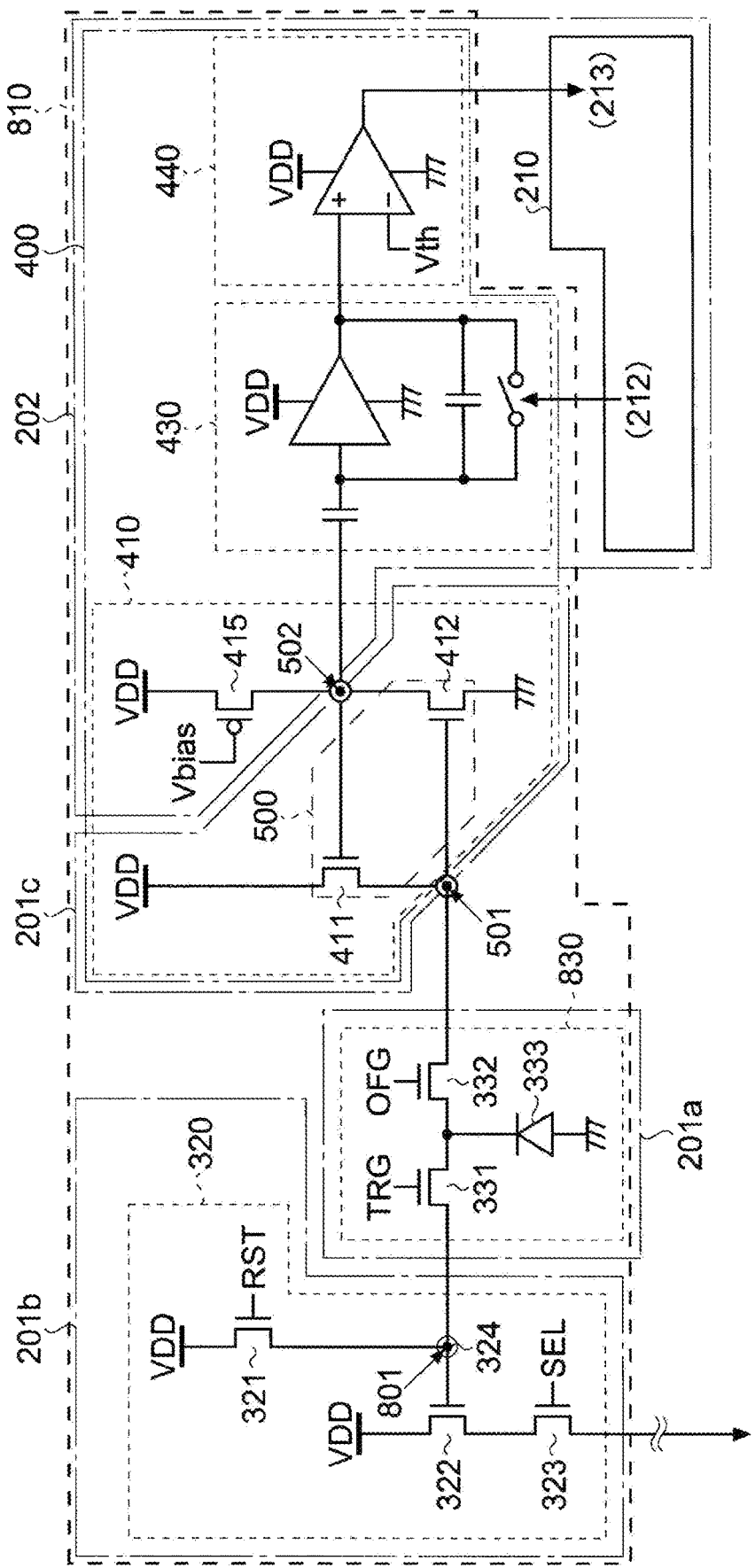
FIG. 46 is a circuit diagram depicting a schematic configuration example of a unit pixel according to the ninth embodiment.

While the case where the pixel signal generation unit 320 is disposed on the second chip 201b has been presented in the eighth embodiment described above, the layer where the pixel signal generation unit 320 is disposed is not limited to the second chip 201b. For example, a third chip 201c may be added to the light reception chip 201 as depicted in FIG. 45, and the pixel signal generation unit 320 can be disposed on the third chip 201c as depicted in FIG. 46.

10.1 Cross-Sectional Structure Example of Solid-State Imaging Device

Figure 47:
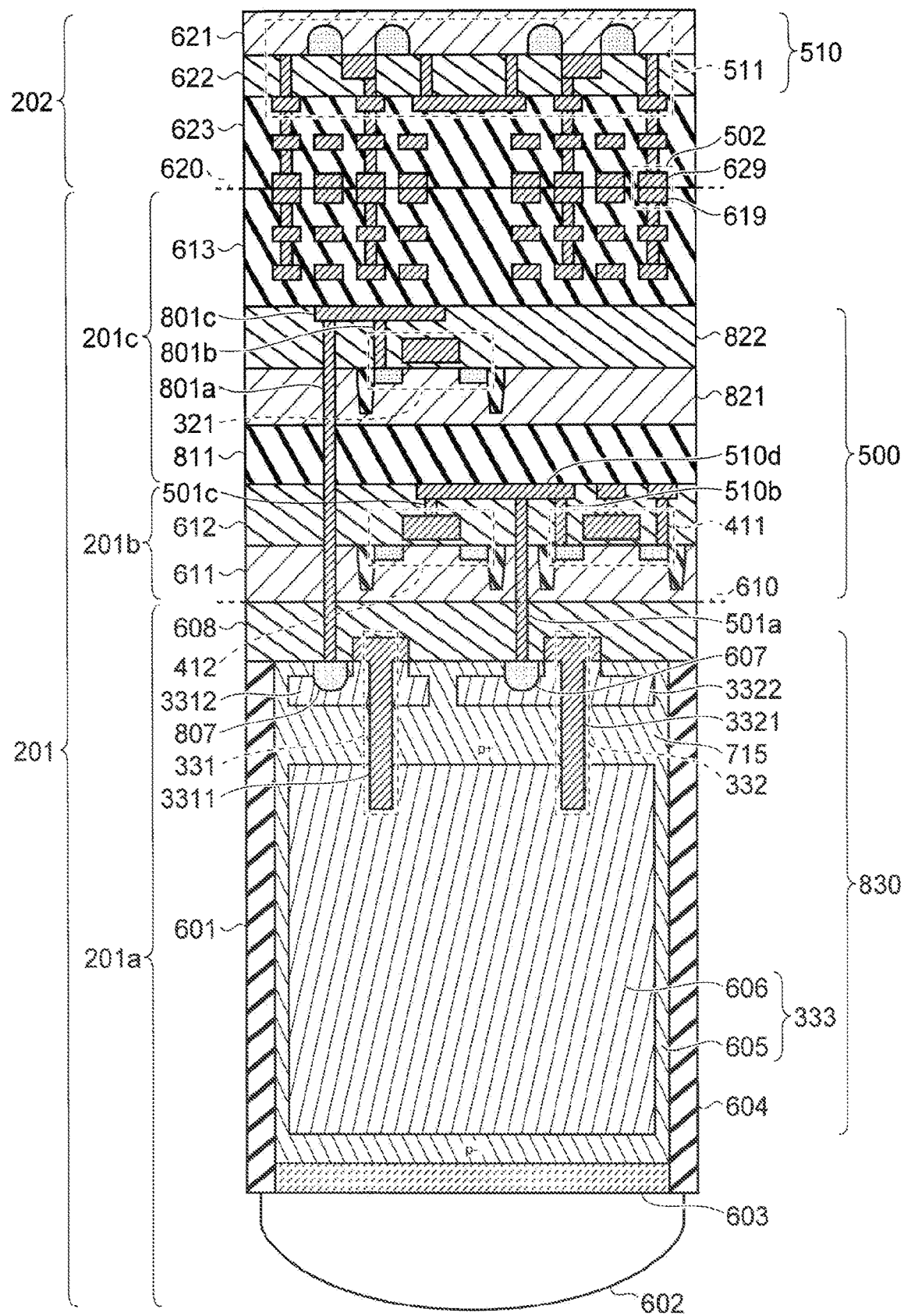
FIG. 47 is a cross-sectional diagram depicting a cross-sectional structure example of the solid-state imaging device according to the ninth embodiment.

FIG. 47 is a cross-sectional diagram depicting a cross-sectional structure example of the solid-state imaging device according to the present embodiment. Note that FIG. 47 depicts a cross-sectional structure example of the solid-state imaging device 800 taken along a plane vertical to a light entrance surface (light reception surface) similarly to FIG. 42, for example.

As depicted in FIG. 47, for example, the solid-state imaging device 800 according to the present embodiment includes a third chip including a semiconductor substrate 821, an interlayer dielectric 822, the wiring layer 613, and an interlayer insulation film 811 and disposed between the second chip 201b and the detection chip 202 in a cross-sectional structure similar to that of the solid-state imaging device 800 described in the eighth embodiment with reference to FIG. 42.

According to such a layer structure, the pixel signal generation unit 320 (e.g., the reset transistor 321) is provided on the semiconductor substrate 821. Moreover, the TSV 801a in the connection portion 801 connecting the source of the reset transistor 321 and the gate of the amplification transistor 322 with the drain of the transfer transistor 331 penetrates from the upper surface of the interlayer dielectric 822 via the semiconductor substrate 821, the interlayer insulation film 811, the semiconductor substrate 611, and the interlayer dielectric 608 to the contact layer 807 formed on the semiconductor substrate 601, to connect to the contact layer 807.

Note that the interlayer insulation film 811 between the second chip 201b and the third chip 201c is not required to be disposed on the third chip 201c side, but may be disposed on the second chip 201b side.

10.2 Operation and Effect

As described above, an area allocated to each of the transistors constituting the upper layer pixel circuit 500 is allowed to increase by increasing the chip (e.g., the third chip 201c) on which the upper layer pixel circuit 500 is disposed. In this manner, a sufficient area can be secured for each of the transistors constituting the upper layer pixel circuit 500. Accordingly, further reduction of deterioration of DVS noise characteristics is achievable by reduction of deterioration of noise characteristics of each of the transistors.

Note that a case based on the solid-state imaging device 800 according to the eighth embodiment is presented in the present embodiment by way of example. However, the present embodiment is not limited to this example, but can be a case based on the solid-state imaging device 200 according to the other embodiments, such as the solid-state imaging device 200 according to the first embodiment.

In addition, other configurations, operations, and effects may be similar to those of the above embodiments, and are therefore not described in detail herein.

11. Tenth Embodiment

A solid-state imaging device and an imaging device according to a tenth embodiment will next be described in detail with reference to the drawings.

As described above, the plurality of unit pixels of the pixel array unit 300 may be grouped into a plurality of pixel blocks each including a predetermined number of unit pixels. Accordingly, a case where the plurality of unit pixels of the pixel array unit 300 is grouped into a plurality of pixel blocks will be described in detail in the present embodiment with reference to the drawings. Note that a case based on the solid-state imaging device 800 according to the eighth embodiment will be hereinafter presented. However, the present embodiment is not limited to this example, but may be a case based on the solid-state imaging device 200 according to the other embodiments, such as the solid-state imaging device 200 according to the first embodiment.

11.1 Configuration Example of Pixel Array Unit

Figure 48:
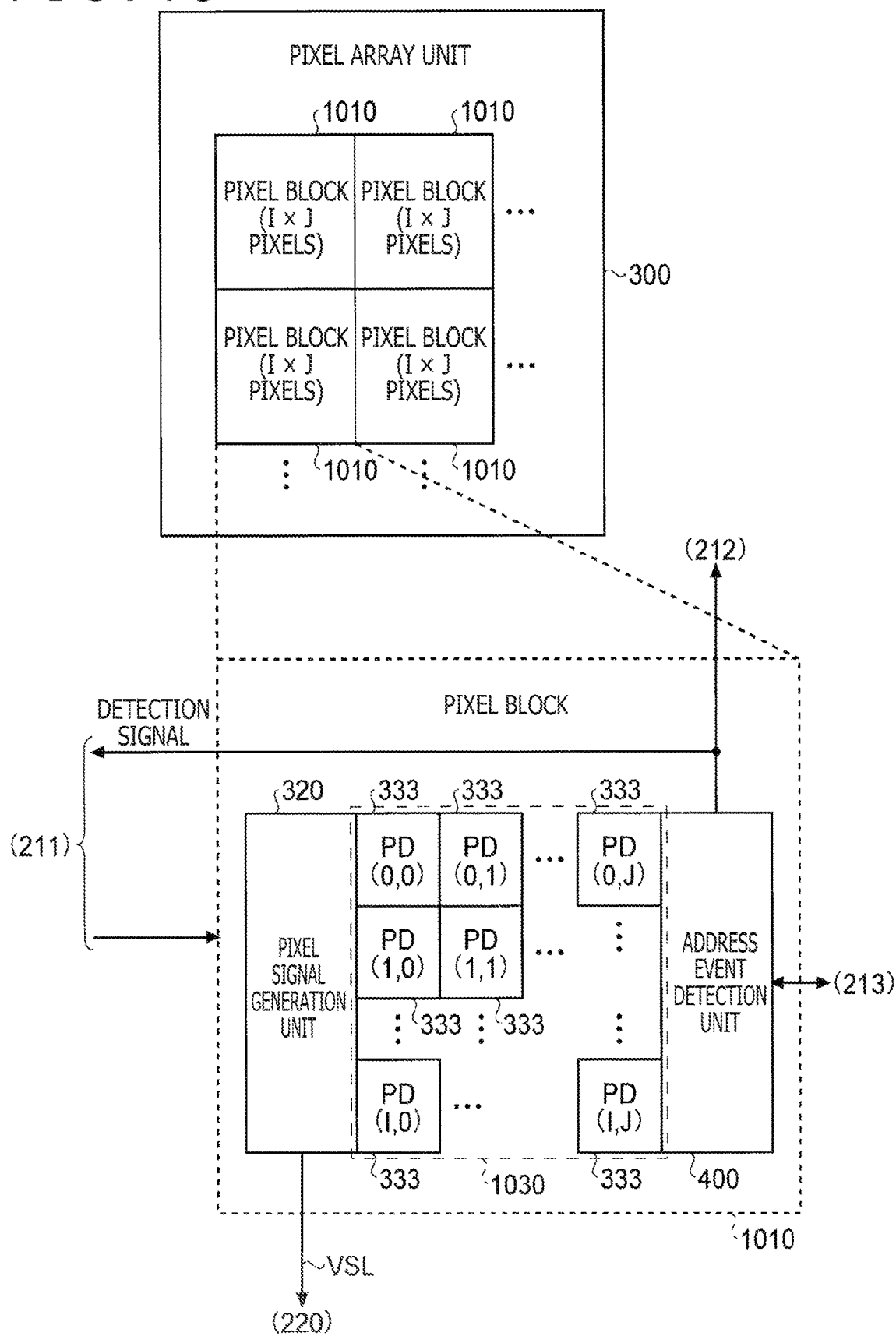
FIG. 48 is a block diagram depicting a schematic configuration example of a pixel array unit according to a tenth embodiment.

FIG. 48 is a block diagram depicting a schematic configuration example of a pixel array unit according to the present embodiment. As described above, a plurality of unit pixels in the present embodiment is grouped into a plurality of pixel blocks 1010. Accordingly, as depicted in FIG. 48, the plurality of the photoelectric conversion elements 333 of the pixel array unit 300 in the present embodiment is grouped into the plurality of the pixel blocks 1010. Each of the pixel blocks 1010 includes the plurality of the photoelectric conversion elements 333 arranged in I rows×J columns (I and J: positive integers). Accordingly, each of the pixel blocks 1010 is including a plurality of unit pixels arranged in a plurality of I rows×J columns (I and J: positive integers).

Each of the pixel blocks 1010 includes the pixel signal generation unit 320 and the address event detection unit 400 in addition to the plurality of the photoelectric conversion elements 333 arranged in I rows×J columns. The pixel signal generation unit 320 and the address event detection unit 400 are shared by the plurality of the photoelectric conversion elements 333 in each of the pixel blocks 1010. In other words, each of the unit pixels in the same pixel block 1010 includes the one photoelectric conversion element 333, and the pixel signal generation unit 320 and the address event detection unit 400 which are shared units. Coordinates of each of the unit pixels are defined according to coordinates of the photoelectric conversion elements 333 arranged in a two-dimensional grid shape on the light reception surface of the solid-state imaging device 800.

The one vertical signal line VSL is wired in one column of the pixel block 1010. Accordingly, assuming that the number of columns of the pixel block 1010 is m (m: a positive integer), the m vertical signal lines VSL are arranged in the pixel array unit 300.

The pixel signal generation unit 320 generates, as a pixel signal, a signal indicating a voltage value corresponding to a charge amount of a photocurrent supplied from each of the photoelectric conversion elements 333. The pixel signal generation unit 320 supplies the generated pixel signal to the column ADC 220 via the vertical signal line VSL.

The address event detection unit 400 detects the presence or absence of address event firing on the basis of whether or not the current value of the photocurrent supplied from each of the photoelectric conversion elements 333 in the same pixel block 1010, or a change amount of the current value has exceeded a predetermined threshold. For example, this address event may include an on-event indicating that the change amount has exceeded an upper limit threshold and an off-event indicating that the change amount is smaller than a lower limit threshold. Moreover, for example, a detection signal of the address event may include one bit indicating a detection result of an on-event and one bit indicating a detection result of an off-event. Note that the address event detection unit 400 may be configured to detect either an on-event or an off-event.

At the time of address event firing, the address event detection unit 400 supplies a request for transmission of a detection signal to the arbiter 213. Thereafter, when receiving a response to the request from the arbiter 213, the address event detection unit 400 supplies the detection signal to the driving circuit 211 and the signal processing unit 212.

The driving circuit 211 having received the supply of the detection signal executes readout from each of the unit pixels belonging to the pixel block 1010 which includes the address event detection unit 400 having supplied the detection signal. In response to this readout, a pixel signal having an analog value is sequentially input from each of the unit pixels in the pixel block 1010 corresponding to the readout target to the column ADC 220.

11.2 Example of Pixel Block

In a configuration depicted in FIG. 48, for example, the pixel block 1010 is including a combination of the photoelectric conversion elements 333 for receiving wavelength components necessary for reconstituting colors. In a case where colors are reconfigured on the basis of RGB three primary colors, for example, the one pixel block 1010 is including a combination of the photoelectric conversion element 333 for receiving light in red (R) color, the photoelectric conversion element 333 for receiving light in green (G) color, and the photoelectric conversion element 333 for receiving light in blue (B) color.

According to the present embodiment, therefore, the plurality of the photoelectric conversion elements 333 arranged in the two-dimensional grip shape in the pixel array unit 300 is grouped into the plurality of the pixel blocks 1010 on the basis of an array of wavelength selection elements (e.g., color filters) provided for each of the photoelectric conversion elements 333 (hereinafter referred to as a color filter array), for example.

There exist various types of the color filter array such as a 2×2 pixel Bayer array, a 3×3 pixel color filter array adopted for X-Trans (registered trademark) CMOS sensor (hereinafter referred to as an X-Trans (registered trademark) type array), a 4×4 pixel Quad Bayer array (also called a Quadra array), and a 4×4 pixel color filter combining a Bayer array and a white RGB color filter (hereinafter referred to as a white RGB array).

Accordingly, several examples of the pixel block 1010 adopting a typical color filter array will be hereinafter described.

11.2.1 Bayer Array

Figure 49:
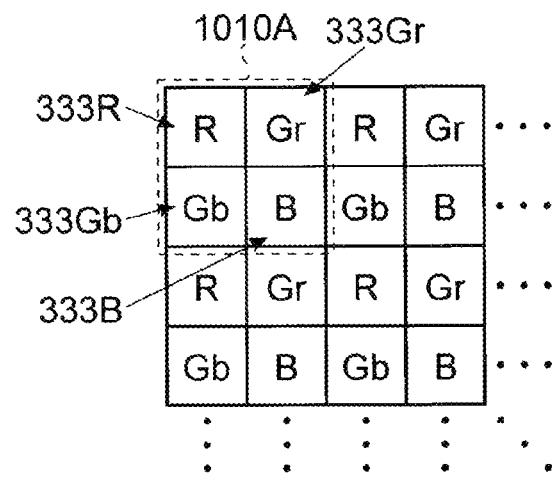
FIG. 49 is a schematic diagram depicting a configuration example of a pixel block adopting a Bayer array as a color filter array.

FIG. 49 is a schematic diagram depicting a configuration example of a pixel block adopting a Bayer array as a color filter array. In a case of adoption of a Bayer array as depicted in FIG. 49, one pixel block 1010A has a basic pattern (hereinafter also referred to as a unit pattern) including 2×2 units, i.e., four in total, of the photoelectric conversion elements 333 which are repetitive units in the Bayer array. Accordingly, for example, each of the pixel blocks 1010A in the present example includes a photoelectric conversion element 333R having a red (R) color filter, a photoelectric conversion element 333Gr having a green (Gr) color filter, a photoelectric conversion element 333Gb having a green (Gb) color filter, and a photoelectric conversion elements 333B having a blue (B) color filter.

11.2.2 X-Trans (Registered Trademark) Type Array

Figure 50:
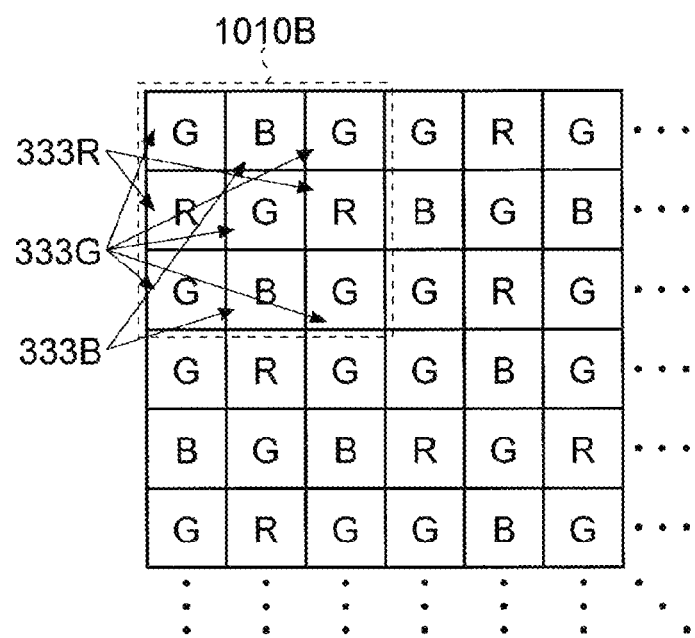
FIG. 50 is a schematic diagram depicting a configuration example of a pixel block adopting an X-Trans (registered trademark) type array as a color filter array.

FIG. 50 is a schematic diagram depicting a configuration example of a pixel block adopting an X-Trans (registered trademark) type array as a color filter array. As depicted in FIG. 50, one pixel block 1010B in the present example has a basic pattern (hereinafter similarly referred to as a unit pattern) including 3×3 pixels, i.e., nine in total, of the photoelectric conversion elements 333 which are repetitive units in the X-Trans (registered trademark) type array. Accordingly, for example, each of the pixel blocks 1010B in the present example includes five photoelectric conversion elements 333G each having a green (G) color filter arranged along two diagonal lines in a rectangular region forming the unit pattern, two photoelectric conversion elements 333R each having a red (R) color filter arranged point-symmetric with respect to a center axis corresponding to the photoelectric conversion element 333G located at the center of the rectangular region, and two photoelectric conversion elements 333B each having a blue (B) color filter similarly arranged point-symmetric with respect to the center axis corresponding to the photoelectric conversion element 333G located at the center of the rectangular region.

11.2.3 Quad Bayer Array

Figure 51:
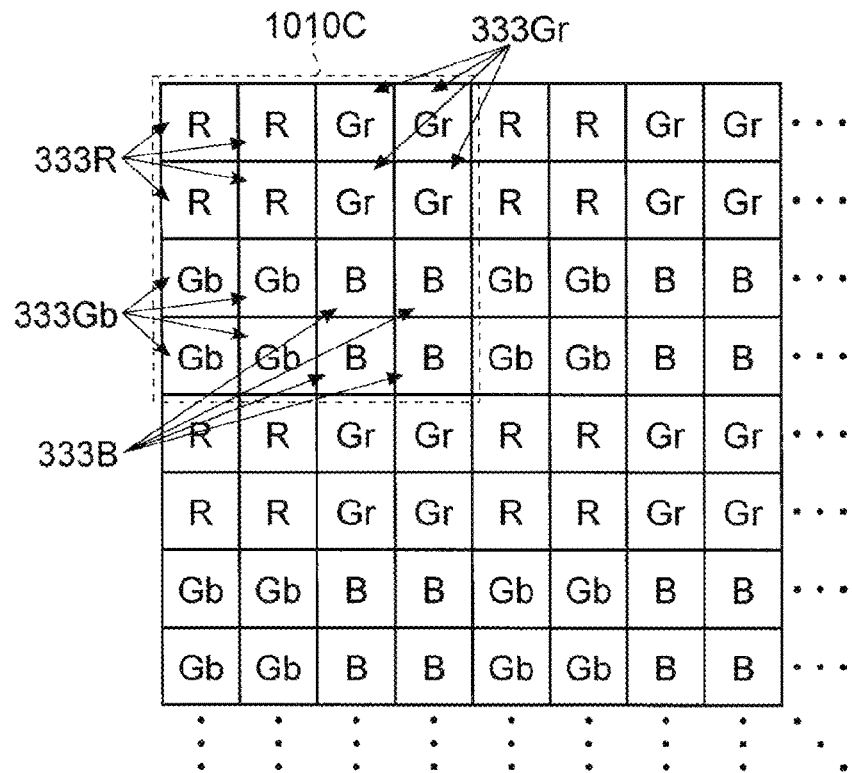
FIG. 51 is a schematic diagram depicting a configuration example of a pixel block adopting a Quad Bayer array as a color filter array.

FIG. 51 is a schematic diagram depicting a configuration example of a pixel block adopting a Quad Bayer array as a color filter array. In a case of adoption of a Bayer array as depicted in FIG. 51, one pixel block 1010C has a basic pattern (hereinafter similarly referred to as a unit pattern) including 4×4 units, i.e., 16 in total of the photoelectric conversion elements 333 which are repetitive units in the Quad Bayer array. Accordingly, for example, each of the pixel blocks 1010C in the present example includes 2×2, i.e., four in total, pixel photoelectric conversion elements 333R each having a red (R) color filter, 2×2, i.e., four in total, photoelectric conversion elements 333Gr each having a green (Gr) color filter, 2×2, i.e., four in total, photoelectric conversion elements 333Gb having a green (Gb) color filter, and 2×2, i.e., four in total, photoelectric conversion elements 333B each having a blue (B) color filter.

11.2.4 White RGB Array

Figure 52:
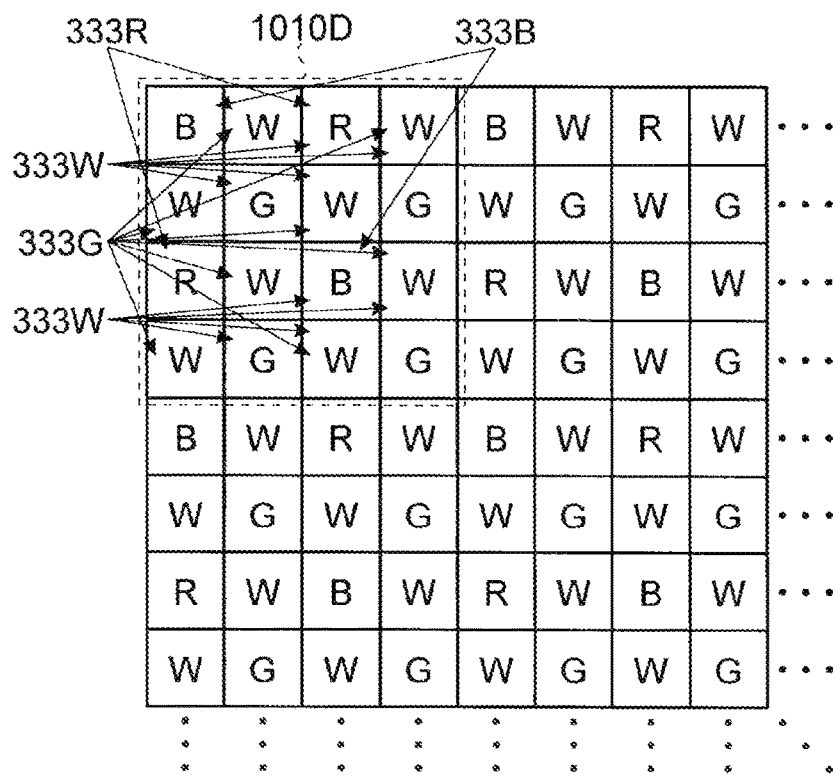
FIG. 52 is a schematic diagram depicting a configuration example of a pixel block adopting a white RGB array as a color filter array.

FIG. 52 is a schematic diagram depicting a configuration example of a pixel block adopting a white RGB array as a color filter array. In a case of adoption of a white RGB array as depicted in FIG. 52, one pixel block 1010D has a basic pattern (hereinafter similarly referred to as a unit pattern) including 4×4 units, i.e., 16 in total of the photoelectric conversion elements 333 which are repetitive units in the white RGB Bayer array. Accordingly, for example, each of the pixel blocks 1010D in the present example includes photoelectric conversion elements 333W each having a white RGB color filter for receiving respective wavelength components of lights in RGB three primary colors and disposed between photoelectric conversion elements 333R each having a red (R) color filter, photoelectric conversion elements 333G each having a green (G) color filter, and photoelectric conversion elements 333B each having a blue (B) color filter.

In a case of adoption of the white RGB array, note that image data indicating one frame read from the pixel array unit 300 can be converted into image data in a Bayer array by performing signal processing for pixel signals based on charges transferred from the respective photoelectric conversion elements 333R, 333G, 333B, and 333W using the signal processing unit 212, for example.

As described above, in a case where color filters are provided for the photoelectric conversion elements 333, a set of the photoelectric conversion elements 333 constituting a repetitive unit pattern in the color filter array can be used as a combination of the photoelectric conversion elements 333 for receiving wavelength components of light necessary for reconstituting colors.

However, this configuration is not required to be adopted. The one pixel block 1010 may be including a plurality of unit patterns. In addition, unit patterns are not required to be adopted. The plurality of the photoelectric conversion elements 333 in the pixel array unit 300 may be grouped into a plurality of the pixel blocks 1010 such that each of the pixel blocks 1010 includes the photoelectric conversion elements 333 necessary for reconstituting colors.

Further, for example, in the case of the Quad Bayer array, the one pixel block 1010 may be including a photoelectric conversion element group in the same color in a unit pattern, or the one pixel block 1010 may be including the four in total of photoelectric conversion elements 333R, 333Gr, 333Gb, and 333B to include the photoelectric conversion elements 333 in the respective colors one for each.

11.3 Configuration Example of Pixel Block

Figure 53:
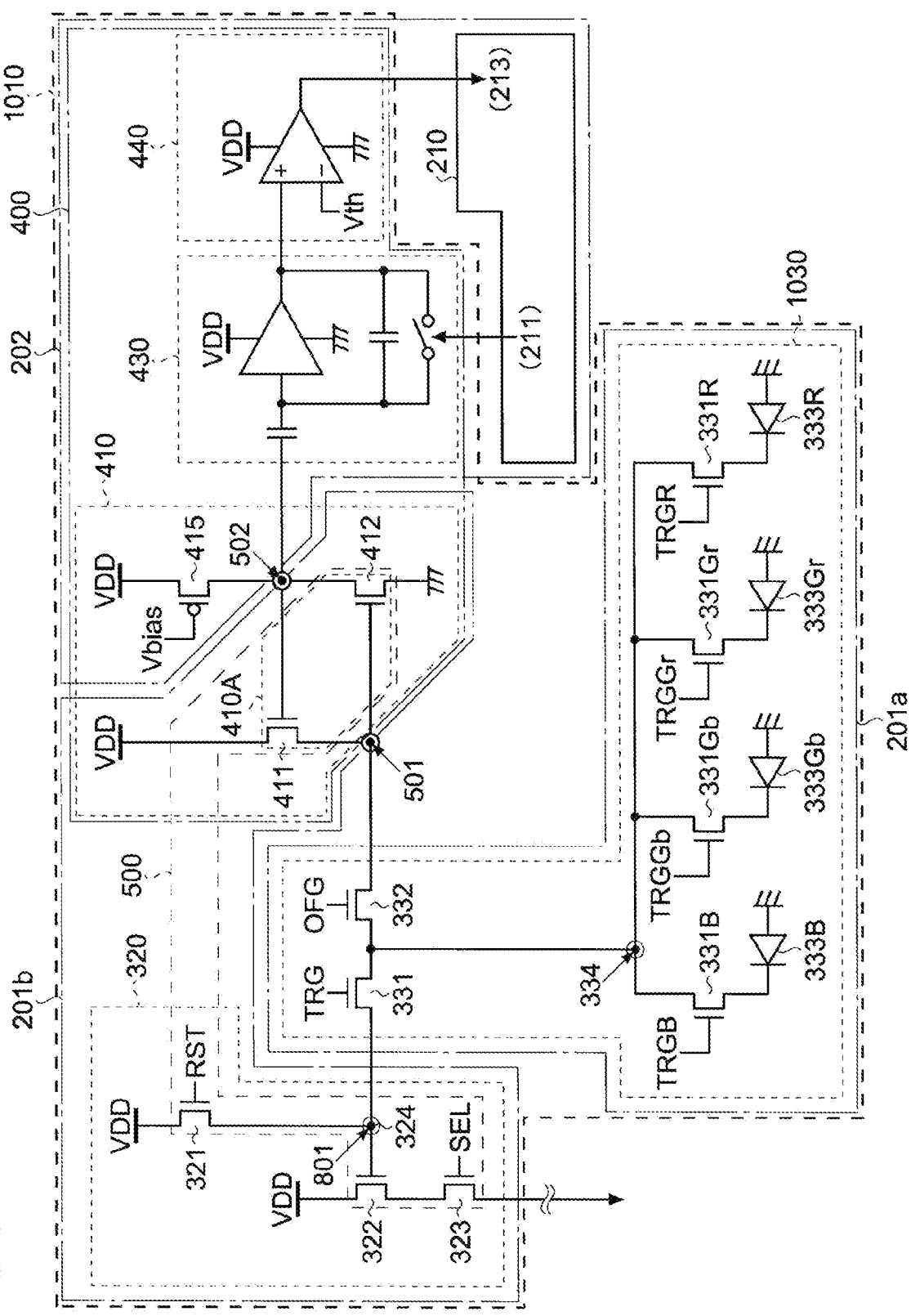
FIG. 53 is a circuit diagram depicting a schematic configuration example of the pixel block according to the tenth embodiment.

A configuration example of the pixel block 1010 will next be described. FIG. 53 is a circuit diagram depicting a schematic configuration example of the pixel block according to the tenth embodiment. As depicted in FIG. 53, for example, the pixel block 1010 includes the pixel signal generation unit 320, a light reception unit 1030, and the address event detection unit 400. Note that the logic circuit 210 in FIG. 53 may be the logic circuit including the driving circuit 211, the signal processing unit 212, and the arbiter 213 in FIG. 37, for example.

For example, the light reception unit 1030 includes a photoelectric conversion element 333R having a red (R) color filter, a photoelectric conversion element 333Gr having a green (Gr) color filter, a photoelectric conversion element 333Gb having a green (Gb) color filter, and a photoelectric conversion elements 333B having a blue (B) color filter. Further, the light reception unit 1030 includes four transfer transistors 331R, 331Gr, 331Gb, and 331B provided for the four photoelectric conversion elements 333R, 333Gr, 333Gb, and 333B with one-to-one correspondence, and includes the transfer transistor 331 and the OFG transistor 332.

A control signal TRGR, TRGGr, TRGGb, or TRGB is supplied from the driving circuit 211 to gates of the transfer transistors 331R, 331Gr, 331Gb, and 331B, respectively. Furthermore, a control signal TRG is supplied from the driving circuit 211 to the gate of the transfer transistor 331. A control signal OFG is supplied from the driving circuit 211 to the gate of the OFG transistor 332. Outputs via the respective transfer transistors 331R, 331Gr, 331Gb, and 331B are integrated at a node 334. The node 334 is connected to the pixel signal generation unit 320 via the transfer transistor 331, and also connected to the address event detection unit 400 via the OFG transistor 332. Note that the transfer transistor 331 may be omitted.

For example, each of the transfer transistors 331R, 331Gr, 331Gb, and 331B, the transfer transistor 331, and the OFG transistor 332 of the light reception unit 1030 is including an NMOS transistor.

Each of the photoelectric conversion elements 333R, 333Gr, 333Gb, and 333B of the light reception unit 1030 photoelectrically converts light that is included in incident light and that has a particular wavelength component to generate a charge.

The transfer transistors 331R, 331Gr, 331Gb, and 331B transfer the charges generated in the photoelectric conversion elements 333R, 333Gr, 333Gb, and 333B, respectively, to the node 334 in accordance with the control signals TRGR, TRGGr, TRGGb, and TRGB applied to the respective gates.

The transfer transistor 331 transfers the charge at the node 334 to the floating diffusion layer 324 of the pixel signal generation unit 320 in accordance with a control signal TRG. On the other hand, the OFG transistor 332 supplies the charge at the node 334 to the address event detection unit 400 as a photocurrent in accordance with a control signal OFG.

In response to an instruction of an address event detection start issued from the control unit 130, the driving circuit 211 of the logic circuit 210 outputs control signals OFG, TRGR, TRGGr, TRGGb, and TRGB for bringing the OFG transistors 332 of all of the light reception units 1030 included in the pixel array unit 300 and all of the transfer transistors 331R, 331Gr, 331Gb, and 331B into an on-state, and also outputs a control signal TRG for bringing the transfer transistors 331 of all of the light reception unit 1030 into an off-state. As a result, the photocurrents generated in each of the photoelectric conversion elements 333R, 333Gr, 333Gb, and 333B of the light reception unit 1030 are supplied to the address event detection unit 400 of each of the pixel blocks 1010 via the node 334 and the OFG transistor 332.

When address event firing is detected on the basis of the photocurrent from the light reception unit 1030, the address event detection unit 400 of each of the pixel blocks 1010 outputs a request to the arbiter 213. In response to this request, the arbiter 213 arbitrates the requests from the respective pixel blocks 1010, and transmits, on the basis of a result of this arbitration, a predetermined response to each of the pixel blocks 1010 having issued the requests. Each of the pixel blocks 1010 having received this request supplies a detection signal indicating the presence or absence of address event firing to the driving circuit 211 and the signal processing unit 212 of the logic circuit 210.

The driving circuit 211 brings the OFG transistor 332 of the pixel block 1010 as a supplier of the address event detection signal into an off-state. As a result, supply of the photocurrent from the light reception unit 1030 to the address event detection unit 400 in the pixel block 1010 stops.

Subsequently, the driving circuit 211 outputs a control signal TRG for turning on the transfer transistor 331 in the light reception unit 1030 of the pixel block 1010. Subsequently, the driving circuit 211 sequentially outputs control signals TRGR, TRGGr, TRGGb, and TRGB for turning on the transfer transistors 331R, 331Gr, 331Gb, and 331B of the light reception unit 1030 at different timings. As a result, the charges generated in the photoelectric conversion elements 333R, 333Gr, 333Gb, and 333B of the light reception unit 1030 are sequentially transferred to the floating diffusion layer 324 via the transfer transistor 331R, 331Gr, 331Gb and 331B, and the transfer transistor 331. Thereafter, a pixel signal indicating a voltage value corresponding to a charge amount of charges accumulated in the floating diffusion layer 324 is sequentially fetched in the vertical signal line VSL connected to the selection transistor 323 of the pixel signal generation unit 320.

As described above, the solid-state imaging device 200 sequentially outputs a pixel signal to the column ADC 220 from the unit pixel which belongs to the pixel block 1010 corresponding to the detected address event firing.

According to such a configuration, the upper layer pixel circuit 500 disposed on the second chip 201b can include the LG transistor 411 and the amplification transistor 412 (or the LG transistors 411 and 413 and the amplification transistors 412 and 414) in the current voltage conversion unit 410 of the address event detection unit 400, and the reset transistor 321, the amplification transistor 322, and the selection transistor 323 constituting the pixel signal generation unit 320 similarly to the eighth embodiment described above.

11.4 Operation Example of Solid-State Imaging Device

An operation of the solid-state imaging device 800 according to the present embodiment will next be described in detail with reference to the drawings.

11.4.1 Timing Chart

Figure 54:
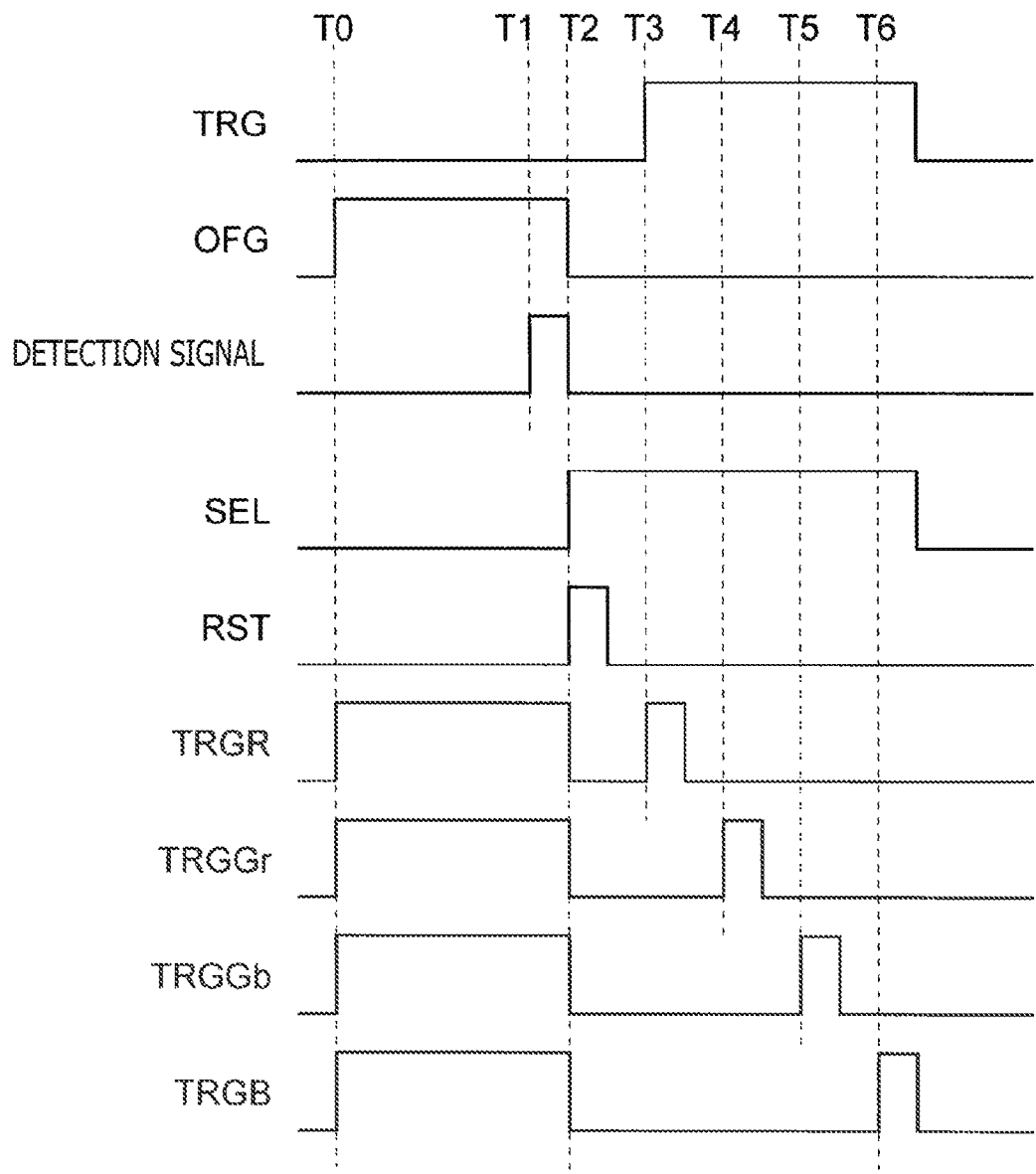
FIG. 54 is a timing chart presenting an example of an operation of the solid-state imaging device according to the tenth embodiment.

An example of the operation of the solid-state imaging device 200 will be first described with reference to a timing chart. FIG. 54 is a timing chart presenting an example of the operation of the solid-state imaging device according to the present embodiment.

As presented in FIG. 54, when a detection start of an address event is instructed by the control unit 130 at a timing T0, the driving circuit 211 raises a control signal OFG applied to the gates of the OFG transistors 332 of all of the light reception units 1030 in the pixel array unit 300 to a high level, and also raises control signals TRGR, TRGGr, TRGGb, and TRGB applied to the gates of the transfer transistors 331R, 331Gr, 331Gb, and 331B of all of the light reception units 1030 to a high level. As a result, the OFG transistors 332 and the transfer transistors 331R, 331Gr, 331Gb, and 331B of all of the light reception units 1030 are brought into an on-state, and photocurrents produced by charges generated in the respective photoelectric conversion elements 333R, 333Gr, 333Gb, and 333B are supplied from the respective light reception units 330 to the respective address event detection units 400. Note that the transfer transistors 331 of all of the light reception units 1030 in the pixel array unit 300 are brought into an off-state during this period.

Assumed next is such a case where the address event detection unit 400 of one of the pixel blocks 1010 detects address event firing during the high-level period of the control signal OFG. In this case, the address event detection unit 400 having detected address event firing transmits a request to the arbiter 213. A response to the request is returned from the arbiter 213 to the address event detection unit 400 having issued the request.

The address event detection unit 400 having received the response raises a detection signal input to the driving circuit 211 and the signal processing unit 212 to a high level during a period of timings T1 to T2, for example. It is assumed in the present explanation that the detection signal is a one-bit signal indicating a result of on-event detection.

The driving circuit 211 having received the high-level detection signal from the address event detection unit 400 at the timing T1 lowers all of control signals OFG and all of control signals TRGR, TRGGr, TRGGb, and TRGB to a low level at the next timing T2. As a result, supply of the photocurrents from all of the light reception units 1030 of the pixel array unit 300 to the address event detection unit 400 stops.

Moreover, at a timing T2, the driving circuit 211 raises a selection signal SEL applied to the gate of the selection transistor 323 of the pixel signal generation unit 320 in the pixel block 1010 corresponding to a readout target to a high level, and also raises a reset signal RST applied to the gate of the reset transistor 321 of the same pixel signal generation unit 320 to a high level for a fixed pulse period. As a result, charges accumulated in the floating diffusion layer 324 of the pixel signal generation unit 320 are discharged (initialized), and the unit pixel is reset in units of pixel block. In this manner, a voltage fetched in the vertical signal line VSL in an initialized state of the floating diffusion layer 324 is read by the ADC 230 included in the column ADC 220 and connected to the vertical signal VSL as a reset level for each of the pixel blocks 1010, and converted into a digital value.

At a timing T3 after the readout of the reset level, a control signal TRG applied to the gate of the transfer transistor 331 in the pixel block 1010 corresponding to the readout target is subsequently raised to a high level. Moreover, the driving circuit 211 applies a control signal TRGR for a fixed pulse period to the gate of the transfer transistor 331R, for example, in the pixel block 1010 corresponding to the readout target. As a result, the charge generated in the photoelectric conversion element 333R is transferred to the floating diffusion layer 324 of the pixel signal generation unit 320, and a voltage corresponding to the charges accumulated in the floating diffusion layer 324 is fetched in the vertical signal line VSL. In this manner, the voltage fetched in the vertical signal line VSL is read by the ADC 230 included in the column ADC 220 and connected to the vertical signal VSL as a red (R) signal level, and converted into a digital value.

The signal processing unit 212 executes CDS processing for obtaining a difference between the reset level and the signal level read in the foregoing manner as a net pixel signal corresponding to a received light amount of the photoelectric conversion element 333R.

Subsequently, the driving circuit 211 applies a control signal TRGGr for a fixed pulse period to the gate of the transfer transistor 331Gr, for example, in the pixel block 1010 similarly corresponding to the readout target at a timing T4 after readout of the signal level based on the photoelectric conversion element 333R. As a result, the charge generated in the photoelectric conversion element 333Gr is transferred to the floating diffusion layer 324 of the pixel signal generation unit 320, and a voltage corresponding to the charges accumulated in the floating diffusion layer 324 is fetched in the vertical signal line VSL. Thereafter, the voltage fetched in the vertical signal line VSL is read by the ADC 230 of the column ADC 220 as a green (Gr) signal level, and converted into a digital value.

Thereafter, the signal levels based on the respective photoelectric conversion elements 333Gb and 333B of the pixel block 1010 corresponding to the readout target are read by the ADC 230 of the column ADC 220 in a similar manner, and converted into digital values (timings T5 and T6).

Subsequently, when the readout of the signal level based on all of the photoelectric conversion elements 333 in the pixel block 1010 corresponding to the readout target is completed, the driving circuit 211 lowers control signals TRG applied to the gates of the transfer transistors 331 of all of the light reception units 330 in the pixel array unit 300 to a low level, and also raises control signals TRGR, TRGGr, TRGGb, and TRGB applied to the gates of the transfer transistors 331R, 331Gr, 331Gb, and 331B similarly in all of the light reception units 330 to a high level. As a result, detection of address event firing restarts in all of the light reception unit 330 of the pixel array unit 300.

11.4.2 Flowchart

Figure 55:
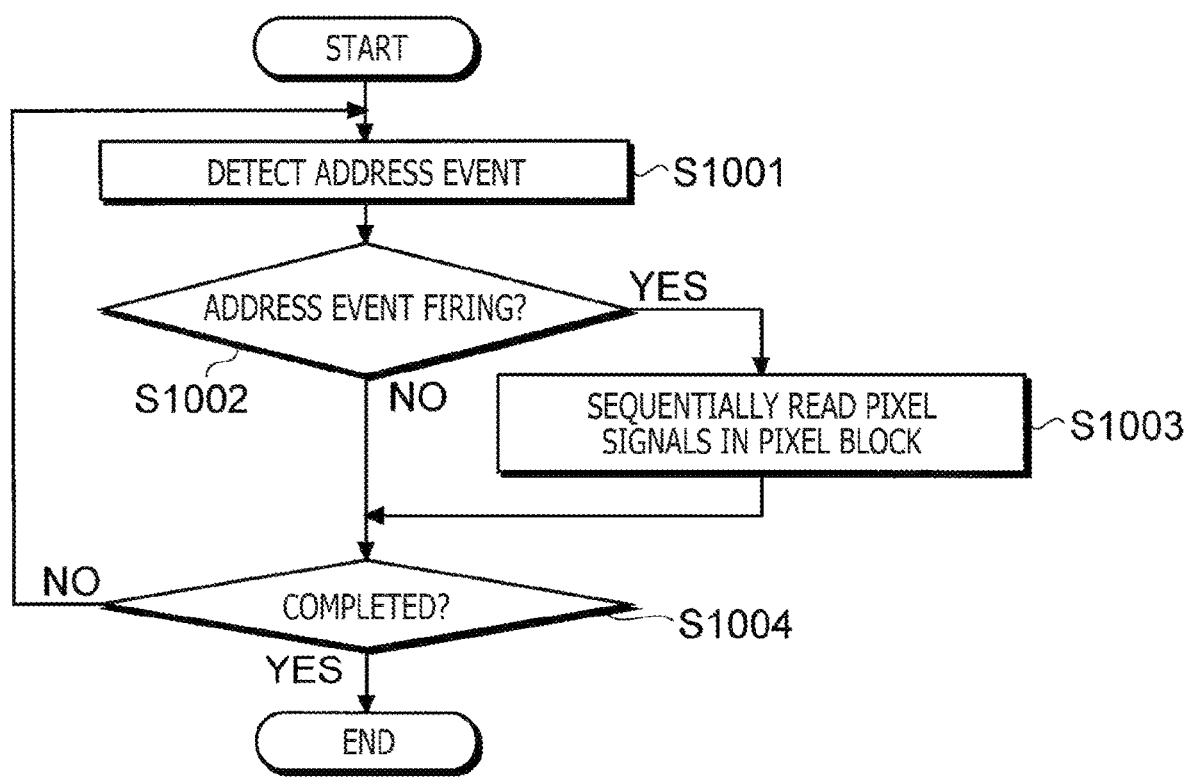
FIG. 55 is a flowchart presenting an example of the operation of the solid-state imaging device according to the tenth embodiment.

An example of the operation of the solid-state imaging device 800 will next be described with reference to a flowchart. FIG. 55 is a flowchart presenting an example of the operation of the solid-state imaging device according to the present embodiment. This operation starts when a predetermined application for detecting an address event is executed, for example.

As presented in FIG. 55, each of the pixel blocks 1010 of the pixel array unit 300 first detects the presence or absence of address event firing in the present operation (step S1001). Then, the driving circuit 211 determines whether or not address event firing has been detected in any one of the pixel blocks 1010 (step S1002).

In a case where address event firing is not detected (NO in step S1002), the present operation proceeds to step S1004. On the other hand, in a case where address event firing is detected (YES in step S1002), the driving circuit 211 sequentially reads a pixel signal from the unit pixel which belongs to the pixel block 1010 corresponding to the detected address event firing to sequentially read pixel signals from each of the unit pixels belonging to the pixel block 1010 corresponding to the readout target (step S1003), and the flow proceeds to step S1004.

In step S1004, whether or not to end the present operation is determined. In a case where the present operation is not to be ended (NO in step S1004), the present operation returns to step S1001, and this step and the following steps are repeated. On the other hand, in a case where the present operation is to be ended (YES in step S1004), the present operation ends.

11.5 Floor Map Example

Several examples of respective floor maps of the first chip 201a and the second chip 201b according to the present embodiment will next be described. While an example of the current voltage conversion unit 410 of the source-follower type (see FIG. 4) will be presented in the following description, other types may be adopted. For example, the current voltage conversion unit 410 is similarly applicable to the gain-boost type (see FIG. 6).

11.5.1 First Example 11.5.1.1 First Chip

Figure 56:
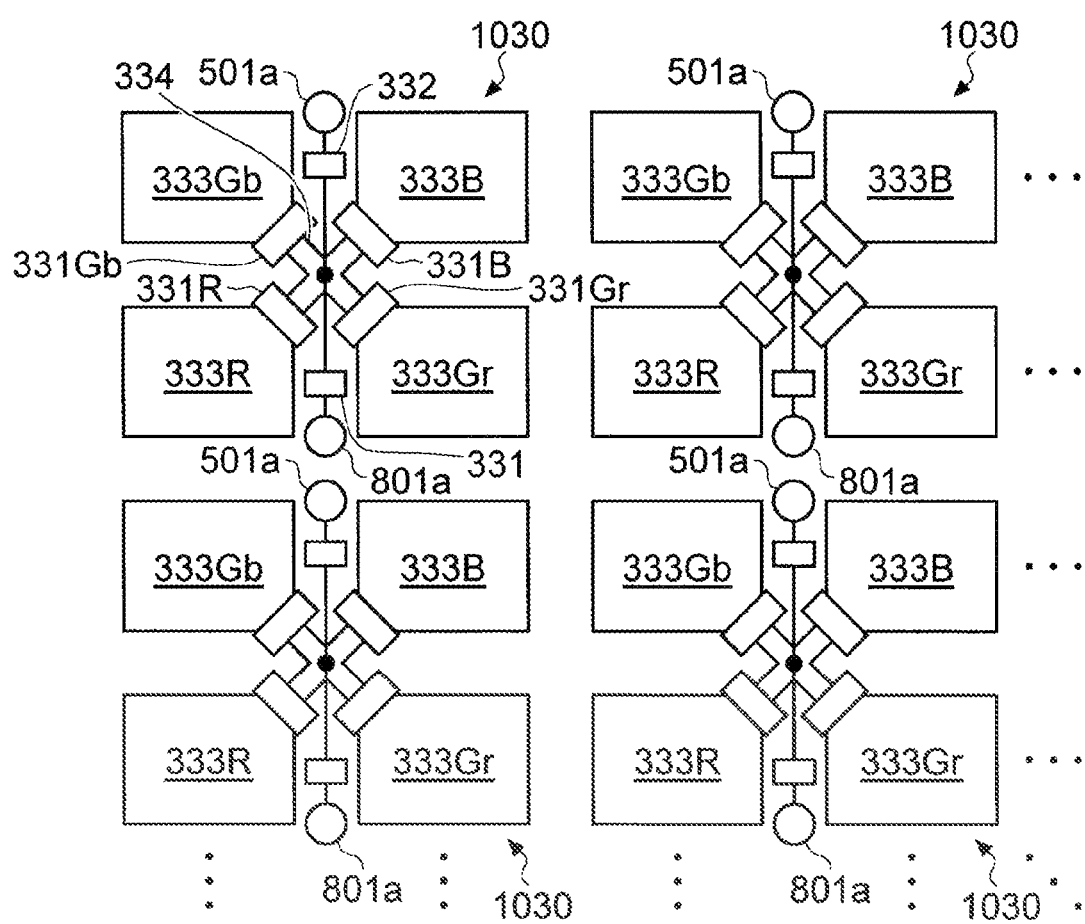
FIG. 56 is a plan diagram depicting a floor map example of a first chip according to a first example of the tenth embodiment.

FIG. 56 is a plan diagram depicting a floor map example of the first chip according to a first example. As depicted in FIG. 56, the first chip 201a includes the light reception units 1030 in a two-dimensional grid shape. In each of the light reception units 1030, the plurality of the photoelectric conversion elements 333 constituting the pixel block 1010 is formed in I rows×J columns. In the present example, the four photoelectric conversion elements 333R, 333Gr, 333Gb, and 333B constituting a unit pattern of a Bayer array are formed in two rows×two columns.

The four photoelectric conversion elements 333R, 333Gr, 333Gb, and 333B constituting the unit pattern include the transfer transistors 331R, 331Gr, 331Gb, and 331B at corners facing each other, respectively. The drains of the transfer transistors 331R, 331Gr, 331Gb, and 331B are connected to the node 334 (see FIG. 53) which is a common node. The OFG transistor 332 is provided on wiring connecting the node 334 and the TSV 501a of the connection portion 501. The transfer transistor 331 is provided on wiring connecting the node 334 and the TSV 801a of the connection portion 801.

11.5.1.2 Second Chip

Figure 57:
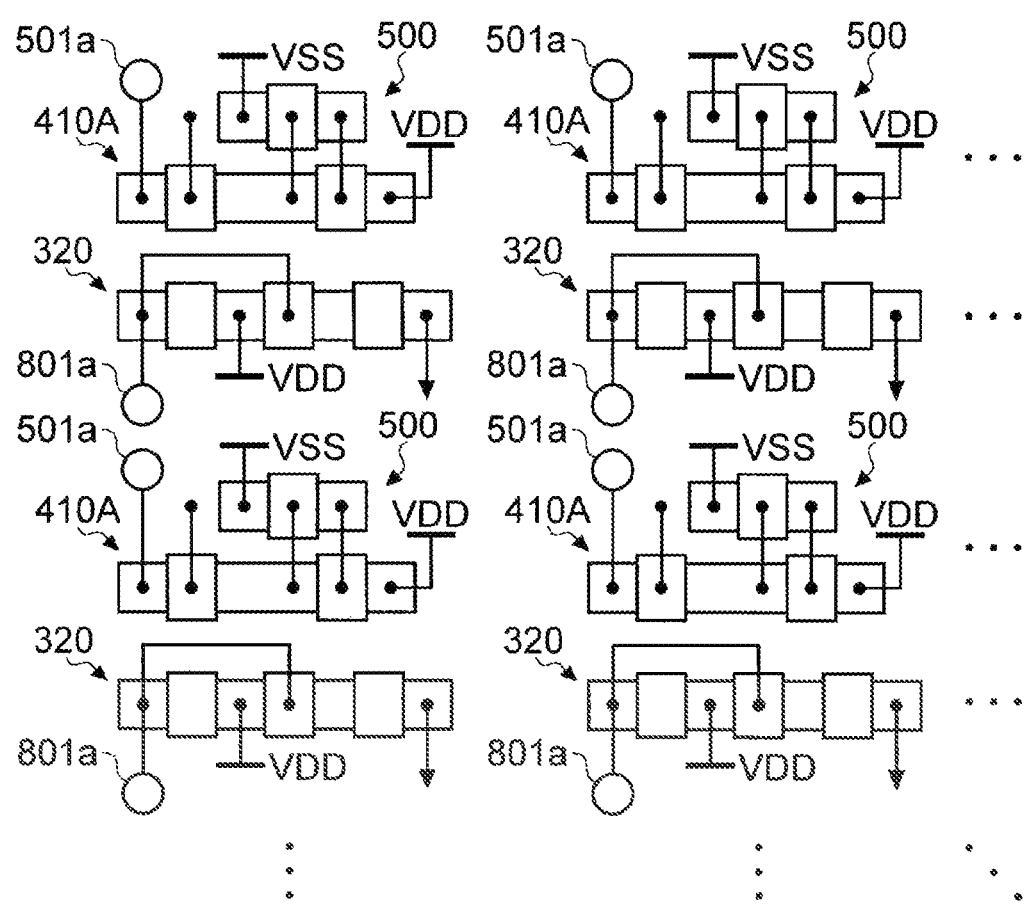
FIG. 57 is a plan diagram depicting a floor map example of a second chip according to the first example of the tenth embodiment.

FIG. 57 is a plan diagram depicting a floor map example of the second chip according to the first example. As depicted in FIG. 57, the second chip 201b includes the upper layer pixel circuits 500 in a two-dimensional grid shape similarly to the second chip 201b described in the eighth embodiment with reference to FIG. 44. Each of the upper layer pixel circuits 500 includes an upper layer detection circuit 410A including the LG transistor 411 and the amplification transistor 412 and the pixel signal generation unit 320 including the reset transistor 321, the amplification transistor 322, the selection transistor 323, and the floating diffusion layer 324. For example, each of the upper layer pixel circuits 500 is formed in a region substantially equivalent to the region of each of the photoelectric conversion elements 333 formed on the first chip 201a. Note that the upper layer detection circuit 410A may be similar to the upper layer pixel circuit 500 in the embodiments described above.

11.5.2 Second Example

Figure 58:
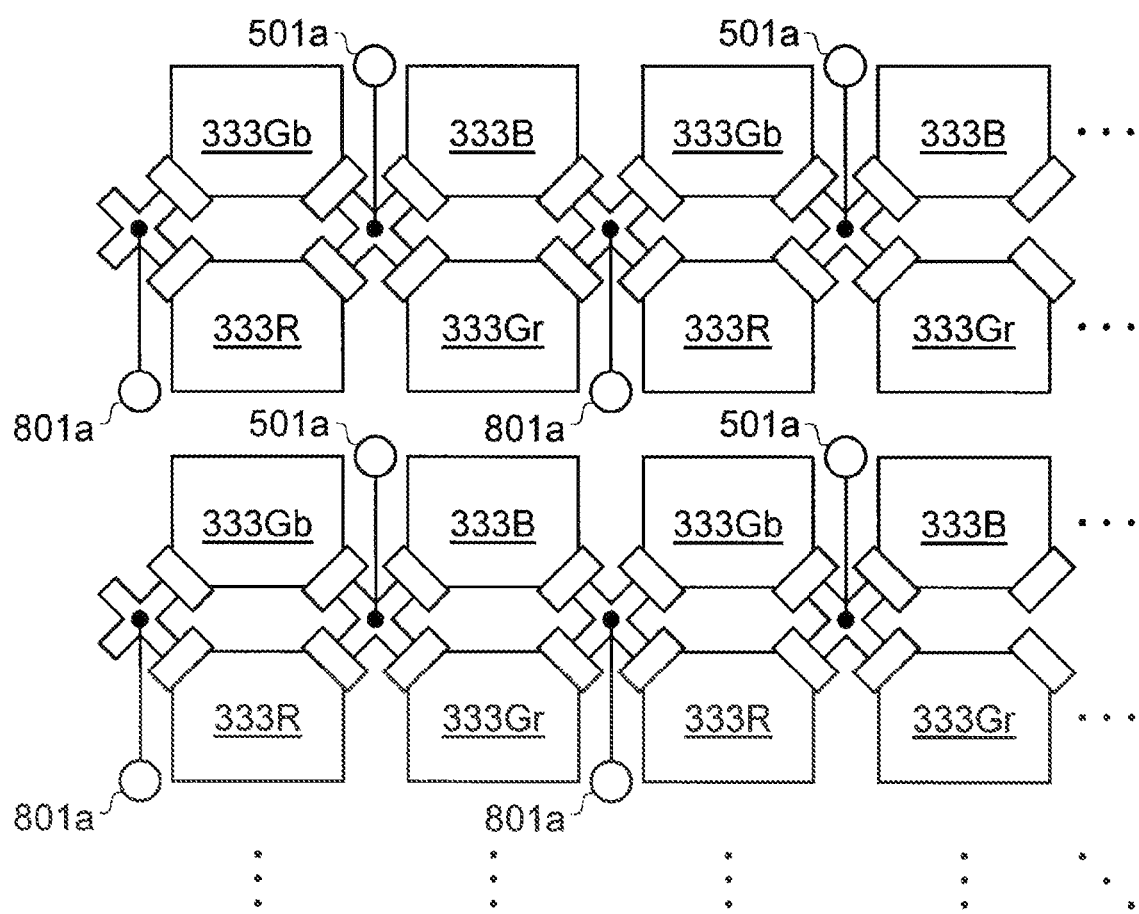
FIG. 58 is a plan diagram depicting a floor map example of a first chip according to a second example of the tenth embodiment.
Figure 59:
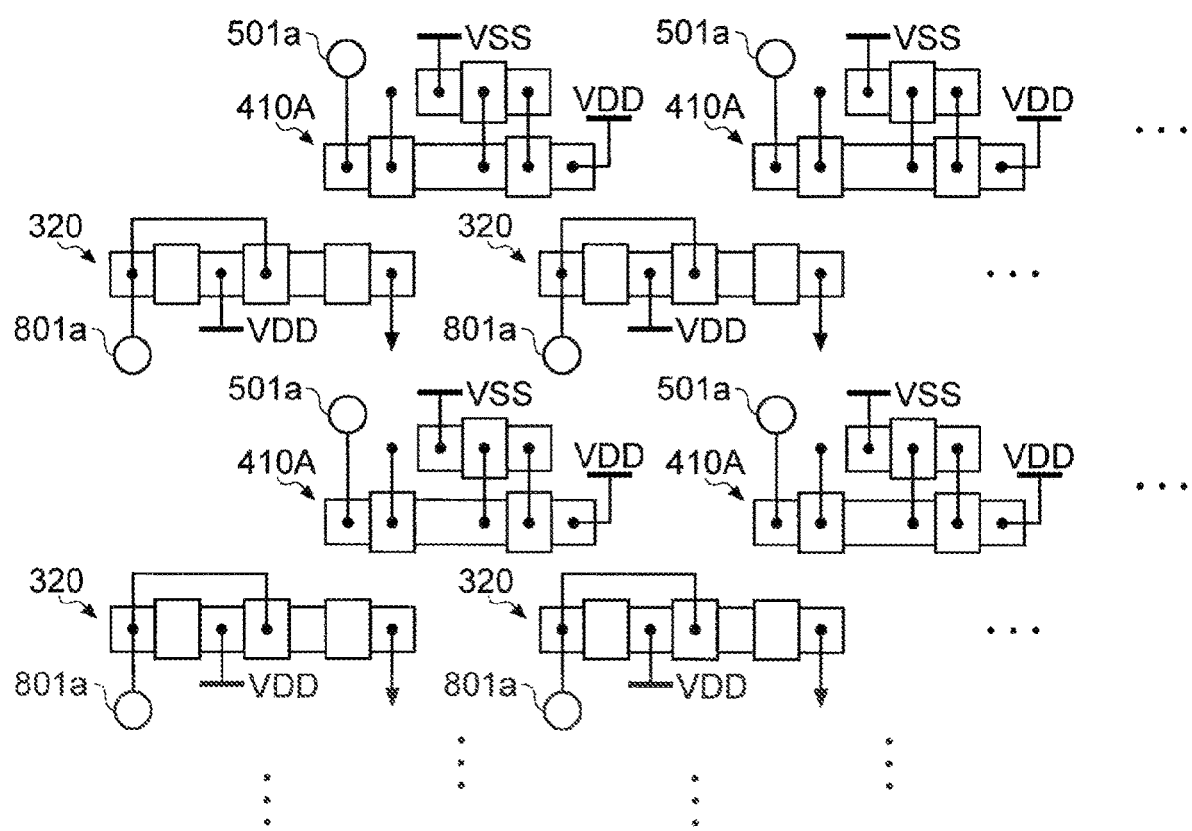
FIG. 59 is a plan diagram depicting a floor map example of a second chip according to the second example of the tenth embodiment.

FIG. 58 is a plan diagram depicting a floor map example of the first chip according to a second example. FIG. 59 is a plan diagram depicting a floor map example of the second chip according to the second example.

According to the present embodiment, a group of the photoelectric conversion elements 333 where the address event detection unit 400 monitors the presence or absence of address event firing and a group of the photoelectric conversion elements 333 where the pixel signal generation unit 320 reads a pixel signal are not necessarily required to coincide with each other. For example, as depicted in FIG. 58, each of the address event detection units 400 may be configured to monitor the photoelectric conversion elements 333R, 333Gr, 333Gb, and 333B in a (2j+1) column and a (2j+2) column (j: 0 or a larger integer) in the photoelectric conversion elements 333 in a (2i+1) row and a (2i+2) row (i: 0 or a larger integer), and read pixel signals from the photoelectric conversion elements 333R, 333Gr, 333Gb, and 333B in a (2j) column and a (2j+1) column in the photoelectric conversion elements 333 in a (2i+1) row and a (2i+2) row.

In that case, as depicted in FIG. 59, the second chip 201b has such a layout that the address event detection units 400 are arranged in even number columns and that pixel signal generation units 320 in odd number columns.

Note that all of the pixel signal generation units 320 each handling at least one of the plurality of the photoelectric conversion elements 333 monitored by the address event detection unit 400 may be configured to read pixel signals from the plurality of the photoelectric conversion elements 333 handled by each of the pixel signal generation units 320 at the time of detection of address event firing by one of the address event detection units 400. The address event detection units 400 and the pixel signal generation units 320 may be associated with each other in advance, and at the time of detection of address event firing by one of the address event detection units 400, the pixel signal generation unit 320 associated with the corresponding address event detection unit 400 may be configured to read a pixel signal.

11.5.3 Third Example

Figure 60:
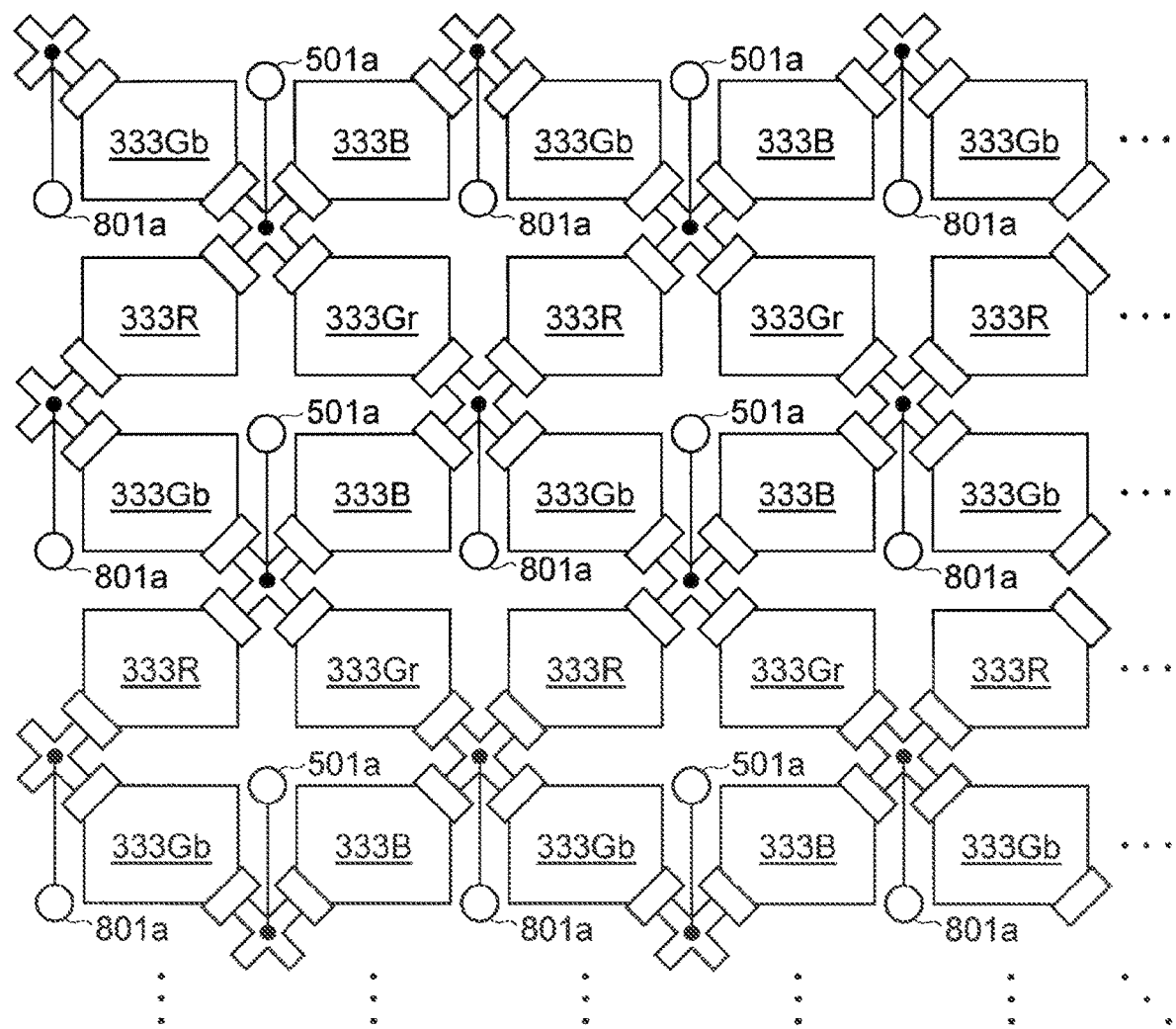
FIG. 60 is a plan diagram depicting a floor map example of a first chip according to a third example of the tenth embodiment.

FIG. 60 is a plan diagram depicting a floor map example of the first chip according to a third example. FIG. 61 is a plan diagram depicting a floor map example of the second chip according to the third example.

Presented in the second example described above is an example of a case where the address event detection units 400 and the pixel signal generation units 320 are alternately arranged in the row direction. On the other hand, presented in the third example will be a case where the address event detection units 400 and the pixel signal generation units 320 are alternately arranged not only in the row direction but also in the column direction.

In the third example, as depicted in FIG. 60, each of the address event detection units 400 can be configured to monitor the four in total (or two) photoelectric conversion elements 333R, 333Gr, 333Gb, and 333B in a (2i+1) row (2j+1) column, a (2i+1) row (2j+2) column, a (2i+2) row (2j+1) column, and a (2i+2) row (2j+2) column, and each of the pixel signal generation units 320 can be configured to read pixel signals from the four in total (or one or two) photoelectric conversion elements 333R, 333Gr, 333Gb, and 333B in a 2i row 2j column, a 2i row (2j+1) column, a (2i+1) row 2j column, and a (2i+1) row (2j+1) column.

In that case, as depicted in FIG. 61, the second chip 201b has such a layout that the address event detection units 400 are arranged in odd number rows of even number columns and that pixel signal generation units 320 are arranged in even number rows of odd number columns.

Note that, similarly to the second example, at the time of detection of address event firing by one of the address event detection units 400, all of the pixel signal generation units 320 each handling at least one of the plurality of the photoelectric conversion elements 333 monitored by the address event detection unit 400 may be configured to read pixel signals from the plurality of the photoelectric conversion elements 333 handled by each of the pixel signal generation units 320. The address event detection units 400 and the pixel signal generation units 320 may be associated with each other in advance, and at the time of detection of address event firing by one of the address event detection units 400, the pixel signal generation unit 320 associated with the corresponding address event detection unit 400 may be configured to read a pixel signal.

11.6 Operation and Effect

According to the configuration of the present embodiment, as described above, a set of a plurality of (N) unit pixels (the pixel block 1010) for receiving wavelength components of light necessary for reconfiguration of colors is designated as a unit for detecting the presence or absence of address event firing (pixel block unit). In a case where address event firing is detected in units of pixel block, pixel signals are read in units of pixel block. In this case, pixel signals having all wavelength components necessary for reconfiguration of colors are synchronously read at the time of address event firing at a unit pixel of a certain wavelength component. Accordingly, reconfiguration of correct colors is achievable. As a result, a solid-state imaging device and an imaging device of event-driven type capable of acquiring a color image having correctly reconfigured colors can be obtained.

Note that a case based on the solid-state imaging device 800 according to the eighth embodiment is presented in the present embodiment by way of example. However, the present embodiment is not limited to this example, but may be a case based on the solid-state imaging device 200 according to the other embodiments, such as the solid-state imaging device 200 according to the first embodiment.

In addition, other configurations, operations, and effects may be similar to those of the above embodiments, and are therefore not described in detail here.

12. Example of Application to Mobile Body

The technology according to the present disclosure (present technology) is applicable to various products. For example, the technology according to the present disclosure may be practiced as a device mounted on a mobile body of any of types such as a car, an electric car, a hybrid electric car, a motorcycle, a bicycle, a personal mobility, an airplane, a drone, a vessel, and a robot.

FIG. 62 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 62, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 62, an audio speaker 12061, a display section 12062, and an instrument panel 12063 are illustrated as the output device. The display section 12062 may, for example, include at least one of an on-board display and a head-up display.

Figure 63:
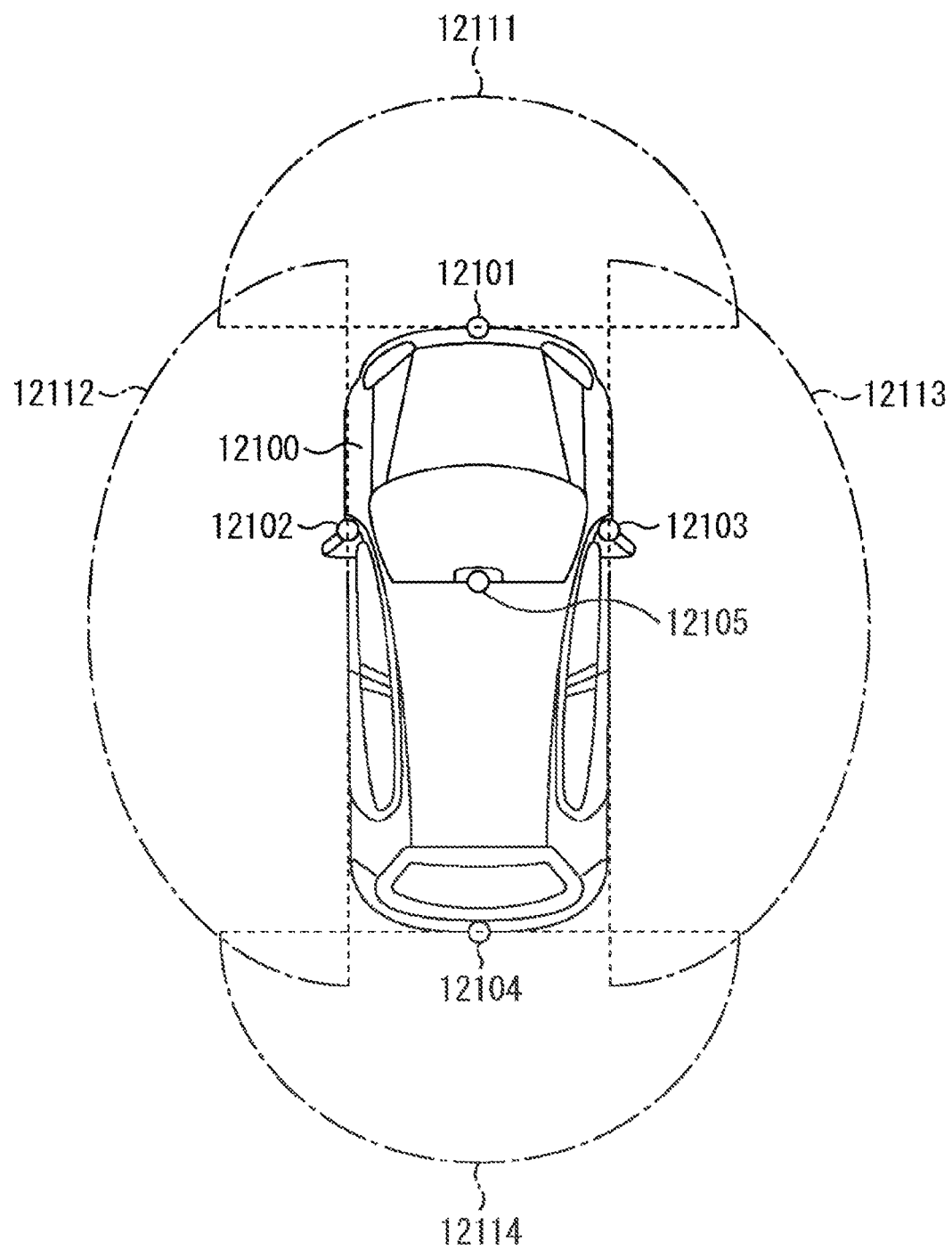
FIG. 63 is a diagram of assistance in explaining an example of installation positions of an outside-vehicle information detecting section and an imaging section.

FIG. 63 is a diagram depicting an example of the installation position of the imaging section 12031.

In FIG. 63, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 63 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the present disclosure is applicable has been described above. The technology according to the present disclosure is applicable to the imaging section 12031, the driver state detecting section 12041, and the like in the configuration described above.

The technical scope of the present disclosure is not limited to the above-described embodiments of the present disclosure as they are, but can be modified in various manners without departing from the scope of the subject matters of the present disclosure. Further, constituent elements of different embodiments and modifications may be modified as appropriate.

In addition, advantageous effects of the respective embodiments described in the present description are only presented by way of example. Advantageous effects are not limited to these effects, but may include other advantageous effects.

Note that the present technology can also take the following configurations.

(1)

A solid-state imaging device including:

a plurality of photoelectric conversion elements arranged in a two-dimensional grid shape in a matrix direction and each generating a charge corresponding to a received light amount; and a detection unit that detects a photocurrent produced by the charge generated in each of the plurality of photoelectric conversion elements, in which
a chip on which the photoelectric conversion elements are disposed and a chip on which at least a part of the detection unit is disposed are different from each other.

(2)
The solid-state imaging device according to (1) described above, in which
the detection unit includes a current voltage conversion circuit that includes a source follower circuit having a loop shape,
the photoelectric conversion elements are disposed on a first chip, and
the source follower circuit is disposed on a second chip joined to the first chip.

(3)
The solid-state imaging device according to (2) described above, in which the detection unit is disposed on the second chip.

(4)
The solid-state imaging device according to (2) or (3) described above, further including:
a first transistor disposed between the photoelectric conversion elements and the detection unit, in which
the first transistor is disposed on the first chip.

(5)
The solid-state imaging device according to any one of (2) to (4) described above, further including:
a logic circuit connected to the detection unit, in which
the logic circuit is disposed on a third chip different from the first and second chips.

(6)
The solid-state imaging device according to any one of (2) to (5) described above, further including:
a driving circuit that controls readout of the charges from the photoelectric conversion elements, in which
the driving circuit is disposed on the second chip.

(7)
The solid-state imaging device according to any one of (2) to (6) described above, further including:
a generation unit that generates a pixel signal that has a voltage value corresponding to a charge amount of the charge generated in each of the photoelectric conversion elements, in which
the generation unit is disposed on the second chip.

(8)
The solid-state imaging device according to any one of (2) to (6) described above, further including:
a generation unit that generates a pixel signal that has a voltage value corresponding to a charge amount of the charge generated in each of the photoelectric conversion elements, in which
the generation unit is disposed on a fourth chip joined between the first chip and the second chip.

(9)
The solid-state imaging device according to (7) or (8) described above, further including:
a second transistor disposed between the photoelectric conversion elements and the generation unit, in which
the second transistor is disposed on the first chip.

(10)
The solid-state imaging device according to any one of (7) to (9) described above, in which
the plurality of photoelectric conversion elements is divided into a plurality of groups each including one or more photoelectric conversion elements, and
the detection unit and the generation unit are provided for each of the plurality of groups.

(11)
The solid-state imaging device according to (10) described above, in which each of the plurality of groups includes a combination of photoelectric conversion elements each receiving a wavelength component of light necessary for reconfiguration of a color of incident light.

(12)
The solid-state imaging device according to (10) or (11) described above, in which
the detection unit is connected to a first group in the plurality of groups,
the generation unit is connected to a second group in the plurality of groups, and
at least one of the photoelectric conversion elements belonging to the first group also belongs the second group.

(13)
The solid-state imaging device according to any one of (2) to (12) described above, in which
the source follower circuit includes
a third transistor in which a source is connected to the photoelectric conversion elements, and
a fourth transistor in which a gate is connected to the photoelectric conversion elements and a drain is connected to a gate of the third transistor.

(14)
The solid-state imaging device according to (13) described above, in which
the source follower circuit includes
a fifth transistor in which a source is connected to a drain of the third transistor, and
a sixth transistor in which a source is connected to the gate of the third transistor and the drain of the fourth transistor and a gate is connected to the drain of the third transistor and the source of the fifth transistor.

(15)
The solid-state imaging device according to (13) or (14) described above, in which each of the third and fourth transistors includes an MOS (Metal-Oxide-Semiconductor) transistor.

(16)
The solid-state imaging device according to (13) or (14) described above, in which each of the third and fourth transistors includes a terminal to which a reverse bias is to be applied.

(17)
The solid-state imaging device according to (16) described above, in which the second chip includes an SOI (Silicon On Insulator) substrate.

(18)
The solid-state imaging device according to (13) or (14) described above, in which each of the third and fourth transistors includes a tunneling FET (Field effect transistor) or FinFET.

(19)
The solid-state imaging device according to any one of (2) to (18) described above, further including:
a hydrogen supply film provided on the second chip and supplying a hydrogen atom to the second chip; and
a diffusion preventive film interposed between the first chip and the second chip and preventing diffusion of the hydrogen atom from the second chip to the photoelectric conversion elements.

(20)

An imaging device including:
a solid-state imaging device;
an optical system that forms an image of incident light on a light reception surface of the solid-state imaging device; and
a control unit that controls the solid-state imaging device,
in which
the solid-state imaging device includes
a plurality of photoelectric conversion elements arranged in a two-dimensional grid shape in a matrix direction and each generating a charge corresponding to a received light amount, and
a detection unit that detects a photocurrent produced by the charge generated in each of the plurality of photoelectric conversion elements, and
a chip on which the photoelectric conversion elements are disposed and a chip on which at least a part of the detection unit is disposed are different from each other.

REFERENCE SIGNS LIST

100 Imaging device
110 Imaging lens
120 Recording unit
130 Control unit
139, 209 Signal line
200 Solid-state imaging device
201 Light reception chip
201a First chip
201b Second chip
201c Third chip
202 Detection chip
203 Logic chip
210 Logic circuit
211 Driving circuit
212 Signal processing unit
213 Arbiter
220 Column ADC
230 ADC
300 Pixel array unit
310 Unit pixel
320 Pixel signal generation unit
321 Reset transistor
322 Amplification transistor
323 Selection transistor
324 Floating diffusion layer
325, 326, 327, 328, 416, 417, 418, 419, 4171, 4191 Diffusion region
3211, 3221, 3231, 3311, 3321, 4111, 4121, 4131, 4141 Gate
330, 730, 830, 1030 Light reception unit
331, 331B, 331Gb, 331Gr, 331R Transfer transistor
332 OFG transistor
333, 333B, 333G, 333Gb, 333Gr, 333R, 333W Photoelectric conversion element
334 Node
400 Address event detection unit
410 Current voltage conversion unit
410A Upper layer detection circuit
411, 413 LG transistor
412, 414 Amplification transistor
415 Constant current circuit
420 Buffer
430 Subtractor
431, 433 Capacitor
432 Inverter
434 Switch
440 Quantizer
441 Comparator
450 Transfer unit
500 Upper layer pixel circuit
501, 502, 801 Connection portion
501a, 501b, 501c, 736, 801a, 801b, 801c TSV
501d, 737, 801d, 3241 Wiring
510 Circuit configuration
511 Circuit element
601, 611, 621 Semiconductor substrate
602 On-chip lens
603 Flattening film
604 Pixel separation unit
605 p-type semiconductor region
606, 3312, 3322 n-type semiconductor region
607, 734, 807 Contact layer
608, 612, 622 Interlayer dielectric
610, 620 Junction surface
613, 623 Wiring layer
619, 629 Cu pad
700 Transistor
701 FDSOI substrate
701A SOI substrate
702 Silicon thin film
702A Silicon layer
703 Embedded oxide film
704 Support substrate
705 Gate
706 Gate insulation film
706A, 731 Silicon oxide film
707 Source
708 Drain
710 Tunneling FET
720 FinFET
732 Element separation insulation film
733 Trench
751 Hydrogen supply film
752 Hydrogen diffusion preventive film
1010, 1010A, 1010B, 1010C, 1010D Pixel block
VSL Vertical signal line

The invention claimed is:

1. A solid-state imaging device comprising:
a plurality of photoelectric conversion elements arranged in a two-dimensional grid shape in a matrix direction and each generating a charge corresponding to a received light amount;
a detection circuit that detects a photocurrent produced by the charge generated in each of the plurality of photoelectric conversion elements;
a first chip on which the photoelectric conversion elements are disposed; and
a different second chip on which at least a part of the detection circuit is disposed, the second chip being joined to the first chip; and
wherein the detection circuit includes a current-voltage conversion circuit that includes a source follower circuit having a loop shape, the source follower circuit being disposed on the second chip and including:
a first transistor having a source thereof connected to the photoelectric conversion elements, and
a second transistor having a gate thereof connected to the photoelectric conversion elements and having a drain thereof connected to a gate of the first transistor.

2. The solid-state imaging device according to claim 1, further comprising:
a logic circuit connected to the detection circuit; and
wherein the logic circuit is disposed on a third chip different from the first chip and from the second chip.

3. The solid-state imaging device according to claim 1, further comprising:
a driving circuit that controls readout of the charges from the photoelectric conversion elements; and
wherein the driving circuit is disposed on the second chip.

4. The solid-state imaging device according to claim 1, further comprising:
a generation circuit that generates a pixel signal that has a voltage value corresponding to a charge amount of the charge generated in each of the photoelectric conversion elements; and
wherein the generation circuit is disposed on the second chip.

5. The solid-state imaging device according to claim 4, further comprising:
a third transistor disposed between the photoelectric conversion elements and the generation circuit; and
wherein the third transistor is disposed on the first chip.

6. The solid-state imaging device according to claim 1, wherein each of the first transistor and the second transistor includes a respective MOS (Metal-Oxide-Semiconductor) transistor.

7. The solid-state imaging device according to claim 1, wherein each of the first transistor and the second transistor includes a respective terminal to which a reverse bias is to be applied.

8. The solid-state imaging device according to claim 7, wherein the second chip includes an SOI (Silicon On Insulator) substrate.

9. The solid-state imaging device according to claim 1, wherein each of the first transistor and the second transistor includes a respective tunneling FET (Field effect transistor) of FinFET.

10. An imaging device comprising:
a solid-state imaging device;
an optical system that forms an image of incident light on a light reception surface of the solid-state imaging device; and
a control circuit that controls the solid-state imaging device;
wherein the solid-state imaging device includes:
a plurality of photoelectric conversion elements arranged in a two-dimensional grid shape in a matrix direction and each generating a charge corresponding to a received light amount,
a detection circuit that detects a photocurrent produced by the charge generated in each of the plurality of photoelectric conversion elements,
a first chip on which the photoelectric conversion elements are disposed;
a different second chip on which at least a part of the detection circuit is disposed; and
a generation circuit that generates a pixel signal that has a voltage value corresponding to a charge amount of the charge generated in each of the photoelectric conversion elements, the generation circuit being disposed on a third chip joined between the first chip and the second chip.

11. A solid-state imaging device comprising:
a plurality of photoelectric conversion elements arranged in a two-dimensional grid shape in a matrix direction and each generating a charge corresponding to a received light amount;
a detection circuit that detects a photocurrent produced by the charge generated in each of the plurality of photoelectric conversion elements;
a first chip on which the photoelectric conversion elements are disposed; and
a different second chip on which at least a part of the detection circuit is disposed, the second chip being joined to the first chip;
wherein the detection circuit includes a current-voltage conversion circuit that includes a source follower circuit having a loop shape, the source follower circuit being disposed on the second chip; and
wherein the solid-state imaging device further comprises a transistor connected between the photoelectric conversion elements and the detection circuit, the transistor being disposed on the first chip.

12. A solid-state imaging device comprising:
a plurality of photoelectric conversion elements arranged in a two-dimensional grid shape in a matrix direction and each generating a charge corresponding to a received light amount;
a detection circuit that detects a photocurrent produced by the charge generated in each of the plurality of photoelectric conversion elements;
a first chip on which the photoelectric conversion elements are disposed; and
a different second chip on which at least a part of the detection circuit is disposed, the second chip being joined to the first chip;
wherein the detection circuit includes a current-voltage conversion circuit that includes a source follower circuit having a loop shape, the source follower circuit being disposed on the second chip; and
wherein the solid-state imaging device further comprises a generation circuit that generates a pixel signal that has a voltage value corresponding to a charge amount of the charge generated in each of the photoelectric conversion elements, the generation circuit being disposed on a third chip joined between the first chip and the second chip.

13. A solid-state imaging device comprising:
a plurality of photoelectric conversion elements arranged in a two-dimensional grid shape in a matrix direction and each generating a charge corresponding to a received light amount;
a detection circuit that detects a photocurrent produced by the charge generated in each of the plurality of photoelectric conversion elements;
a first chip on which the photoelectric conversion elements are disposed; and
a different second chip on which at least a part of the detection circuit is disposed, the second chip being joined to the first chip;
wherein the detection circuit includes a current-voltage conversion circuit that includes a source follower circuit having a loop shape, the source follower circuit being disposed on the second chip;
wherein the solid-state imaging device further comprises a generation circuit that generates a pixel signal that has a voltage value corresponding to a charge amount of the charge generated in each of the photoelectric conversion elements, the generation circuit being disposed on the second chip;

wherein the plurality of photoelectric conversion elements are divided into a plurality of groups, each of the groups including one or more photoelectric conversion elements; and wherein the detection circuit and the generation circuit are provided for each of the groups.

14. The solid-state imaging device according to claim 13, wherein each of the groups includes a respective combination of the photoelectric conversion elements receiving different wavelength components of light.

15. The solid-state imaging device according to claim 13, wherein:
the detection circuit is connected to a first group in the plurality of groups;
the generation circuit is connected to a second group in the plurality of groups; and
at least one of the photoelectric conversion elements belonging to the first group also belongs the second group.

16. A solid-state imaging device comprising:
a plurality of photoelectric conversion elements arranged in a two-dimensional grid shape in a matrix direction and each generating a charge corresponding to a received light amount;
a detection circuit that detects a photocurrent produced by the charge generated in each of the plurality of photoelectric conversion elements;
a first chip on which the photoelectric conversion elements are disposed; and
a different second chip on which at least a part of the detection circuit is disposed, the second chip being joined to the first chip;
wherein the detection circuit includes a current-voltage conversion circuit that includes a source follower circuit having a loop shape, the source follower circuit being disposed on the second chip;
wherein the solid-state imaging device further comprises a hydrogen supply film provided on the second chip and supplying hydrogen atoms; and
wherein the solid-state imaging device further comprises a diffusion preventive film interposed between the first chip and the second chip and preventing diffusion of the hydrogen atoms from the second chip to the photoelectric conversion elements.

* * * * *